(12) United States Patent
Takahashi

(10) Patent No.: US 11,209,489 B2
(45) Date of Patent: Dec. 28, 2021

(54) SECONDARY BATTERY SYSTEM AND METHOD FOR ESTIMATING DETERIORATION STATE OF SECONDARY BATTERY

(71) Applicant: Toyota Jidosha Kabushiki Kaisha, Toyota (JP)

(72) Inventor: Kenji Takahashi, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 175 days.

(21) Appl. No.: 16/570,349

(22) Filed: Sep. 13, 2019

(65) Prior Publication Data
US 2020/0088797 A1 Mar. 19, 2020

(30) Foreign Application Priority Data

Sep. 14, 2018 (JP) .............................. JP2018-172616
Aug. 6, 2019 (JP) .............................. JP2019-144833

(51) Int. Cl.
*G01R 31/367* (2019.01)
*G01R 31/382* (2019.01)
(Continued)

(52) U.S. Cl.
CPC ......... *G01R 31/367* (2019.01); *G01R 31/382* (2019.01); *G01R 31/385* (2019.01); *G01R 31/392* (2019.01); *H01M 10/0525* (2013.01)

(58) Field of Classification Search
CPC .. G01R 31/367; G01R 31/382; G01R 31/392; G01R 31/385; G01R 31/388;
(Continued)

(56) References Cited

U.S. PATENT DOCUMENTS 10,371,753 B1 * 8/2019 Wang ................. G01R 31/3648
10,511,050 B1 * 12/2019 Rahimian ......... H01M 10/4207
(Continued)

FOREIGN PATENT DOCUMENTS

JP 2011220917 11/2011
JP 2014139521 A 7/2014
(Continued)

OTHER PUBLICATIONS

Sethuraman, V.A. et al., "In Situ Measurements of Stress-Potential Coupling in Lithiated Silicon", Journal of The Electrochemical Society, 157 (11), p. A1253-A1261, 2010.

*Primary Examiner* — Mohammad K Islam
(74) *Attorney, Agent, or Firm* — Dinsmore & Shohl LLP

(57) ABSTRACT

An ECU calculates, based on a prescribed active material model, a surface stress of an anode active material from the lithium amount inside the anode active material, and calculates, based on the calculated surface stress, an open circuit potential change amount of the anode active material relative to an open circuit potential. The ECU corrects an anode open circuit potential calculated by a deterioration estimation process, using the open circuit potential change amount. The ECU calculates three deterioration parameters so that the measured OCV curve substantially matches the estimated OCV curve specified based on the corrected anode open circuit potential. The open circuit potential is an open circuit potential of the anode active material in the state in which a surface stress is not generated.

8 Claims, 27 Drawing Sheets

(51) Int. Cl.
*H01M 10/0525* (2010.01)
*G01R 31/392* (2019.01)
*G01R 31/385* (2019.01)

(58) Field of Classification Search
CPC ............ G01R 31/396; H01M 10/0525; H01M
4/386; H01M 10/425; H01M 2010/4278;
H01M 10/4285; Y02E 60/10; Y02T
10/70; B60L 58/10; B60L 58/16
See application file for complete search history.

(56) References Cited

U.S. PATENT DOCUMENTS

| | | | |
|---|---|---|---|
| 10,987,684 B2 * | 4/2021 | Gullicks | B05B 7/12 |
| 2008/0054908 A1 * | 3/2008 | Suzuki | G01R 31/392 |
| | | | 324/426 |
| 2010/0247988 A1 * | 9/2010 | Okumura | G01R 31/3842 |
| | | | 429/90 |
| 2013/0099794 A1 | 4/2013 | Takahashi et al. | |
| 2015/0355285 A1 | 12/2015 | Nishigaki et al. | |
| 2015/0357659 A1 * | 12/2015 | Okui | H01M 8/04126 |
| | | | 429/432 |
| 2017/0146610 A1 * | 5/2017 | Cha | G01R 31/3835 |
| 2019/0170830 A1 * | 6/2019 | Ohkanda | G01R 31/3842 |
| 2019/0195956 A1 * | 6/2019 | Lim | H01M 10/4207 |
| 2020/0088797 A1 * | 3/2020 | Takahashi | H01M 10/425 |

FOREIGN PATENT DOCUMENTS

| | | |
|---|---|---|
| JP | 2017190979 | 10/2017 |
| JP | 2017195727 | 10/2017 |

\* cited by examiner

FIG.5

| SYMBOLS | UNITS | ITEMS |
|---|---|---|
| $t$ | sec | TIME |
| $U_1$ | V | OPEN CIRCUIT POTENTIAL OF CATHODE PARTICLE |
| $U_2$ | V | OPEN CIRCUIT POTENTIAL OF ANODE PARTICLE |
| $\Delta V_{stress}$ | V | OCP CHANGE AMOUNT OF SILICON PARTICLE DUE TO SURFACE STRESS |
| $U_{2\_sta}$ | V | OCP OF ANODE PARTICLE WITH ZERO SURFACE STRESS |
| $V_1$ | V | CATHODE POTENTIAL |
| $V_2$ | V | ANODE POTENTIAL |
| $\Delta V_e$ | V | SALT CONCENTRATION OVERPOTENTIAL |
| $\eta_i$ | V | REACTION OVERPOTENTIAL (+: Li DEINTERCALATION, −: Li INTERCALATION) |
| $c_{s\_i}$ | mol/cm$^3$ | LITHIUM CONCENTRATION IN ACTIVE MATERIAL |
| $\theta_i$ | — | LOCAL LITHIUM AMOUNT (= LITHIUM CONCENTRATION / LIMITING LITHIUM CONCENTRATION) |
| $\theta_{i\_surf}$ | — | LOCAL LITHIUM AMOUNT ON ACTIVE MATERIAL SURFACE |
| $\theta_{i\_ave}$ | — | AVERAGE LITHIUM AMOUNT IN ACTIVE MATERIAL |
| $\theta_{1\_fix}$ | — | CORRESPONDING POINT OF LOCAL LITHIUM AMOUNT IN CATHODE-ANODE (CATHODE SIDE) |
| $\theta_{2\_fix}$ | — | CORRESPONDING POINT OF LOCAL LITHIUM AMOUNT IN CATHODE-ANODE (ANODE SIDE) |
| $\theta_{rate}$ | — | RATIO BETWEEN CATHODE CAPACITY AND ANODE CAPACITY (CAPACITY RATIO) |
| $I_T$ | A/cm$^2$ | TOTAL CURRENT (+:DISCHARGING −: CHARGING) |
| $\sigma_{surf}$ | Pa | STRESS ON SiO SURFACE (+: TENSION −: COMPRESSION) |
| $\sigma_{com}$ | Pa | STRESS WITH YIELDING SiO (COMPRESSION) |
| $\sigma_{ten}$ | Pa | STRESS WITH YIELDING SiO (TENSION) |
| $\Omega$ | cm$^3$/mol | VOLUME CHANGE OF SiO PER MOLE OF LITHIUM |
| $\alpha$ | Pa/(mol/cm$^3$) | PROPORTIONALITY CONSTANT |
| $R_d$ | $\Omega$ cm$^3$ | DIRECT CURRENT RESISTANCE |
| $\Delta c_e$ | mol/cm$^3$ | SALT CONCENTRATION DIFFERENCE BETWEEN CATHODE AND ANODE |
| $\alpha_e$ | — | COEFFICIENT OF DIFFUSION EQUATION FOR SALT CONCENTRATION |
| $\beta$ | — | COEFFICIENT OF DIFFUSION EQUATION FOR SALT CONCENTRATION |
| $i_{0i}$ | A/cm$^2$ | EXCHANGE CURRENT DENSITY |
| $a_s$ | — | ACTIVE MATERIAL SPECIFIC SURFACE AREA |
| $L_i$ | cm | ELECTRODE THICKNESS |
| $\beta_i$ | — | BUTLER-VOLMER CORRECTION COEFFICIENT |
| $c_{Si,max}$ | mol/cm$^3$ | LIMITING LITHIUM CONCENTRATION OF SILICON PARTICLE (CAPACITY WITH $\theta_{Si}$ OF 0 TO 1) |
| $T$ | K | ABSOLUTE TEMPERATURE |
| $F$ | C/mol | FARADAY CONSTANT |
| $R$ | J/(mol·K) | GAS CONSTANT |

| SYMBOLS | ITEMS |
|---|---|
| 1 | PARAMETER OF CATHODE PARTICLE |
| Si | PARAMETER OF SILICON PARTICLE |
| gra | PARAMETER OF GRAPHITE PARTICLE |
| 2 | PARAMETER OF COMPOSITE ANODE PARTICLE |
| surf | VALUE ON ACTIVE MATERIAL SURFACE |
| ave | AVERAGE VALUE IN ACTIVE MATERIAL |

SECONDARY BATTERY SYSTEM AND METHOD FOR ESTIMATING DETERIORATION STATE OF SECONDARY BATTERY

CROSS REFERENCE TO RELATED APPLICATIONS

This nonprovisional application claims priority to Japanese Patent Application No. 2018-172616 filed on Sep. 14, 2018 and No. 2019-144833 filed on Aug. 6, 2019, with the Japan Patent Office, the entire contents of which are hereby incorporated by reference.

BACKGROUND

Field

The present disclosure relates to a secondary battery system and a method for estimating the deterioration state of a secondary battery.

Description of the Background Art

In recent years, vehicles with an on-board secondary battery, such as hybrid vehicles and electric vehicles, have been more and more widely used. The secondary battery deteriorates as the vehicle travels a longer distance and is used for a longer time. The deteriorated secondary battery may reduce its full charge capacity. Also, the characteristics of change in open circuit voltage (OCV) with respect to the state of charge (SOC), i.e., a SOC-OCV curve, may change. In some embodiments, in order to suitably protect and utilize the secondary battery, the deterioration state of the secondary battery may be estimated and that the full charge capacity and/or the SOC-OCV curve of the secondary battery may be corrected in accordance with the result of estimation. Accordingly, techniques for accurately estimating the deterioration state of the secondary battery have been proposed.

For example, Japanese Patent Laying-Open No. 2011-220917 discloses a technique for estimating the deterioration state of a secondary battery based on three deterioration parameters obtained in an exploratory manner. The three deterioration parameters are a cathode capacity maintenance ratio $k_1$, an anode capacity maintenance ratio $k_2$, and a composition correspondence deviation amount $\Delta Q_s$ of the secondary battery (the details of each parameter will be described later). Similarly, Japanese Patent Laying-Open Nos. 2017-190979 and 2017-195727 also disclose techniques for estimating the deterioration state of a secondary battery using the above-described three deterioration parameters.

SUMMARY

Some systems of secondary batteries have a significant gap between the charging curve, which is a SOC-OCV curve obtained when the secondary battery is charged from the fully discharged state, and the discharging curve, which is a SOC-OCV curve obtained when the secondary battery is discharged from the fully charged state. Such a gap between the charging curve and the discharging curve is also referred to as existence of "hysteresis" in the secondary battery.

For example, in a lithium-ion secondary battery, the use of a silicon material as an anode active material is being studied. This is because the use of a silicon material can increase the full charge capacity as compared to a case with no silicon material. However, it is known that the use of a silicon material causes increase in hysteresis in the SOC-OCV curve as compared to a case with no silicon material (see, for example, Japanese Patent Laying-Open No. 2014-139521).

If a secondary battery has hysteresis, the SOC corresponding to the OCV may vary depending on the charging-discharging history even when the OCV of one secondary battery is equal to the OCV of another secondary battery. This makes it difficult to uniquely estimate the deterioration state of the secondary battery. However, the techniques for estimating the deterioration state of a secondary battery disclosed in Japanese Patent Laying-Open Nos. 2011-220917, 2017-190979, and 2017-195727 do not take into consideration the hysteresis in the secondary battery at all. In this respect, there is room for improvement in accuracy in estimation of the deterioration state of the secondary battery in the techniques disclosed in the above-mentioned documents.

The present disclosure has been made to solve such a problem, and an object of the present disclosure is to improve the accuracy in estimation of the deterioration state of a secondary battery having hysteresis in charging and discharging.

(1) A secondary battery system according to one aspect of the present disclosure includes a secondary battery and a controller. The secondary battery includes a cathode including a cathode active material, and an anode including an anode active material. The controller obtains a first OCV curve by measurement, the first OCV curve representing an OCV change relative to a capacity change of the secondary battery, and specify a second OCV curve using first to third deterioration parameters, the second OCV curve representing an OCV change relative to a capacity change of the secondary battery. The first deterioration parameter is a cathode capacity maintenance ratio indicating a ratio of a cathode capacity in a deterioration state, relative to the cathode capacity in an initial state. The second deterioration parameter is an anode capacity maintenance ratio indicating a ratio of an anode capacity in the deterioration state, relative to the anode capacity in the initial state. The third deterioration parameter is a composition correspondence deviation amount indicating an amount by which a correspondence relationship between a composition of the cathode and a composition of the anode deviates from a correspondence relationship in the initial state. The composition of the cathode is expressed by a local charge carrier amount on a surface of the cathode active material. The composition of the anode is expressed by a local charge carrier amount on a surface of the anode active material.

The controller calculates, based on a prescribed active material model, a surface stress of an object active material from a charge carrier amount inside the object active material, the object active material being one of the cathode active material and the anode active material. The controller calculates, based on the calculated surface stress, an open circuit potential change amount in an electrode relative to a reference potential, the electrode including the object active material. The reference potential is an open circuit potential of the object active material, with the surface stress being a reference stress. The controller corrects the second OCV curve using the open circuit potential change amount. The controller calculates the first to third deterioration parameters so that the first OCV curve substantially matches the corrected second OCV curve. The controller estimates the deterioration state of the secondary battery based on at least one of the calculated first to third deterioration parameters.

(2) The reference potential is an open circuit potential of the object active material in a state in which the surface stress is not generated.

(3) The controller calculates an estimated value of the surface stress from a difference amount using a linear relationship satisfied between the difference amount and the surface stress, the difference amount being obtained by subtracting a reference charge carrier amount from the charge carrier amount inside the object active material. When a magnitude of the estimated value is larger than a magnitude of a yield stress of the object active material, the controller employs the yield stress as the surface stress. When the magnitude of the estimated value is smaller than the magnitude of the yield stress, the controller employs the estimated value as the surface stress.

(4) The secondary battery is a lithium-ion secondary battery. The object active material is an active material made of a silicon compound.

According to the features of the above (1) to (4), a surface stress generated on the object active material is calculated, and an amount of deviation of the open circuit potential due to the surface stress (i.e., an open circuit potential change amount) is calculated. Further, the second OCV curve is corrected using the open circuit potential change amount. Thus, the corrected second OCV curve takes into consideration the influence of the surface stress. Further, the first to third deterioration parameters are calculated by, for example, a search process, so that the first OCV curve matches most closely with the corrected second OCV curve. The deterioration parameters thus calculated take into consideration the influence of the surface stress. Accordingly, based on such deterioration parameters, the deterioration state of the secondary battery can be estimated by taking into consideration the influence of the hysteresis. This can enhance the accuracy in estimation of the deterioration state of the secondary battery having hysteresis in charging and discharging.

(5) The object active material includes first and second active materials. With charging and discharging of the secondary battery, the first active material is larger in volume change amount than the second active material. The controller calculates a surface stress of the first active material from a charge carrier amount inside the first active material, under a condition that the first active material and the second active material are equipotential, and calculate, based on the calculated surface stress, the open circuit potential change amount in the electrode including the object active material.

According to the feature of the above (5), when the object active material includes two types of active materials (first and second active materials), a surface stress generated on the first active material is calculated. This allows calculation of the deterioration parameters by taking into consideration the influence of the surface stress, as with the feature of the above (1).

(6) A secondary battery system according to another aspect of the present disclosure includes a secondary battery and a controller. The secondary battery includes a cathode including a cathode active material, and an anode including an anode active material. The controller obtains a first OCV curve by measurement, the first OCV curve representing an OCV change relative to a capacity change of the secondary battery, and specify a second OCV curve using first to fourth deterioration parameters, the second OCV curve representing an OCV change relative to a capacity change of the secondary battery. The cathode active material includes first and second active materials. With charging and discharging of the secondary battery, the first active material is larger in volume change amount than the second active material. The first deterioration parameter is a first cathode capacity maintenance ratio indicating a ratio of a cathode capacity corresponding to the first active material in a deterioration state, relative to the cathode capacity corresponding to the first active material in an initial state. The second deterioration parameter is a second cathode capacity maintenance ratio indicating a ratio of a cathode capacity corresponding to the second active material in the deterioration state, relative to the cathode capacity corresponding to the second active material in the initial state. The third deterioration parameter is an anode capacity maintenance ratio indicating a ratio of an anode capacity in the deterioration state, relative to the anode capacity in the initial state. The fourth deterioration parameter is a composition correspondence deviation amount indicating an amount by which a correspondence relationship between a composition of the cathode and a composition of the anode deviates from a correspondence relationship in the initial state. The composition of the cathode is expressed by a local charge carrier amount on a surface of the cathode active material. The composition of the anode is expressed by a local charge carrier amount on a surface of the anode active material.

The controller calculates a surface stress of the first active material from a charge carrier amount inside the first active material, under a condition that the first active material and the second active material are equipotential, and calculate, based on the calculated surface stress, an open circuit potential change amount in the cathode relative to a reference potential. The reference potential is an open circuit potential of the first active material, with the surface stress being a reference stress. The controller corrects the second OCV curve using the open circuit potential change amount. The controller calculates the first to fourth deterioration parameters so that the first OCV curve substantially matches the corrected second OCV curve. The controller estimates the deterioration state of the secondary battery based on at least one of the calculated first to fourth deterioration parameters.

(7) A secondary battery system according to still another aspect of the present disclosure includes a secondary battery and a controller. The secondary battery includes a cathode including a cathode active material, and an anode including an anode active material. The controller obtains a first OCV curve by measurement, the first OCV curve representing an OCV change relative to a capacity change of the secondary battery, and specify a second OCV curve using first to fourth deterioration parameters, the second OCV curve representing an OCV change relative to a capacity change of the secondary battery. The anode active material includes first and second active materials. With charging and discharging of the secondary battery, the first active material is larger in volume change amount than the second active material. The first deterioration parameter is a cathode capacity maintenance ratio indicating a ratio of a cathode capacity in a deterioration state, relative to the cathode capacity in an initial state. The second deterioration parameter is a first anode capacity maintenance ratio indicating a ratio of an anode capacity corresponding to the first active material in the deterioration state, relative to the anode capacity corresponding to the first active material in the initial state. The third deterioration parameter is a second anode capacity maintenance ratio indicating a ratio of an anode capacity corresponding to the second active material in the deterioration state, relative to the anode capacity corresponding to the second active material in the initial state. The fourth deterioration parameter is a composition correspondence deviation amount indicating an amount by which a correspondence relationship between a composition of the cathode and a composition of the anode deviates from a correspondence relationship in the initial state. The composition of the cathode is expressed by a local charge carrier amount on a surface of the cathode active material. The composition of the anode is expressed by a local charge carrier amount on a surface of the anode active material.

The controller calculates a surface stress of the first active material from a charge carrier amount inside the first active material, under a condition that the first active material and the second active material are equipotential, and calculate, based on the calculated surface stress, an open circuit potential change amount in the anode relative to a reference potential. The reference potential is an open circuit potential of the first active material, with the surface stress being a reference stress. The controller corrects the second OCV curve using the open circuit potential change amount. The controller calculates the first to fourth deterioration parameters so that the first OCV curve substantially matches the corrected second OCV curve. The controller estimates the deterioration state of the secondary battery based on at least one of the calculated first to, fourth deterioration parameters.

The features of the above (6) and (7) can enhance the accuracy in estimation of the deterioration state of the secondary battery having hysteresis in charging and discharging when the object, active material includes two types of active materials, as with the feature of the above (5).

(8) A method for estimating the deterioration state of a secondary battery according to still another aspect of the present disclosure estimates the deterioration state of a secondary battery, the secondary battery including a cathode including a cathode active material, and an anode including an anode active material. The method for estimating the deterioration state of a secondary battery includes first to seventh steps. The first step is obtaining a first OCV curve by measurement, the first OCV curve representing an OCV change relative to a capacity change of the secondary battery. The second step is specifying a second OCV curve using first to third deterioration parameters, the second OCV curve representing an OCV change relative to a capacity change of the secondary battery. The first deterioration parameter is a cathode capacity maintenance ratio indicating a ratio of a cathode capacity in the deterioration state, relative to the cathode capacity in an initial state. The second deterioration parameter is an anode capacity maintenance ratio indicating a ratio of an anode capacity in the deterioration state, relative to the anode capacity in the initial state. The third deterioration parameter is a composition correspondence deviation amount indicating an amount by which a correspondence relationship between a composition of the cathode and a composition of the anode deviates from a correspondence relationship in the initial state. The composition of the cathode is expressed by a local charge carrier amount on a surface of the cathode active material. The composition of the anode is expressed by a local charge carrier amount on a surface of the anode active material.

The third step is calculating a surface stress of an object active material from a charge carrier amount inside the object active material, the object active material being one of the cathode active material and the anode active material. The fourth step is calculating, based on the calculated surface stress, an open circuit potential change amount in an electrode relative to a reference potential, the electrode including the object active material. The reference potential is an open circuit potential of the object active material, with the surface stress being a reference stress. The fifth step is correcting the second OCV curve using the open circuit potential change amount. The sixth step is calculating the first to third deterioration parameters so that the first OCV curve substantially matches the corrected second OCV curve. The seventh step is estimating the deterioration state of the secondary battery based on at least one of the calculated first to third deterioration parameters.

The method of the above (8) can enhance the accuracy in estimation of the deterioration state of the secondary battery having hysteresis, as with the feature of the above (1).

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 5 is a diagram for explaining parameters used for the active material model.

DETAILED DESCRIPTION

Figure 1:
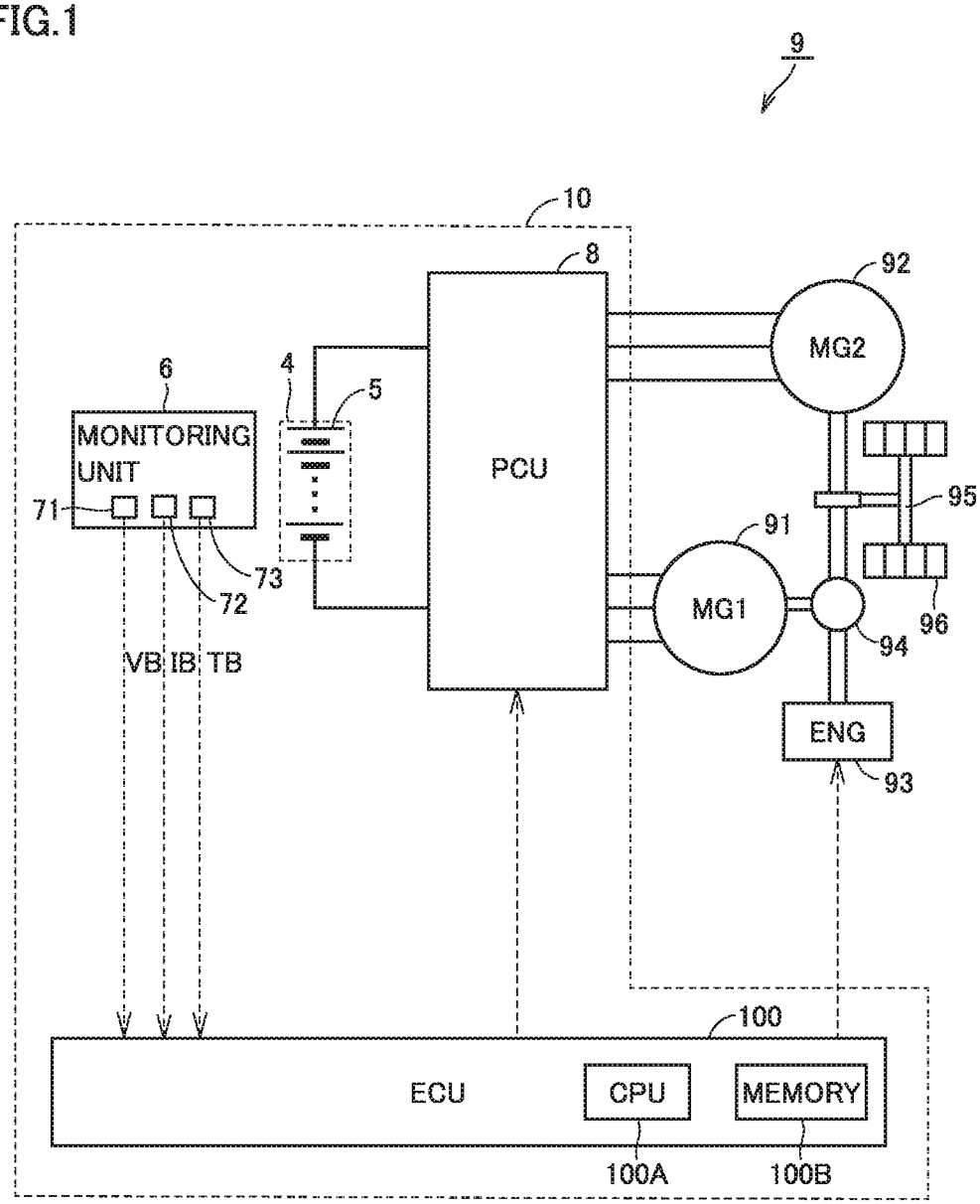
FIG. 1 is a diagram schematically showing a general configuration of an electric-powered vehicle having a secondary battery system according to embodiment 1.

Embodiments of the present disclosure are described in detail hereinafter with reference to the drawings. Identical or corresponding parts in the drawings are identically denoted, and the explanation thereof is not repeated.

The following describes a case in which a secondary battery system according to embodiments of the present disclosure is mounted on an electric-powered vehicle. The electric-powered vehicle may be a hybrid vehicle (including a plug-in hybrid vehicle), an electric vehicle, or a fuel battery vehicle. Also, the electric-powered vehicle may be a hybrid vehicle combining a fuel battery and a secondary battery. However, the "secondary battery system" according to the present disclosure is not limited to an on-vehicle secondary battery system, but may be a stationary secondary battery system.

Embodiment 1

<Configuration of Secondary Battery System>

FIG. 1 is a diagram schematically showing a general configuration of an electric-powered vehicle having a secondary battery system according to embodiment 1. With reference to FIG. 1, a vehicle 9, a hybrid vehicle, includes motor generators 91, 92, an engine 93, a motive power dividing device 94, a drive shaft 95, a drive wheel 96, and a secondary battery system 10. Secondary battery system 10 includes a battery 4, a monitoring unit 6, a power control unit (PCU) 8, and an electronic control unit (ECU) 100.

Each of motor generators 91, 92 is an AC dynamo-electric machine, such as a three-phase AC synchronous motor having a rotor with embedded permanent magnets. Motor generator 91 is used mainly as a power generator to be driven by engine 93 via motive power dividing device 94. Electric power generated by motor generator 91 is supplied to motor generator 92 or battery 4 through PCU 8.

Motor generator 92 operates mainly as an electric motor for driving drive wheel 96. Motor generator 92 is driven by receiving at least one of electric power from battery 4 and electric power generated by motor generator 91. The driving force from motor generator 92 is transmitted to drive shaft 95. At the time of a low acceleration during braking of the vehicle or traveling on a descending slope, motor generator 92 operates as a power generator to perform regenerative power generation. Electric power generated by motor generator 92 is supplied to battery 4 through PCU 8.

Engine 93 is an internal combustion engine to output a motive power by converting combustion energy generated by combusting an air-fuel mixture into kinetic energy for movable parts, such as a piston and a rotor.

Motive power dividing device 94 includes epicyclic gearing (not shown) having three rotating shafts of a sun gear, a carrier, and a ring gear, for example. Motive power dividing device 94 divides motive power outputted from engine 93 into motive power for driving motor generator 91 and motive power for driving drive wheel 96.

Battery 4 is a battery pack including a plurality of cells (single cell) 61. In the present embodiment, each cell 5 is a lithium-ion secondary battery. The configuration of each cell 5 will be described with reference to FIG. 2.

Battery 4 stores electric power for driving motor generators 91, 92 and supplies the electric power to motor generators 91, 92 through PCU 8. Battery 4 is charged with electric power generated by motor generators 91, 92 through PCU 8.

Monitoring unit 6 includes a voltage sensor 71, a current sensor 72, and a temperature sensor 73. Voltage sensor 71 detects the voltage of each cell 5 included in battery 4 (battery pack). Current sensor 72 detects the current inputted to and outputted from battery 4. Temperature sensor 73 detects the temperature of each cell 5. Each sensor outputs the detection result to ECU 100.

Voltage sensor 71 may detect voltage VB for a plurality of cells 5 connected in series, for example, as a unit of monitoring. Temperature sensor 73 may detect temperature TB for a plurality of adjacent cells 5 as a unit of monitoring. Any unit of monitoring may be employed in the present embodiment. For simplicity's sake, the following description simply uses the phrase "detect voltage VB of battery 4" or "detect temperature TB of battery 4". The same applies to the potential, the OCV, and the SOC, which will be described with battery 4 as a unit of execution of each process.

PCU 8 performs two-way power conversion between battery 4 and motor generators 91, 92 in accordance with the control signal from ECU 100. PCU 8 is configured to control the states of motor generators 91, 92 independently of each other. For example, PCU 8 may control motor generator 91 into a regenerative state (power generation state), while controlling motor generator 92 into a powering state. PCU 8 includes, for example, two inverters (not shown) corresponding to motor generators 91, 92, and a converter (not shown) to raise a DC voltage supplied to each inverter to more than or equal to the output voltage of battery 4.

ECU 100 includes a central processing unit (CPU) 100A, a memory (specifically, a read only memory (ROM) and a random access memory (RAM)) 100B, and an input/output port (not shown) for inputting and outputting various types of signals. ECU 100 estimates the state of battery 4 based on a signal from each sensor of monitoring unit 6 and based on a program and a map stored in memory 100B. Examples of main processes to be executed by ECU 100 include a "potential calculation process" to calculate various potential components including a cathode potential $V_1$ and an anode potential $V_2$ of battery 4. ECU 100 estimates the SOC of battery 4 and controls charging and discharging of battery 4 in accordance with the result of the "potential calculation process".

Cathode potential $V_1$ refers to the potential of cathode (see FIG. 2) at the time when battery 4 is in a conduction state. Anode potential $V_2$ refers to the potential of anode at the time when battery 4 is in a conduction state. When battery 4 is in a non-conduction state (no-load state), the potential of cathode is referred to as a cathode open circuit potential (OCP) $U_1$, and the potential of anode is referred to as an anode open circuit potential $U_2$. Any potential may be set as a reference potential (0 V) for these potentials (and other potentials described later). In the present embodiment, the potential of metallic lithium is defined as the reference.

Figure 2:
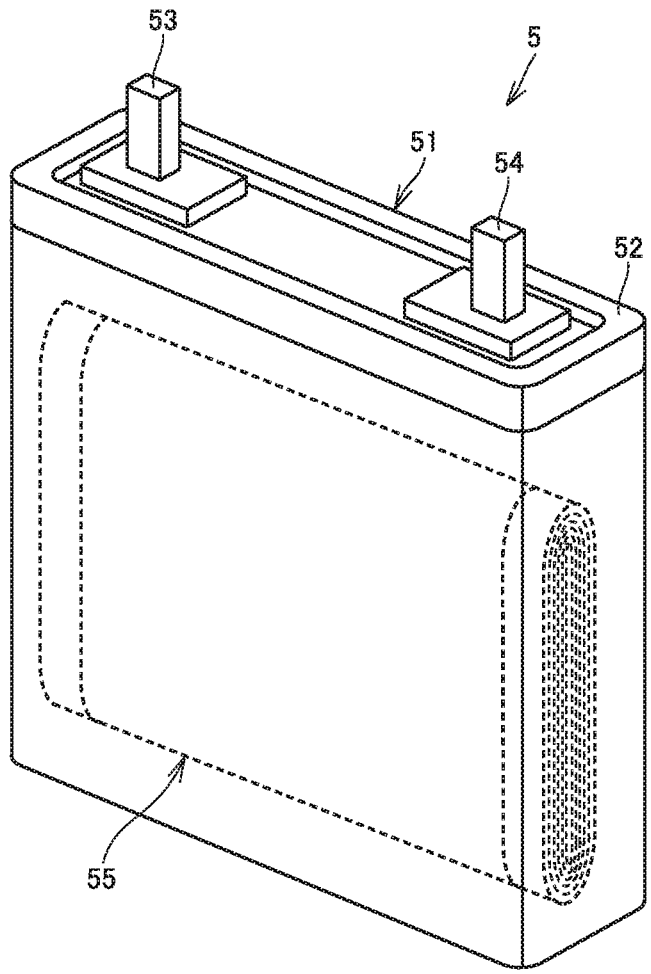
FIG. 2 is a diagram for explaining a configuration of each cell in more detail.

FIG. 2 is a diagram for explaining a configuration of each cell 5 in more detail. FIG. 2 shows cell 5 with its inside seen through.

With reference to FIG. 2, cell 5 has a battery case 51 having an angular shape (substantially in the shape of a rectangular parallelepiped). The top of battery case 51 is closed with a lid 52. One end of each of a cathode terminal 53 and an anode terminal 54 protrudes outward from lid 52. The other end of each of cathode terminal 53 and anode terminal 54 is connected to a corresponding one of an internal cathode terminal and an internal anode terminal (which are not shown) in battery case 51. Battery case 51 contains an electrode body 55 therein. Electrode body 55 is formed by stacking a cathode and an anode with a separator lying therebetween and by winding the stack. An electrolytic solution is held by the cathode, the anode, the separator, and the like.

The cathode, the separator, and the electrolytic solution may have any composition and material conventionally known as a composition and material of a cathode, a separator, and an electrolytic solution of a lithium-ion secondary battery. By way of example, the cathode may be made of a ternary material, that is, lithium cobalt oxide partially substituted by nickel and manganese. The separator may be made of polyolefin (e.g. polyethylene or polypropylene). The electrolytic solution may contain: an organic solvent (e.g. a mixture of dimethyl carbonate (DMC), ethyl methyl carbonate (EMC), and ethylene carbonate (EC)); a lithium salt (e.g. $LiPF_6$); and an additive (e.g. lithium bis (oxalate) borate (LiBOB) or $Li[PF_2 (C_2O_4)_2]$).

The cell may have any structure. For example, the electrode body may have a layered structure, instead of a wound structure. The battery case is not limited to an angular shape but may have a cylindrical or laminated shape.

<Hysteresis in SOC-OCV Curve>

Conventionally, a carbon material (e.g. graphite) has been typically used as an anode active material for a lithium-ion secondary battery. In the present embodiment, a silicon material (Si or SiO) is used as an anode active material. This is because using a silicon material can increase the energy density of battery 4 and can thus increase the full charge capacity of battery 4. Using a silicon material, however, may cause significant hysteresis to appear in the SOC-OCV curve of battery 4.

Figure 3:
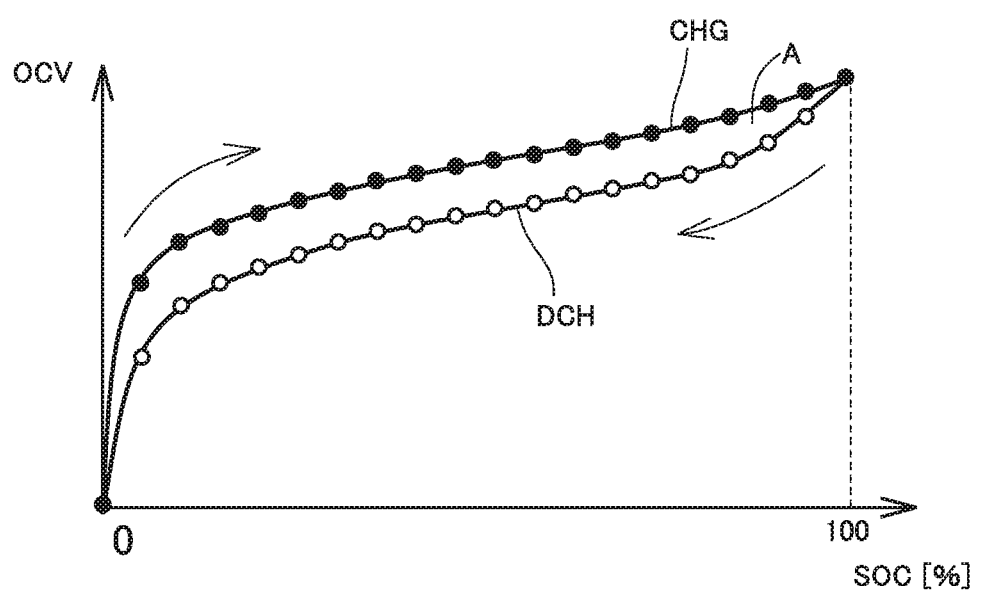
FIG. 3 is a diagram showing one example of the SOC-OCV curve of a battery in the present embodiment.

FIG. 3 is a diagram showing one example of the SOC-OCV curve of battery 4 in the present embodiment. In FIG. 3, the horizontal axis represents the SOC of battery 4, and the vertical axis represents the OCV of battery 4. As used herein, the OCV refers to a voltage in a state where the voltage of the secondary battery is relaxed enough, in other words, where the concentration of charge carrier in the active material (the lithium concentration, in the present embodiment) is relaxed.

FIG. 3 shows a charging curve CHG and a discharging curve DCH of battery 4. Charging curve CHG is acquired by repeating charging and stopping (stop of charging) of battery 4 from the fully discharged state. Discharging curve DCH is acquired by repeating discharging and stopping (stop of discharging) of battery 4 from the fully charged state.

Specifically, charging curve CHG can be acquired as follows. First, battery 4 in the fully discharged state is prepared and is charged with an electric quantity equivalent to a SOC of, for example, 5%. After charging with that electric quantity, the charging is stopped and battery 4 is left as it is until polarization due to the charging disappears (e.g. for 30 minutes). After a lapse of the leaving time, the OCV of battery 4 is measured. The combination (SOC, OCV) of the SOC (=5%) after the charging and the measured OCV is plotted in the figure.

Then, battery 4 starts to be charged with an electric quantity equivalent to a SOC of subsequent 5% (charging from SOC=5% to SOC=10%). When the charging completes, battery 4 is left as it is in the same manner as above. After a lapse of the leaving time, the OCV of battery 4 is measured. From the measurement result of OCV, the state of battery 4 (the combination of the SOC and the OCV) is plotted again. The same procedure is repeated until battery 4 reaches the fully charged state. By such measurement; charging curve CHG can be acquired.

Similarly, discharging and stop of discharging from battery 4 are repeated until battery 4, starting from the fully charged state, reaches the fully discharged state. Meanwhile, the OCV of battery 4 is measured for every 5% of the SOC. By such measurement, discharging curve DCH can be acquired. The acquired charging curve CHG and discharging curve DCH are stored in memory 100B of ECU 100.

An OCV on charging curve CHG is also referred to as a "charging OCV", and an OCV on discharging curve DCH is also referred to as a "discharging OCV". The charging OCV shows the highest value of the OCV for each SOC, and the discharging OCV shows the lowest value of the OCV for each SOC. The state of battery 4 is plotted on the charging OCV, on the discharging OCV, or in a region enclosed by the charging OCV and the discharging OCV (hereinafter also referred to as an "intermediate region A") (see FIG. 10 and FIG. 11 described later). A gap between the charging OCV and the discharging OCV (i.e., a voltage difference of, for example, about 150 mV) represents the existence of hysteresis in battery 4.

<Local Lithium Amount>

Next, estimation of the deterioration state of battery 4 in the present embodiment is described in outline. In the idea of this deterioration estimation, a certain active material model (battery model) is used. This active material model schematically shows a cathode active material as one particle, and schematically shows an anode active material as another particle.

Figure 4:
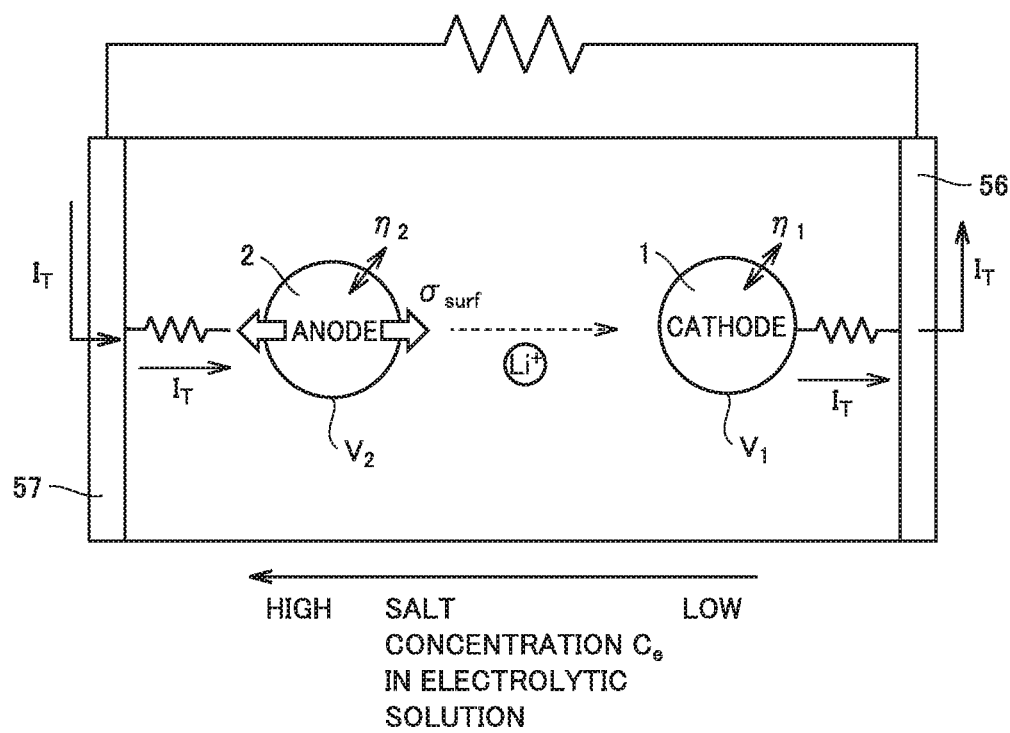
FIG. 4 is a diagram for explaining an active material model in the present embodiment.

FIG. 4 is a diagram for explaining an active material model in the present embodiment. With reference to FIG. 4, a battery model is employed as the active material model in the present embodiment, where the cathode of battery 4 is represented by one active material (one particle), and the anode is represented by one active material (one particle). The former particle is referred to as a "cathode particle 1", and the latter particle is referred to as an "anode particle 2".

FIG. 4 shows a state at the time of discharging from battery 4. At the time of discharging from battery 4, lithium ion (denoted by Li$^+$) is deintercalated from anode particle 2, while lithium ion is intercalated in cathode particle 1. At this time, a total current $I_T$ flows through battery 4. At the time of charging of battery 4, the direction of current (total current $I_T$) is opposite to the direction shown in FIG. 4, although not shown. In the present specification, a current at the time of charging is negative, while a current at the time of discharging is positive.

Figures 6, 7:
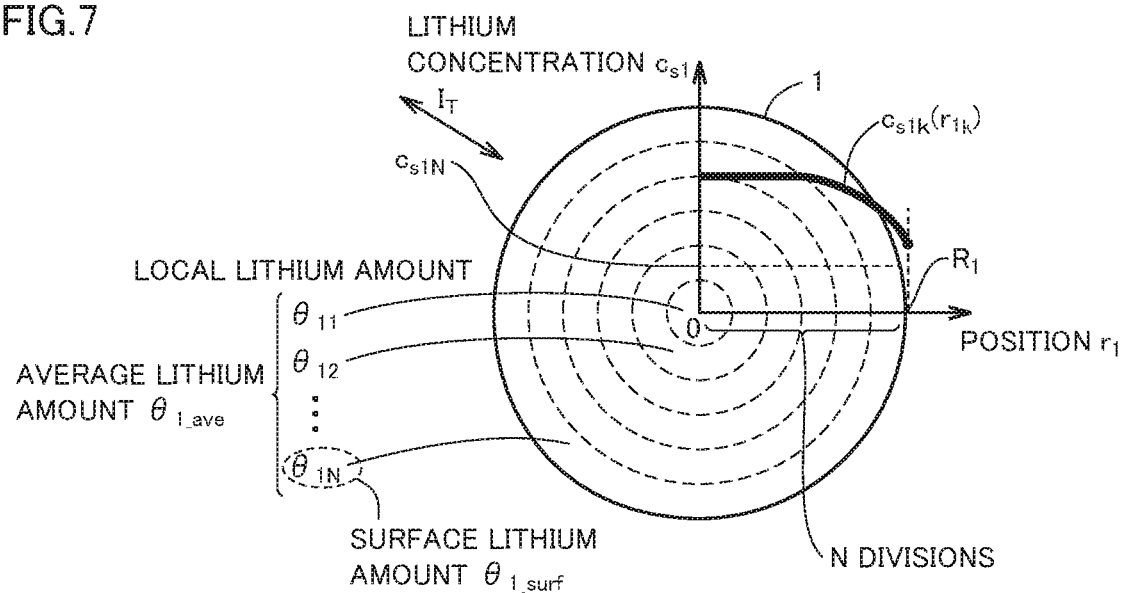
FIG. 6 is a diagram for explaining subscripts used for the active material model.
FIG. 7 is a diagram for explaining a technique for calculating the lithium concentration distribution inside a cathode particle and an anode particle.

FIG. 5 is a diagram for explaining parameters (variables and constants) used for the active material model. FIG. 6 is a diagram for explaining subscripts (inferior letters) used for the active material model. As shown in FIG. 5 and FIG. 6, a subscript i is for distinguishing between cathode particle 1 and anode particle 2, where any one of i=1 and i=2 is satisfied. The case of i=1 indicates a value related to cathode particle 1, and the case of i=2 indicates a value related to anode particle 2. Among the parameters used for the active material model, a parameter with a subscript e indicates a value in the electrolytic solution, and a parameter with a subscript s indicates a value in an active material.

As described hereinafter, in the active material model in the present embodiment, the lithium concentration distribution inside of each of cathode particle 1 and anode particle 2 is calculated.

FIG. 7 is a diagram for explaining a technique for calculating the lithium concentration distribution inside cathode particle 1 and anode particle 2. With reference to FIG. 7, in spherical cathode particle 1 in the present embodiment, the lithium concentration distribution is considered only in the radial direction of the polar coordinates, while the lithium concentration distribution in the circumferential direction of the polar coordinates is assumed to be uniform. In other words, the internal model of cathode particle 1 is a one-dimensional model where the direction of movement of lithium is limited to the radial direction.

Cathode particle 1 is virtually divided into N (N is a natural number of two or more) regions in its radial direction. The regions are distinguished from one another by subscripts k (k=1 to N). A lithium concentration $c_{1k}$ in a region k is expressed as a function of the position $r_{1k}$ of region k in the radial direction of cathode particle 1 and time t (see the following equation (1)).

$$c_{s1k} = c_{s1}(r_{1k}, t) \quad (1)$$

In the present embodiment, lithium concentration $c_{s1k}$ of each region k is calculated (i.e., the lithium concentration distribution is calculated), and the calculated lithium concentration $c_{1k}$ is normalized, the detailed technique for calculation of which will be described later. Specifically, as expressed by the following equation (2), the ratio of the calculated value of lithium concentration $c_{1k}$ to the maximum value of lithium concentration (hereinafter referred to as a "limit lithium concentration") $c_{1,\,max}$ is calculated for each region k. Limit lithium concentration $c_{1,\,max}$ is a concentration that is determined depending on the type of cathode active material, which is known from the documents.

$$\theta_{1k} = \frac{c_{s1k}}{c_{s1k,max}} \quad (2)$$

Hereinafter, $\theta_{1k}$, which is a value after the normalization, is referred to as a "local lithium amount" of region k. Local lithium amount $\theta_{1k}$ takes a value within the range of 0 to 1 in accordance with the lithium amount contained in region k of cathode particle 1. Local lithium amount $\theta_{1N}$ in outermost region N with k=N (i.e., the surface of cathode particle 1) is referred to as a "surface lithium amount" and is denoted by $\theta_{1\_surf}$. Further, as expressed by the following equation (3), the sum total of the products of volumes $V_{1k}$ and local lithium amounts $\theta_{1k}$ of regions k (k=1 to N) is calculated, and the sum total is divided by the volume of cathode particle 1 (the volume of cathode active material). The resultant is referred to as an "average lithium amount" and is denoted by $\theta_{1\_ave}$.

$$\theta_{1\_ave} = \frac{1}{V_{s\_1}} \sum_{k=1}^{N} v_{1k} \theta_{1k} \quad (3)$$

FIG. 7 takes a particle representing the cathode active material (cathode particle 1) as an example. This similarly applies to a technique for calculating the lithium concentration distribution and the (distribution of) local lithium amount inside a particle representing the anode active material (anode particle 2). The number of divided regions may be different between cathode particle 1 and anode particle 2. In the present embodiment, however, the number of divided regions is both N for the sake of simplicity of the description.

Figure 8:
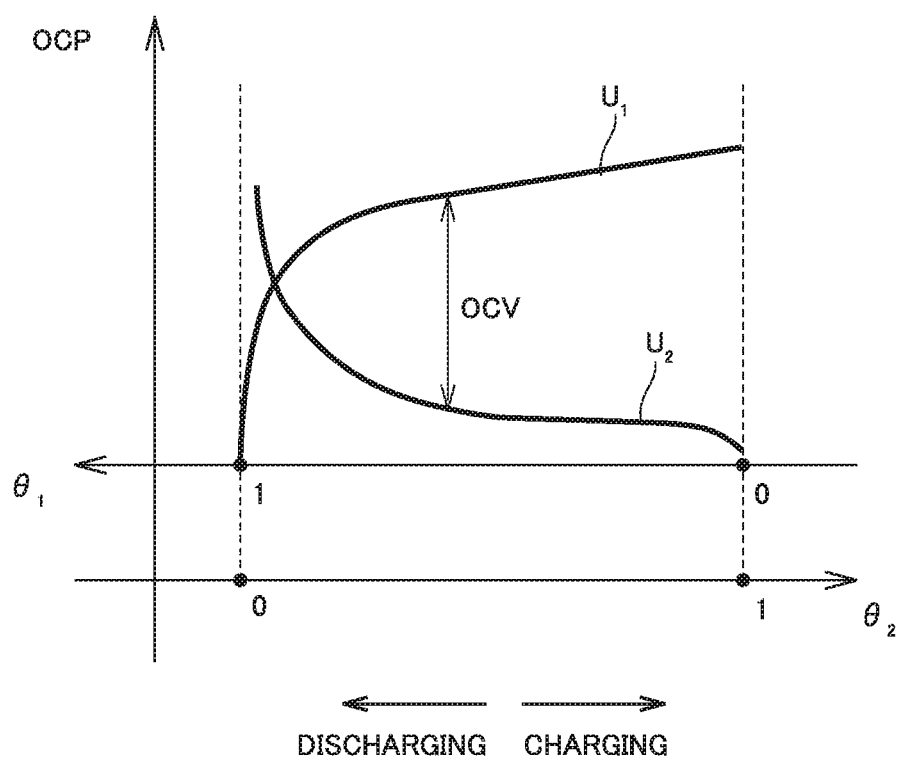
FIG. 8 is a diagram schematically showing the relationship between the surface lithium amount on a cathode particle and the cathode open circuit potential, and the relationship between the surface lithium amount on an anode particle and the anode open circuit potential.

FIG. 8 is a diagram schematically showing the relationship between lithium amount $\theta_1$ and cathode open circuit potential $U_1$ of cathode particle 1, and the relationship between lithium amount $\theta_2$ and anode open circuit potential $U_2$ of anode particle 2. The relationship between lithium amount $\theta_1$ and cathode open circuit potential $U_1$ shown in FIG. 8 is the relationship in the initial state of battery 4 (e.g., the state with no deterioration of battery 4, such as immediately after battery 4 was manufactured). The relationship between lithium amount $\theta_2$ and anode open circuit potential $U_2$ is also the relationship in the initial state of battery 4.

The difference between cathode open circuit potential $U_1$ and anode open circuit potential $U_2$ is equivalent to the OCV of battery 4. As shown in FIG. 8, the difference between cathode open circuit potential $U_1$ and anode open circuit potential $U_2$ increases as lithium amount $\theta_2$ goes rightward (in the charging direction of battery 4) in the drawing.

It is generally known that a secondary battery deteriorates and decreases its full charge capacity in accordance with the conditions and time of use. The decrease in full charge capacity of the secondary battery is caused mainly by the "decrease in single-electrode capacity" at the cathode and anode, and by the "composition correspondence deviation" between the cathode and anode. In the present embodiment, these two deterioration phenomena are turned into a model by introducing three deterioration parameters into the active material model. The three deterioration parameters are cathode capacity maintenance ratio $k_1$, anode capacity maintenance ratio $k_2$, and deviation amount $\Delta Q_s$. These deterioration parameters are hereinafter described. Cathode capacity maintenance ratio $k_1$, anode capacity maintenance ratio $k_2$, and deviation amount $\Delta Q_s$ are equivalent to "first to third deterioration parameters" in the present disclosure.

<Decrease in Single-Electrode Capacity>

The decrease in single-electrode capacity refers to a decrease in capacity of receiving lithium ion at each of the cathode and anode. In other words, the decrease in single-electrode capacity refers to a decrease in limit lithium concentration $c_{s1N,\,max}$ in the cathode active material (cathode particle 1), and a decrease in limit lithium concentration $c_{s2N,\,max}$ in the anode active material (anode particle 2).

Figure 9:
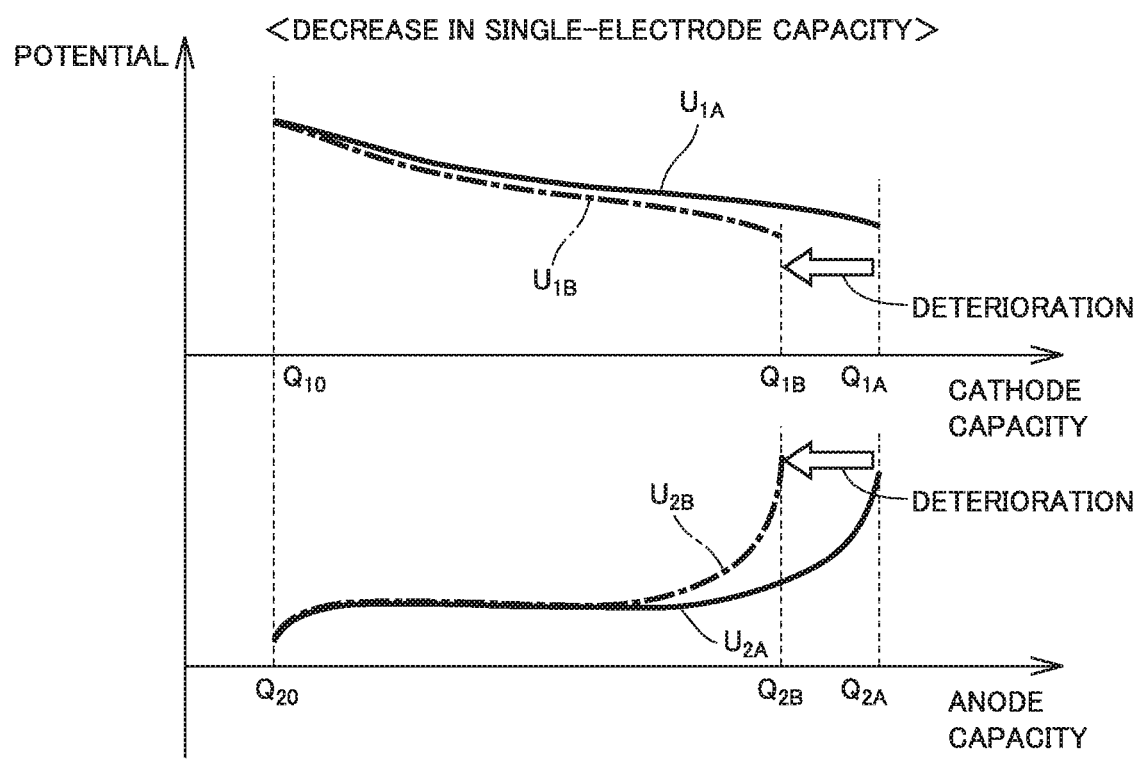
FIG. 9 is a diagram for explaining the decrease in single-electrode capacity.

FIG. 9 is a diagram for explaining the decrease in single-electrode capacity. In FIG. 9, the horizontal axis represents the cathode capacity and the anode capacity, and the vertical axis represents the potential. FIG. 9 schematically shows the change in cathode open circuit potential $U_1$ relative to the cathode capacity, associated with the deterioration of battery 4; and the change in anode open, circuit potential $U_2$ relative to the anode capacity, associated with the deterioration of battery 4.

With reference to the horizontal axis of the cathode capacity, $Q_{10}$ denotes the cathode capacity corresponding to lithium amount $\theta_1=0$ of cathode particle 1 at the time when battery 4 is in the initial state. $Q_{1A}$ denotes the cathode capacity corresponding to lithium amount $\theta_1=1$ at the time when battery 4 is in the initial state. When the capacity of receiving lithium ion of the cathode active material is reduced due to deterioration of battery 4, the cathode capacity corresponding to lithium amount $\theta_1=1$ decreases from $Q_{2A}$ to $Q_{2B}$.

With reference to the horizontal axis of the anode capacity, $Q_{20}$ denotes the anode capacity corresponding to lithium amount $\theta2=0$ of anode particle 2 at the time when battery 4 is in the initial state. $Q_{2A}$ denotes the anode capacity corresponding to lithium amount $\theta_2=1$ at the time when battery 4 is in the initial state. Similar to the above, on the anode side, when the capacity of receiving lithium ion of the anode active material is reduced due to deterioration of battery 4, the capacity corresponding to lithium amount $\theta_2=1$ decreases from $Q_{2A}$ to $Q_{2B}$.

On the other hand, deterioration of battery 4 does not cause a change in the relationship between lithium amount $\theta_1$ and cathode open circuit potential $U_1$ (see FIG. 8). Accordingly, when the relationship between lithium amount $\theta_1$ and cathode open circuit potential $U_1$ is converted into the relationship between the cathode capacity and cathode open circuit potential $U_1$, the curve (denoted by $U_{1B}$) representing the relationship between the cathode capacity and cathode open circuit potential $U_1$ in the deterioration state of battery 4 shortens in the leftward direction (in the discharging direction of battery 4) in the drawing by the deterioration of battery 4, as compared to the curve (denoted by $U_{1A}$) in the initial state of battery 4. Similarly, on the anode side, the curve (denoted by $U_{2B}$) representing the relationship between the anode capacity and anode open circuit potential $U_2$ in the deterioration state of battery 4 shortens in the leftward direction in the drawing by the deterioration of battery 4, as compared to the curve (denoted by $U_{2A}$) in the initial state.

Cathode capacity maintenance ratio $k_1$ is the ratio of the cathode capacity in the deterioration state of battery 4 to the cathode capacity in the initial state of battery 4, and is expressed by the following equation (4). Cathode capacity maintenance ratio $k_1$ is 1 when battery 4 is in the initial state, and decreases from 1 as battery 4 deteriorates (0<k<1).

$$k_1 = \frac{Q_{1A} - \Delta Q_1}{Q_{1A}} \tag{4}$$

Here, $\Delta Q_1$ denotes an amount of decrease in the cathode capacity caused by the deterioration of battery 4. Therefore, the numerator in equation (4) is cathode capacity $Q_{1B}=(Q_{1\_ini}-\Delta Q_1)$ at the time when battery 4 is in the deterioration state. Cathode capacity $Q_{1A}$ in the initial state can be calculated in advance from the theoretical capacity and the prepared amount of the cathode active material.

Anode capacity maintenance ratio $k_2$ is the ratio of the anode capacity in the deterioration state of battery 4 to the anode capacity in the initial state of battery 4, and is expressed by the following equation (5). Since the characteristics of the anode capacity are similar to those of the cathode capacity, the detailed explanation is not repeated for the anode capacity.

$$k_2 = \frac{Q_{2A} - \Delta Q_2}{Q_{2A}} \tag{5}$$

<Composition Correspondence Deviation>

The composition correspondence deviation refers to the deviation of the correspondence relationship (combination) between lithium amount $\theta_1$ of cathode particle 1 (the composition of cathode) and lithium amount $\theta_2$ of anode particle 2 (the composition of anode), from the correspondence relationship in the initial state of battery 4. When battery 4 is in the initial state, the amount of lithium ion emitted from one of the cathode and anode is equal to the amount of lithium ion received by the other. In this case, lithium amount $\theta_1$ corresponds to lithium amount $\theta_2$ accurately. When battery 4 deteriorates, however, the correspondence relationship between lithium amount $\theta_1$ and lithium amount $\theta_2$ may deviate due to the following two factors.

The first factor is that a coating is formed on the anode surface by lithium ion emitted from the anode. Lithium ion used for forming the coating is inactivated and does not contribute to the charging and discharging occurring thereafter. The second factor is that lithium ion emitted from the cathode is deposited on the anode surface as metallic lithium without being taken into the anode (so-called lithium deposition). Lithium ion deposited as metallic lithium also does not contribute to the charging and discharging occurring thereafter. When the deterioration progresses due to the first and second factors, lithium amount $\theta_2$ of anode particle 2 decreases with the emission of lithium ion from the anode. However, since the emitted lithium ion is not taken into the cathode, lithium amount $\theta_1$ of cathode particle 1 does not increase. As a result, the correspondence relationship between lithium amount $\theta_1$ and lithium amount $\theta_2$ deviates from the correspondence relationship in the initial state of battery 4. That is, the composition correspondence deviation arises.

When the composition correspondence deviation arises due to those two factors, the capacity of battery 4 changes. The amount of this capacity change is denoted by deviation amount $\Delta Q_s$ as described above. In battery 4 in the initial state, deviation amount $\Delta Q_s = 0$ is satisfied.

Figure 10:
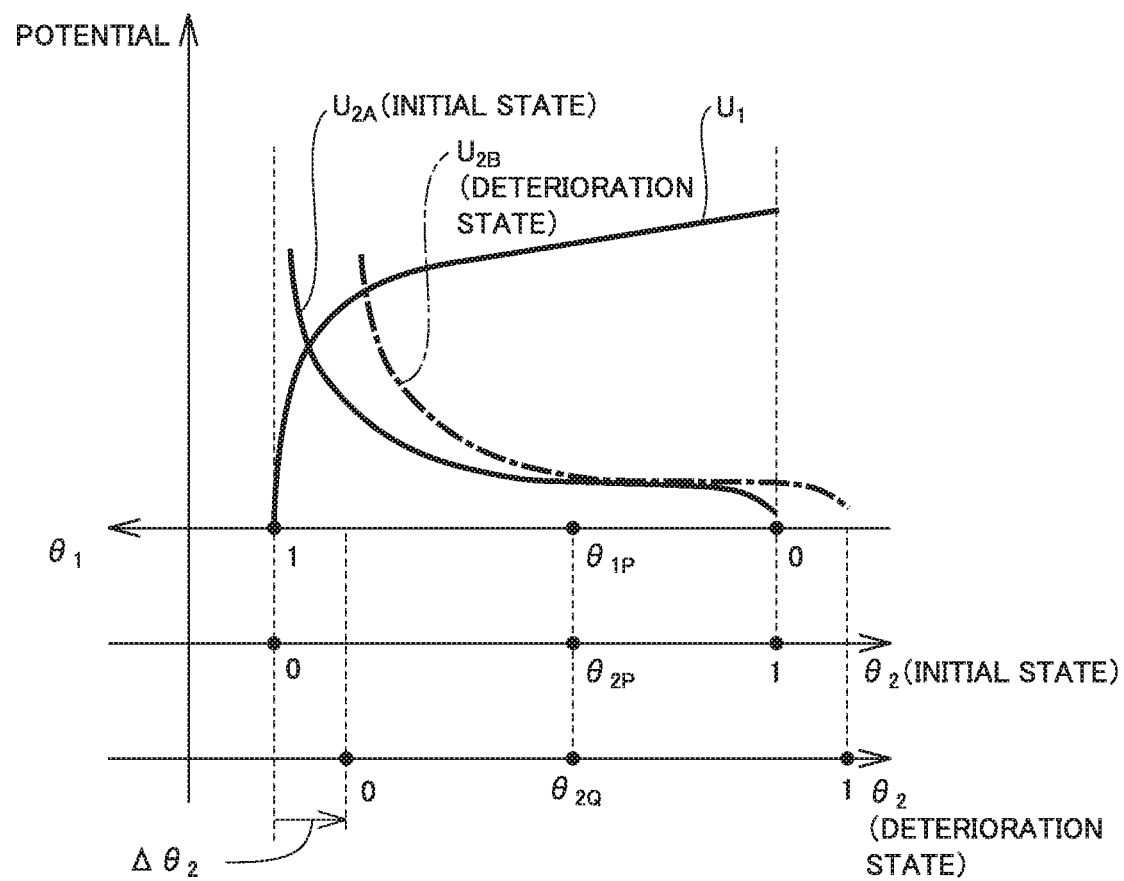
FIG. 10 is a diagram for explaining the composition correspondence deviation between the cathode and anode.

FIG. 10 is a diagram for explaining the composition correspondence deviation between the cathode and anode. In FIG. 10, the vertical axis represents the potential. The horizontal axes represent lithium amount $\theta_1$ of cathode particle 1, lithium amount $\theta_2$ of anode particle 2 in the initial state, and lithium amount $\theta_2$ of anode particle 2 after deterioration, in this order from the top.

When battery 4 deteriorates, the horizontal axis representing lithium amount $\theta_2$ of anode particle 2 shifts by $\Delta\theta_2$ in the rightward direction in the drawing (in the direction in which lithium amount $\theta_1$ of cathode particle 1 decreases), as compared to the initial state of battery 4. Then, the curve (denoted by $U_{2B}$) representing the relationship between lithium amount $\theta_2$ and anode open circuit potential $U_2$ of anode particle 2 after deterioration also shifts by $\Delta\theta_2$ in the rightward direction in the drawing, as compared to the curve (denoted by $U_{2A}$) representing the relationship between lithium amount $\theta_2$ and anode open circuit potential $U_2$ of anode particle 2 in the initial state. As a result, although lithium amount $\theta_2$ of anode particle 2 corresponding to lithium amount $\theta_1 = \theta_{1P}$ of cathode particle 1 satisfies $\theta_2 = \theta_{2P}$ when battery 4 is in the initial state, the lithium amount $\theta_2$ satisfies $\theta_2 = \theta_{2Q}$ after battery 4 has deteriorated. Even when the deterioration of battery 4 causes the composition correspondence deviation between the cathode and anode, the horizontal axis representing lithium amount $\theta_1$ of cathode particle 1 does not shift.

Deviation amount $\Delta Q_s$ refers to the capacity change amount corresponding to the shift amount $\Delta\theta_2$ of lithium amount $\theta_2$ of anode particle 2. After deterioration of battery 4, anode capacity $Q_{2B}$ at the time when lithium amount $\theta_2$ of anode particle 2 is 1 is ($Q_{2A} - \Delta Q_2$) (see the above-described equation (5)). Between these parameters, the proportional relationship expressed by the following equation (6) is satisfied.

$$\Delta\theta_2 : 1 = \Delta Q_s : (Q_{2A} - \Delta Q_2) \tag{6}$$

With equations (5) and (6) being solved as simultaneous equations for deviation amount $\Delta Q_s$, the following equation (7) is obtained.

$$\Delta Q_s = k_2 \times Q_{2A} \times \Delta\theta_2 \tag{7}$$

Next, how to express lithium amount $\theta_2 = \theta_{2Q}$ of anode particle 2 after deterioration of battery 4 is described. When battery 4 in the deterioration state is charged and lithium ion is emitted from cathode particle 1, then lithium amount $\theta_1$ of cathode particle 1 decreases from 1. When lithium amount $\theta_1$ decreases from 1 to $\theta_{1P}$, the amount of decrease in lithium amount $\theta_1$ is $(1-\theta_{1P})$. The cathode capacity of battery 4 in the deterioration state is expressed by $(k_1 \times Q_{1B})$. Accordingly, the amount of lithium emitted from cathode particle 1 is expressed by $(1-\theta_{1P}) \times k_1 \times Q_{1B}$. On the other hand, the anode capacity of battery 4 in the deterioration state is expressed by $(k_2 \times Q_{2B})$. Thus, if all the lithium emitted from cathode particle 1 is taken into anode particle 2 (that is, if the composition correspondence deviation does not arise between the cathode and anode), lithium amount $\theta_2 = \theta_{2P}$ of anode particle 2 is expressed by the following equation (8).

$$\theta_{2P} = \frac{(1-\theta_{1P}) \times k_1 \times Q_{1A}}{k_2 \times Q_{2A}} \tag{8}$$

When there is a composition correspondence deviation between the cathode and anode, lithium amount $\theta_2 = \theta_{2Q}$ of anode particle 2 after deterioration is expressed by the following equation (9) by shifting equation (8) by $\Delta\theta_2$.

$$\theta_{2Q} = \frac{(1-\theta_{1P}) \times k_1 \times Q_{1A}}{k_2 \times Q_{2A}} - \Delta\theta_2 \tag{9}$$

Shift amount $\Delta\theta_2$ can be expressed by the above-described equation (7) using deviation amount $\Delta Q_s$. Thus, lithium amount $\theta_2 = \theta_{2Q}$ of anode particle 2 after deterioration can be expressed by the following equation (10), based on equations (7) and (9).

$$\theta_{2Q} = \frac{(1-\theta_{1P}) \times k_1 \times Q_{1A} - \Delta Q_s}{k_2 \times Q_{2A}} \tag{10}$$

<Specification of Anode Open Circuit Potential>

Cathode capacity $Q_{1A}$ and anode capacity $Q_{2B}$ in the initial state may be calculated in advance from the theoretical capacity and the prepared amount of the active material. Thus, according to equation (10), when the three deterioration parameters (cathode capacity maintenance ratio $k_1$, anode capacity maintenance ratio $k_2$, and deviation amount $\Delta Q_s$) are specified, lithium amount $\theta_2 = \theta_{2Q}$ of anode particle 2 corresponding to lithium amount $\theta_1 = \theta_{1P}$ of cathode particle 1 can be uniquely specified. Deterioration of battery 4 does not change the relationship between lithium amount $\theta_2$ and anode open circuit potential $U_2$ of anode particle 2 (the shape of the curve indicating anode open circuit potential $U_2$). Accordingly, when the positional relationship between lithium amount $\theta_1$ and lithium amount $\theta_2$ in the deterioration state is specified, then anode open circuit potential $U_2$ is also specified. Specifically, the curve of anode open circuit potential $U_2$ may be drawn within the range between 1 and 0 of lithium amount $\theta_2$ in the deterioration state.

As is described in detail later, in embodiment 1, anode open circuit potential $U_2$ in the deterioration state is calculated with the three deterioration parameters being set to certain values. Also, anode open circuit potential $U_2$ is measured by another technique. Anode open circuit potential $U_2$ calculated from the three deterioration parameters is compared with the measured anode open circuit potential $U_2$. Convergence operation is performed by changing the three deterioration parameters until the both become substantially equal to each other. Then, the deterioration parameters upon completion of the convergence operation may be employed as parameters representing the deterioration state of battery 4.

<Surface Stress of Anode Active Material>

FIG. 8 to FIG. 10 describe a concept of three deterioration parameters with an example common system (e.g., carbon) where anode open circuit potential $U_2$ is indicated by one curve. However, as described in FIG. 3, if a silicon material (Si or SiO) is used as the anode active material, charging and discharging of battery 4 exhibits hysteresis. The influence of the hysteresis may also appear in calculating the parameters of deterioration due to the decrease in single-electrode capacity and the composition correspondence deviation.

Figure 11:
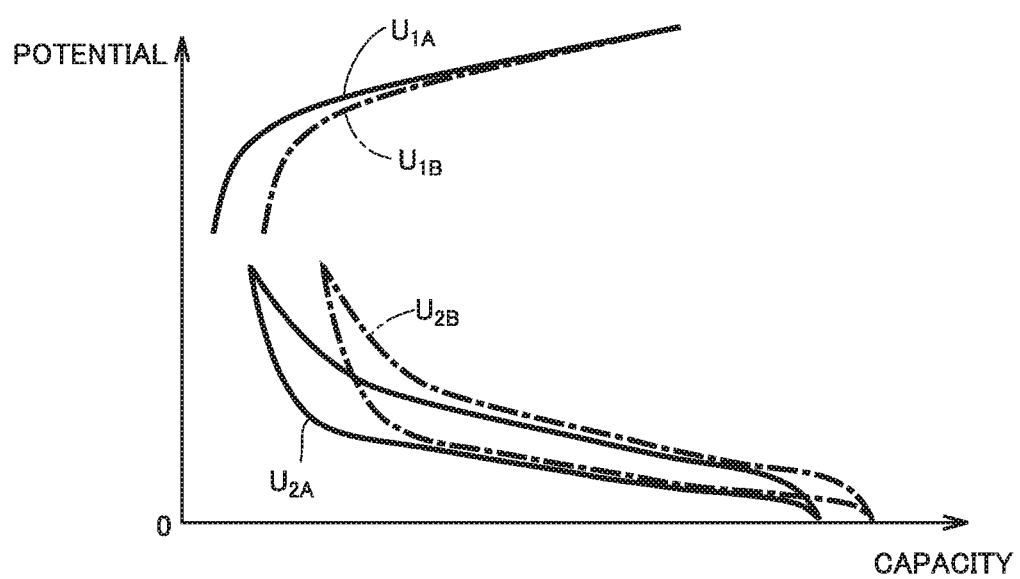
FIG. 11 is a diagram schematically showing the influence of hysteresis on the decrease in single-electrode potential and on the composition correspondence deviation.
Figure 23:
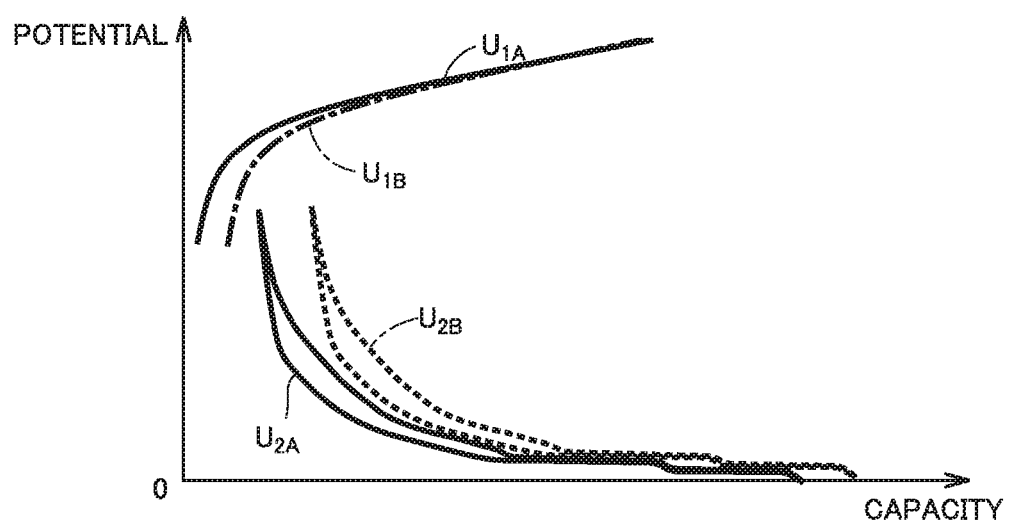
FIG. 23 is a diagram schematically showing the influence of hysteresis on the decrease in single-electrode potential and on the composition correspondence deviation in a composite anode.
Figure 24:
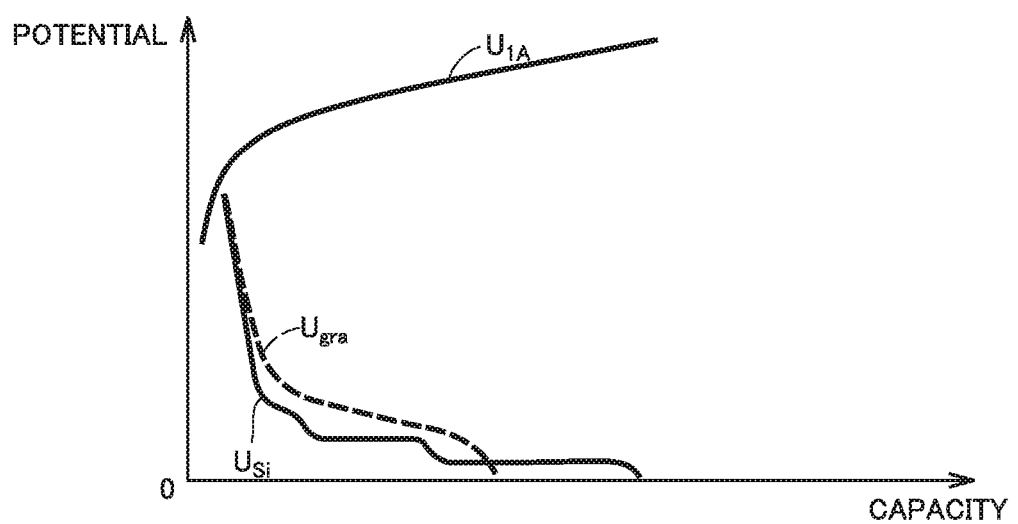
FIG. 24 is a diagram schematically showing the relationship between the capacity and the potential of each constituent of a composite anode.

FIG. 11 is a diagram schematically showing the influence of hysteresis on the decrease in single-electrode potential and on the composition correspondence deviation. The vertical axis in FIG. 11 and in later-described FIG. 23 and FIG. 24 represents the potential, and the horizontal axis represents the capacity (cathode capacity or anode capacity). As shown in FIG. 11, anode open circuit potential $U_2$ is influenced by the decrease in single-electrode capacity and the composition correspondence deviation, and is also influenced by the hysteresis in charging and discharging. Accordingly, in embodiment 1, when the deterioration state of battery 4 is estimated based on the above-described three deterioration parameters, anode open circuit potential $U_2$ is calculated by taking into consideration the influence of the hysteresis.

A conceivable cause of hysteresis is a volume change of the anode active material (anode particle 2) associated with charging and discharging. The anode active material expands when lithium is intercalated, and contracts when lithium is deintercalated. Such a volume change of the anode active material causes a stress on the surface of and inside of the anode active material, and the stress remains on the anode surface even when the lithium concentration is relaxed in the anode active material. The stress remaining on the anode surface is conceivably a stress in the state in which various forces are in balance in the entire system, the forces including a stress generated inside the anode active material, and a reaction force acting on the anode active material from a peripheral member (such as a binder and a conductive agent) around the anode active material generated by a volume change of the anode active material. This stress is hereinafter referred to as a "surface stress $\sigma_{surf}$".

With the intercalation and deintercalation of lithium, silicon material is larger in volume change amount than graphite. Specifically, if the minimum volume with no lithium intercalation is used as a reference, the volume change amount (expansion coefficient) of graphite associated with the lithium intercalation is about 1.1 times, whereas the volume change amount of silicon material is about four times at the maximum. Accordingly, surface stress $\sigma_{surf}$ is larger when the anode active material is a silicon material than when the anode active material is not a silicon material (when the anode active material is graphite).

Surface stress $\sigma_{surf}$ can be measured (estimated) through thin film evaluation. One example of a technique for measuring surface stress $\sigma_{surf}$ is briefly described. First, a change in curvature κ of a thin film anode deformed by surface stress $\sigma_{surf}$ is measured. Curvature κ can be optically measured using, for example, a commercially available curvature radius measurement system. Then, the measured curvature κ and the constants (e.g., the Young's modulus, the Poisson's ratio, and the thickness) which are determined depending on the material and shape of the anode (the anode active material and the peripheral member) are substituted into Stoney's equation to calculate surface stress $\sigma_{surf}$ (for details of the stress measurement, see "In Situ Measurements of Stress-Potential Coupling in Lithiated Silicon", V. A. Sethuraman et al., Journal of The Electrochemical Society, 157 (11) A1253-A1261 (2010)", for example).

Figure 12:
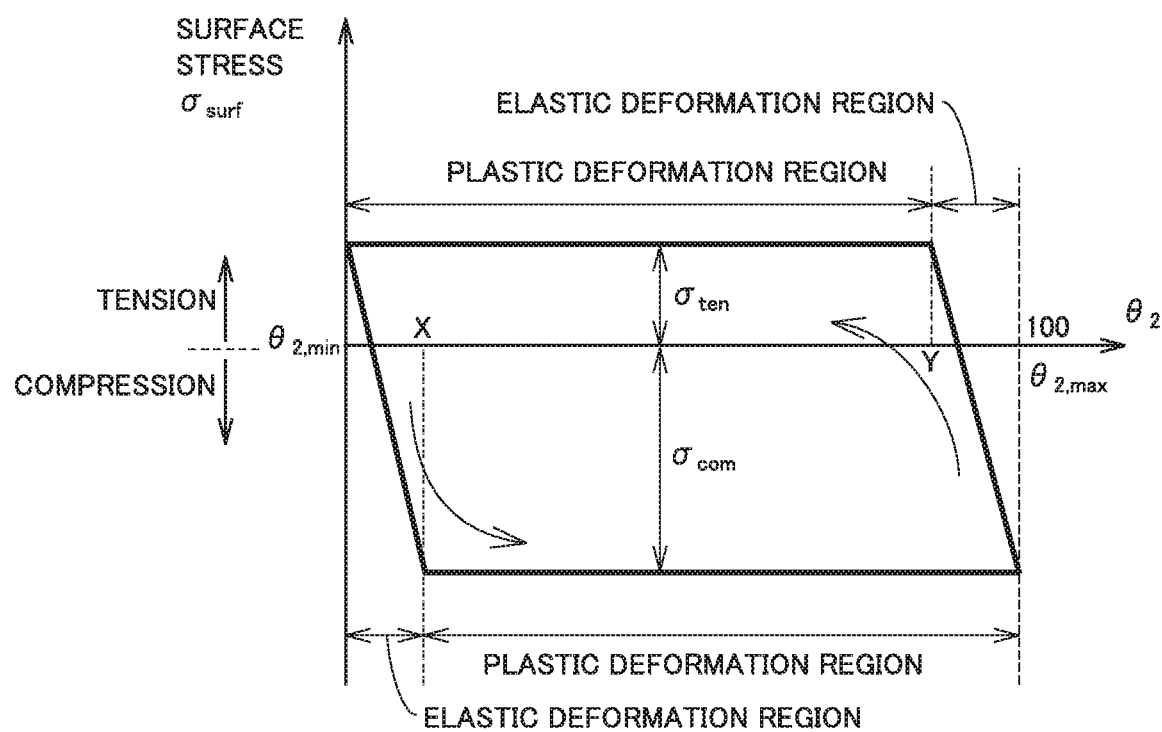
FIG. 12 is a diagram schematically showing one example of the change in surface stress associated with charging and discharging of a battery.

FIG. 12 is a diagram schematically showing one example of the change in surface stress $\sigma_{surf}$ associated with charging and discharging of battery 4. In FIG. 12, the horizontal axis represents lithium amount $\theta_2$ in the anode active material, and the vertical axis represents surface stress $\sigma_{surf}$.

FIG. 12 schematically shows one example of the change in surface stress $\sigma_{surf}$ at the time when battery 4 is charged from the state in which lithium amount $\theta_2$ is the minimum $\theta_{2,\,min}$ (e.g., $\theta_{2,\,min}=0$) to the state in which lithium amount $\theta_2$ is the maximum $\theta_{2,\,max}$ (e.g., $\theta_{2,\,max}=1$), and then battery 4 is discharged from the state of $\theta_{2,\,max}$ to the state of $\theta_{2,\,min}$. As to surface stress $\sigma_{surf}$, a tensile stress $\sigma_{ten}$ generated at the time of contraction of the anode active material (at the time of discharging from battery 4) is expressed in the positive direction, and a compressive stress $\sigma_{com}$ generated at the time of expansion of the anode active material (at the time of charging of battery 4) is expressed in the negative direction.

Immediately after a start of charging from the state in which the lithium amount is $\theta_{2,\,min}$, the magnitude of surface stress $\sigma_{surf}$ linearly changes. In the region of lithium amount $\theta_2$ during this charging (the region of $\theta_{2,\,min} \leq \theta_2 \leq X$), the anode active material surface is conceivably undergoing elastic deformation. In the subsequent region (the region of $X < \theta_2 \leq \theta_{2,\,max}$), the magnitude of surface stress $\sigma_{surf}$ is substantially constant. At this time, the anode active material surface has conceivably exceeded the limit of elastic deformation and reached plastic deformation. On the other hand, at the time of discharging from battery 4, in the region immediately after a start of discharging from the state in which lithium amount is $\theta_{2,\,max}$ (the region of $Y \leq \theta_2 \leq \theta_{2,\,max}$), the anode active material surface is conceivably undergoing elastic deformation; and in the subsequent region (the region of $\theta_{2,\,min} \leq \theta_2 < Y$), the anode active material surface is conceivably undergoing plastic deformation.

Although FIG. 12 shows all the changes in surface stress $\sigma_{surf}$ by straight lines, this is a mere schematic representation of the changes in surface stress $\sigma_{surf}$. Actually, a non-linear change in surface stress $\sigma_{surf}$ occurs in the plastic region after the yield (the region of lithium amount $\theta_2$ where plastic deformation occurs) (see, for example, FIG. 2 in "In Situ Measurements of Stress-Potential Coupling in Lithiated Silicon", V. A. Sethuraman et al., Journal of The Electrochemical Society, 157 (11) A1253-A1261 (2010)". The periphery of the parallelogram schematically shown in FIG. 12 corresponds to the periphery of the region enclosed by the SOC-OCV curve (intermediate region A) shown in FIG. 3.

<Functional Block of ΔOCP Calculation Process>

In embodiment 1, before estimating the deterioration state of battery 4, open circuit potential change amount ΔOCP associated with hysteresis is calculated. This process is referred to as an "ΔOCP calculation process".

Figure 13:
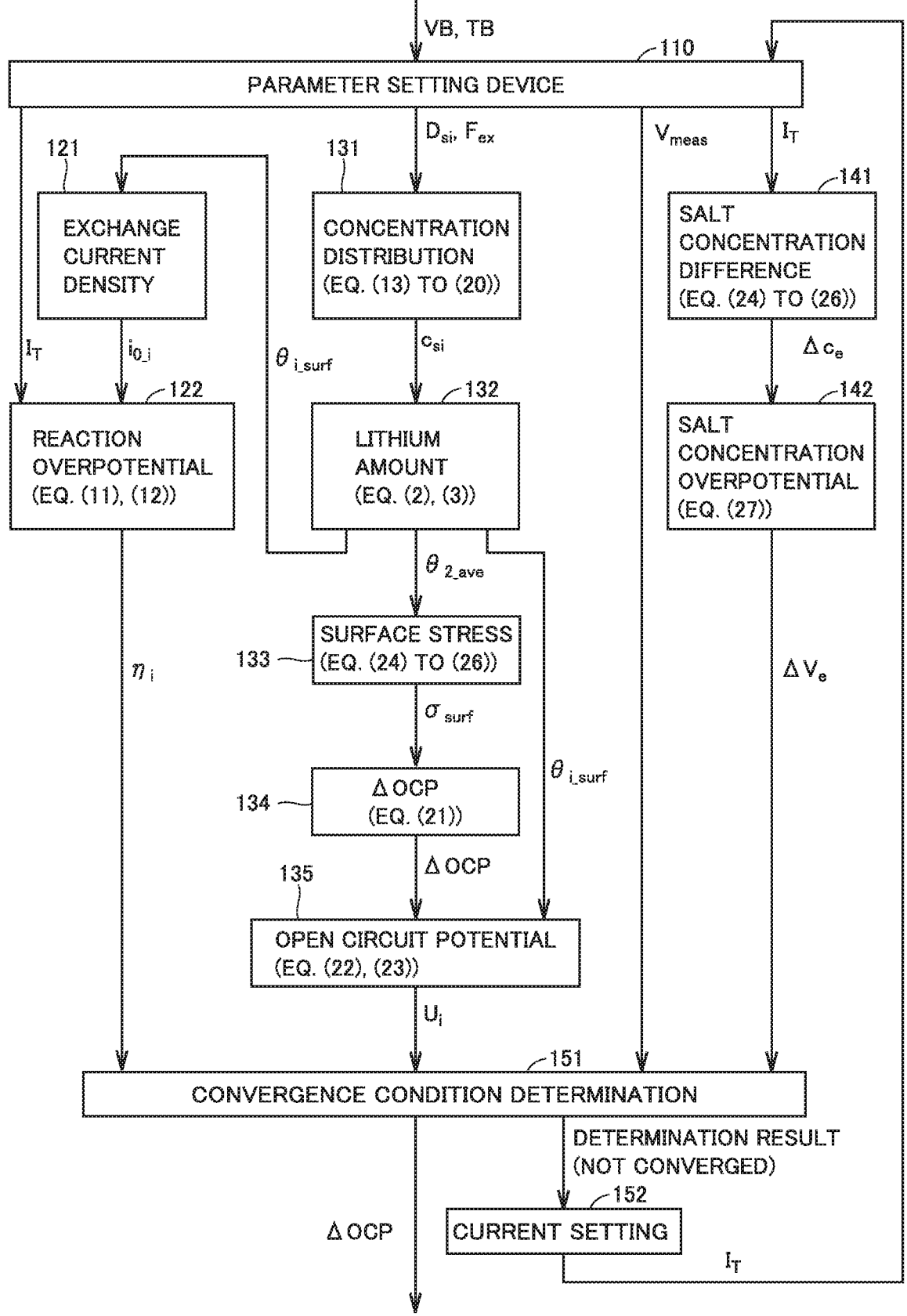
FIG. 13 is a functional block diagram of an ECU related to a ΔOCP calculation process in embodiment 1.

FIG. 13 is a functional block diagram of ECU 100 related to a ΔOCP calculation process in embodiment 1. With reference to FIG. 13, ECU 100 includes a parameter setting device 110, an exchange current density calculating device 121, a reaction overpotential calculating device 122, a concentration distribution calculating device 131, a lithium amount calculating device 132, a surface stress calculating device 133, a ΔOCP calculating device 134, an open circuit potential calculating device 135, a salt concentration difference calculating device 141, a salt concentration overpotential calculating device 142, a convergence condition determining device 151, and a current setting device 152.

Parameter setting device 110 outputs parameters to be used for operation by other functional blocks. Specifically, parameter setting device 110 receives voltage VB of battery 4 from voltage sensor 71, and receives temperature TB of a battery module (not shown) from temperature sensor 73. Parameter setting device 110 sets voltage VB as a measured voltage $V_{meas}$ of battery 4, and converts temperature TB into an absolute temperature T (unit: Kelvin). Measured voltage $V_{meas}$ and absolute temperature T (or temperature TB) are outputted to other functional blocks. Since absolute temperature T is outputted from many functional blocks, arrows indicating transmission of absolute temperature T are not shown for the sake of brevity.

Additionally, parameter setting device 110 outputs diffusion coefficients $D_{s1}$, $D_{s2}$ to concentration distribution calculating device 131. In some embodiments, diffusion coefficients $D_{s1}$, $D_{s2}$ are set to different values (which may be average lithium amounts or surface lithium amounts) depending on local lithium amounts $\theta_1$, $\theta_2$.

As is described in detail later, in an operation process using an iteration method to be executed by convergence condition determining device 151 and current setting device 152, total current $I_T$ is used as a variably set parameter. Parameter setting device 110 receives total current $I_T$ set by current setting device 152 at the time of the previous operation, and outputs this current to another functional block as a parameter to be used at the time of the present operation.

Exchange current density calculating device 121 receives absolute temperature T from parameter setting device 110, and receives surface lithium amount $\theta_{1\_surf}$ of cathode particle 1 and surface lithium amount $\theta_{2\_surf}$ of anode particle 2 from lithium amount calculating device 132. Exchange current density calculating device 121 calculates an exchange current density $i_{0\_1}$ of cathode particle 1 and an exchange current density $i_{0\_2}$ of anode particle 2 based on parameters received from another functional block.

More specifically, exchange current density $i_{0\_1}$ is a current density at the time when the anode current density corresponding to the oxidation reaction at cathode particle 1 is equal to the cathode current density corresponding to the reduction reaction at cathode particle 1. Exchange current density $i_{0\_1}$ has characteristics that depend on surface lithium amount $\theta_{1\_surf}$ of cathode particle 1 and absolute temperature T. Accordingly, by preparing a map (not shown) that defines the correspondence relationship between exchange current density $i_{0\_1}$, surface lithium amount $\theta_{1\_surf}$, and absolute temperature T in advance, exchange current density $i_{0\_1}$ can be calculated from surface lithium amount $\theta_{1\_surf}$ (described later) calculated by lithium amount calculating device 132 and absolute temperature T. The same applies to exchange current density $i_{0\_2}$ of anode particle 2, and thus the explanation thereof is not repeated.

Reaction overpotential calculating device 122 receives absolute temperature T from parameter setting device 110, and receives total current $I_T$ from parameter setting device 110. Reaction overpotential calculating device 122 also receives exchange current densities $i_{0\_1}$, $i_{0\_2}$ from exchange current density calculating device 121. Reaction overpotential calculating device 122 calculates a reaction overpotential (cathode overpotential) $\eta_1$ of cathode particle 1 and a reaction overpotential (anode overpotential) $\eta_2$ of anode particle 2 in accordance with the following equations (11) and (12), respectively, derived from the Butler-Volmer equation. The reaction overpotential, which is also referred to as an activation overpotential, is an overpotential related to a charge transfer reaction (a reaction with intercalation or deintercalation of lithium). Each of the calculated reaction overpotentials $\eta_1$, $\eta_2$ is outputted to convergence condition determining device 151.

$$\eta_1 = \frac{2RT}{\beta_1 F} \sinh^{-1}\left(\frac{-\beta_1 I_T}{2L_1 a_{s1} i_{0\_1}(\theta_1, T)}\right) \quad (11)$$

$$\eta_2 = \frac{2RT}{\beta_2 F} \sinh^{-1}\left(\frac{\beta_2 I_T}{2L_2 a_{s2} i_{0\_2}(\theta_2, T)}\right) \quad (12)$$

Concentration distribution calculating device 131 receives lithium diffusion coefficient $D_{s1}$ at cathode particle 1 from parameter setting device 110. Concentration distribution calculating device 131 calculates the lithium concentration distribution inside cathode particle 1 by solving the following equation (13) in a time-evolution manner, the equation (13) being a diffusion equation in a polar coordinate system that treats the cathode active material (cathode particle 1) as a sphere. Since the change amount of the lithium concentration on the surface (position $r_1=R_1$) of cathode particle 1 is proportional to total current $I_T$, the boundary condition of diffusion equation (13) is set by equation (14).

$$\frac{\partial c_{s1}(r_1)}{\partial t} = \frac{1}{r_1^2}\frac{\partial}{\partial r_1}\left(r_1^2 D_{s1}(\theta_1)\frac{\partial c_{s1}(r_1)}{\partial r_1}\right) \quad (13)$$

$$-D_{s1}\frac{\partial c_{s1}}{\partial r_1}\bigg|_{r_1=R_1} = \frac{I_T}{L_1 a_{s1} F} \quad (14)$$

On the other hand, the diffusion equation in the polar coordinate system for anode particle 2 is expressed by the following equation (15). Equation (15) is different from the diffusion equation for cathode particle 1 (equation (13)) in that equation (15) includes, in the second term on the right side, a diffusion term for considering the diffusion of lithium in anode particle 2 caused by surface stress $\sigma_{surf}$.

$$\frac{\partial c_{s2}(r)}{\partial t} = \nabla \cdot D_{s2}\left(\nabla c_{s2}(r) - \frac{\Omega c_{s2}(r)}{RT}\nabla \sigma_h(r)\right) \quad (15)$$

More specifically, the diffusion term derived from surface stress $\sigma_{surf}$ is expressed by the following equation (16) using a hydrostatic stress $\sigma_h(r)$ of anode particle 2 in the electrolytic solution. In equation (16), the Young's modulus and the Poisson's ratio of anode particle 2 within the elastic limit are respectively denoted by E and v, on the assumption that the anode active material (anode particle 2) does not plastically deform. The sum total stress which anode particle 2 receives from the peripheral member is denoted by $F_{ex}$.

$$\sigma_h(r) = \frac{2\Omega E}{9(1-v)}(c_{s2\_ave} - c_{s2}(r)) + F_{ex} \quad (16)$$

When equation (16) expressing hydrostatic stress $\sigma_h(r)$ is substituted into the above-described diffusion equation (15), equation (15) is transformed as follows (see the following equation (17)).

$$\frac{\partial c_{s2}}{\partial t} = \nabla \cdot D_{s2}\left[\nabla c_{s2}(r) - \frac{\Omega c_{s2}(r)}{RT}\nabla\left(\frac{2\Omega E}{9(1-v)}(c_{s2\_ave} - c_{s2}(r)) + F_{ex}\right)\right] \quad (17)$$

$$= \nabla \cdot D_{s2}\left(1 + \frac{2\Omega^2 E c_{s2}(r)}{9RT(1-v)}\right)\nabla c_{s2}(r)$$

Equation (17) is transformed into the following equation (19) using an effective diffusion coefficient $D_{s2}^{eff}$ defined by the following equation (18). Equation (19) shows that, since effective diffusion coefficient $D_{s2}^{eff}$ is a positive value, surface stress $\sigma_{surf}$ acts in the direction promoting the diffusion of lithium in anode particle 2. Equation (19) also shows that the influence of surface stress $\sigma_{surf}$ is determined depending on lithium concentration $c_{s2}$ at each point (each lattice point for which the diffusion equation is calculated) in anode particle 2.

$$D_{s2}^{eff} = D_{s2}\left(1 + \frac{2\Omega^2 E c_{s2}(r)}{9RT(1-v)}\right) \quad (18)$$

$$\frac{\partial c_{s2}(r)}{\partial t} = \nabla \cdot D_{s2}^{eff} \nabla c_{s2}(r) \quad (19)$$

The boundary condition of the diffusion equation of the above-described equation (19) is different from the boundary condition for cathode particle 1 (see equation (14)) in that equation (19) further includes a term that depends on hydrostatic stress $\sigma_h(r)$ as expressed by the following equation (20).

$$-D_{s2}\left(\nabla c_{s2}(r) - \frac{\Omega c_{s2}(r)}{RT}\nabla \sigma_h(r)\right)\bigg|_{r=surf} = -\frac{I_T}{L_2 a_{s2} F} \quad (20)$$

Thus, concentration distribution calculating device 131 separately calculates the lithium concentration distribution inside each of the two particles (cathode particle 1 and anode particle 2). Each calculated lithium concentration distribution is outputted to lithium amount calculating device 132.

Lithium amount calculating device 132 receives the lithium concentration distribution ($c_{s1}$, $c_{s2}$) inside each of the two particles from concentration distribution calculating device 131, and calculates various lithium amounts to output them to other functional blocks.

Specifically, lithium amount calculating device 132 calculates surface lithium amount $\theta_{1\_surf}$ of cathode particle 1 based on lithium concentration distribution $c_{s1}$ of cathode particle 1 (see the above-described equation (2)). Similarly, lithium amount calculating device 132 calculates surface lithium amount $\theta_{2\_surf}$ of anode particle 2 based on the lithium concentration distribution in anode particle 2. The calculated surface lithium amount $\theta_{2\_surf}$ is outputted to open circuit potential calculating device 135.

Lithium amount calculating device 132 calculates an average lithium amount $\theta_{1\_ave}$ based on lithium concentration distribution $c_{s1}$ of cathode particle 1, in accordance with the above-described equation (3). Similarly, lithium amount calculating device 132 calculates an average lithium amount $\theta_{2\_ave}$ of anode particle 2 based on lithium concentration distribution $c_{s\_Si}$ of anode particle 2. The calculated average lithium amounts $\theta_{1\_ave}$, $\theta_{2\_ave}$ are outputted to surface stress calculating device 133.

Surface stress calculating device 133 calculates surface stress $\sigma_{surf}$ based on average lithium amount $\theta_{2\_ave}$ from lithium amount calculating device 132. A technique for calculating surface stress $\sigma_{surf}$ will be described in detail later. The calculated surface stress $\sigma_{surf}$ is outputted to ΔOCP calculating device 134.

ΔOCP calculating device 134 calculates open circuit potential change amount ΔOCP associated with hysteresis, based on surface stress $\sigma_{surf}$ from surface stress calculating device 133. Open circuit potential change amount ΔOCP can also be defined as a change amount of the open circuit potential of anode particle 2 caused by surface stress $\sigma_{surf}$. Where the state in which surface stress $\sigma_{surf}$ is not generated is referred to as an "ideal state", and the open circuit potential of anode particle 2 in the ideal state is referred to as an "ideal open circuit potential $U_{2\_sta}$", open circuit potential change amount ΔOCP can also be reworded as a deviation amount in open circuit potential of anode particle 2 caused by surface stress $\sigma_{surf}$ with ideal open circuit potential $U_{2\_sta}$ as a reference. Open circuit potential change amount ΔOCP is calculated from surface stress $\sigma_{surf}$ in accordance with the following, equation (21), using a volume change amount Ω of a silicon compound (Si or SiO) per mole of lithium and using the Faraday constant F. The calculated open circuit potential change amount ΔOCP is outputted to open circuit potential calculating device 135.

$$\Delta OCP = \frac{\sigma_{surf}\Omega}{F} \quad (21)$$

Open circuit potential calculating device 135 calculates the open circuit potential (cathode open circuit potential) $U_1$ of cathode particle 1 based on surface lithium amount $\theta_{1\_surf}$ of cathode particle 1 from lithium amount calculating device 132. More specifically, cathode particle 1 is virtually divided into N regions in its radial direction, and open circuit potential $U_1$ of cathode particle 1 is determined depending on local lithium amount $\theta_{1N}$ (surface lithium amount $\theta_{1\_surf}$) on the surface (i.e., the outermost region N) of cathode particle 1 (see the following equation (22)). Accordingly, open circuit potential $U_1$ can be calculated from surface lithium amount $\theta_{1\_surf}$ by creating, through an advance experiment, a map (not shown) that defines the correspondence relationship between open circuit potential $U_1$ and surface lithium amount $\theta_{1\_surf}$.

$$U_1 = U_1(\theta_{1\_surf}) \quad (22)$$

On the other hand, when the open circuit potential (anode open circuit potential) $U_2$ of anode particle 2 is calculated, the influence of surface stress $\sigma_{surf}$ is taken into consideration. Open circuit potential $U_2$ is calculated by adding open circuit potential change amount ΔOCP to the open circuit potential (ideal open circuit potential) $U_{2\_sta}$ of anode particle 2 in the state in which surface stress $\sigma_{surf}$ is not generated (ideal state), as expressed by the following equation (23). Open circuit potentials $U_1$, $U_2$ calculated in accordance with equations (22) and (23), respectively, are outputted to convergence condition determining device 151.

$$U_2 = U_{2\_sta}(\theta_{2\_surf}=0) + \Delta OCP \quad (23)$$

Charging and discharging of battery 4 may cause a change in concentration $c_e$ of lithium ion in the electrolytic solution and thus cause a concentration gradient of lithium ion in the electrolytic solution. This may cause a salt concentration overpotential $\Delta V_e$ due to the concentration gradient of lithium ion between the cathode active material (cathode particle 1) and the anode active material (anode particle 2), thus possibly influencing cathode potential $V_1$ and anode potential $V_2$.

Salt concentration difference calculating device 141 calculates a concentration difference $\Delta c_e$ of lithium ion between the cathode active material and the anode active material. Concentration difference $\Delta c_e$ of lithium ion depends on a diffusion coefficient $D_e$ of the electrolytic solution, a volume fraction $\varepsilon_e$ of the electrolytic solution, a transport number $t_+^0$ of lithium ion, and a current (total current $I_T$). Thus, concentration difference $\Delta c_e$ can be calculated in accordance with the following equations (24) to (26), for example. Equation (17), a recurrence equation, is repeatedly solved every prescribed operation cycle, and equations (24) to (26) express the operation cycle by Δτ. A parameter with a superscript t (at the upper right) represents a parameter in the present operation, and a parameter with a superscript (t-Δτ) represents a parameter in the previous operation. The calculated concentration difference $\Delta c_e$ is outputted to salt concentration overpotential calculating device 142.

$$\Delta c_e^t = (1 - \alpha_e)\Delta c_e^{t-\Delta\tau} + \beta_e I_T \quad (24)$$

$$\alpha_e = \frac{2\varepsilon_e^{0.5}}{L\Delta x}D_e\Delta\tau \quad (25)$$

$$\beta_e = \frac{1-t_+^0}{D\varepsilon_e L}\Delta\tau \quad (26)$$

Salt concentration overpotential calculating device 142 calculates salt concentration overpotential $\Delta V_e$ from concentration difference $\Delta c_e$ of lithium ion calculated by salt concentration difference calculating device 141, in accordance with the following equation (27). The calculated salt concentration overpotential $\Delta V_e$ is outputted to convergence condition determining device 151.

$$\Delta V_e = \frac{4RT(t_+^0 - 1)}{Fc_{e\_ini}}\Delta c_e \quad (27)$$

Convergence condition determining device 151 and current setting device 152 execute an operation process using an iteration method for calculating various potential components of battery 4. The present embodiment uses the Newton's method, which is one of the typical iteration methods. However, the type of iteration method is not limited to this, but a solution for another non-linear equation may be used, such as a bisection method or a secant method.

The operation by each of the above-described functional blocks uses total current $I_T$ set by current setting device 152 at the time of the previous operation. Convergence condition determining device 151 receives, from other functional blocks, the calculation results of various potential components based on total current $I_T$. More specifically, convergence condition determining device 151 receives reaction overpotentials $\eta_1$, $\eta_2$ from reaction overpotential calculating device 122 (see equations (11) and (12)), receives open circuit potentials $U_1$, $U_2$ from open circuit potential calculating device 135 (see equations (23) and (24)), receives measured voltage $V_{meas}$ (the measured value of voltage of battery 4) from parameter setting device 110, and receives salt concentration overpotential $\Delta V_e$ from salt concentration overpotential calculating device 142 (see equation (20)). Although not shown, convergence condition determining device 151 receives a direct current resistance $R_d$ from parameter setting device 110 (the details of which will be described later).

Convergence condition determining device 151 calculates the voltage of battery 4 from cathode potential $V_1$, anode potential $V_2$, the amount of voltage drop $(=I_T R_d)$ due to direct current resistance $R_d$, and salt concentration overpotential $\Delta V_e$, in accordance with the following relational expression (28) satisfied between the voltage and the current. The calculated voltage is referred to as a "calculated voltage $V_{calc}$" distinguished from measured voltage $V_{meas}$ (the measured value from voltage sensor 71).

$$V_1 - V_2 - I_T R_d - \Delta V_e = V_{calc} \quad (28)$$

Cathode potential $V_1$ in equation (28) is calculated by the following equation (29). Anode potential $V_2$ is calculated by the following equation (30).

$$U_1 + \eta_1 = V_1 \quad (29)$$

$$U_2 + \eta_2 = V_2 \quad (30)$$

Then, convergence condition determining device 151 determines whether or not the convergence condition for the iteration method is satisfied, by comparing calculated voltage $V_{cacl}$ and measured voltage $V_{meas}$. Specifically, convergence condition determining device 151 determines whether or not calculated voltage $V_{calc}$ and measured voltage $V_{meas}$ are substantially equal to each other (whether or not the error between these voltages is less than a prescribed value PS). When the error between calculated voltage $V_{calc}$ and measured voltage $V_{meas}$ $(=|V_{calc}-V_{meas}|)$ is equal or more than prescribed value PS, convergence condition determining device 151 outputs, to current setting device 152, the determination result indicating that the convergence condition for the iteration method is not satisfied.

When current setting device 152 receives the determination result indicating that the convergence condition is not satisfied from convergence condition determining device 151, current setting device 152 updates total current $I_T$ to a value to be used at the time of the next operation. More specifically, current setting device 152 uses the algorithm of the Newton's method to set total current $I_T$ to be used at the time of the next operation, based on total currents $I_T$ used at the time of the previous operation and the present operation. Total current $I_T$ thus updated is outputted to parameter setting device 110 to be used at the time of the next operation.

Thus, convergence condition determining device 151 and current setting device 152 iteratively perform the operation process until the error between calculated voltage $V_{calc}$ and measured voltage $V_{meas}$ becomes less than prescribed value PS. When the above-described error becomes less than prescribed value PS, convergence condition determining device 151 determines that the iterative operation process has converged, and outputs, to the subsequent-stage process, the parameters (cathode open circuit potential $U_1$, anode open circuit potential $U_2$, and open circuit potential change, amount ΔOCP) necessary for estimating the deterioration state of battery 4.

<Calculation of Surface Stress>

Next, a technique for calculating surface stress $\sigma_{surf}$ of the silicon active material is described in detail. In the following, a "state P" denotes a state plotted on a characteristic diagram showing the relationship between the lithium amount in silicon material and the silicon open circuit potential, as a combination $(\theta_{Si}, U_{Si})$ of lithium amount $\theta_{Si}$ in silicon material (e.g., average lithium amount $\theta_{Si\_ave}$) and silicon open circuit potential $U_{Si}$. In particular, state P at the time of $m^{th}$ (m is a natural number) operation is denoted by "P(m)". In the present embodiment, surface stress $\sigma_{surf}$ is calculated by focusing on a transition of state P.

Figure 14A:
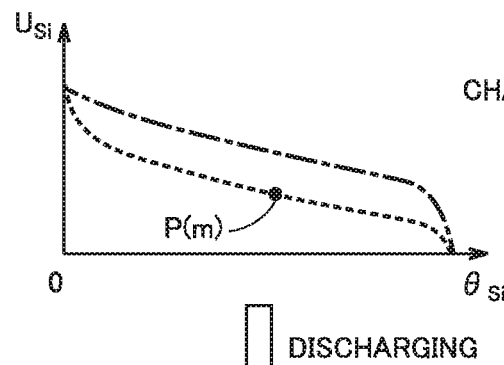
FIG. 14A is a conceptual diagram for explaining the transition of the state of a battery, on a characteristic diagram showing the relationship between the silicon anode surface lithium amount and the silicon anode open circuit potential, in which the battery is charged and state P(m) is plotted on a charging curve.

FIGS. 14A to 14E are conceptual diagrams for explaining the transition of state P on a characteristic diagram showing the relationship between the silicon anode lithium amount and the silicon anode open circuit potential. FIG. 14A shows an example in which battery 4 is charged and state P(m) is plotted on the charging curve (indicated by the broken line).

Figure 14B:
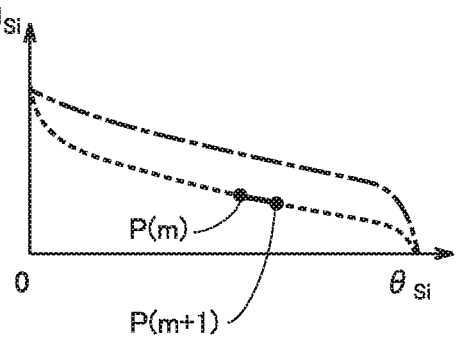
FIG. 14B is a conceptual diagram for explaining the transition of the state of a battery, on a characteristic diagram showing the relationship between the silicon anode surface lithium amount and the silicon anode open circuit potential, in which, when charging is continued from state P(m), state P(m+1) in the $(m+1)^{th}$ operation cycle is maintained on the charging curve.

When charging is continued from state P(m), state P(m+1) in the (m+1)$^{th}$ operation cycle is maintained on the charging curve as shown in FIG. 14B.

Figure 14C:
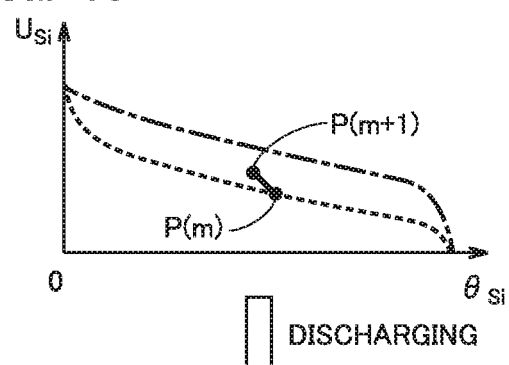
FIG. 14C is a conceptual diagram for explaining the transition of the state of a battery, on a characteristic diagram showing the relationship between the silicon anode surface lithium amount and the silicon anode open circuit potential, in which, when the battery is discharged from state P(m), state P(m+1) in the (m+1)$^{th}$ operation cycle deviates from the charging curve.
Figure 14D:
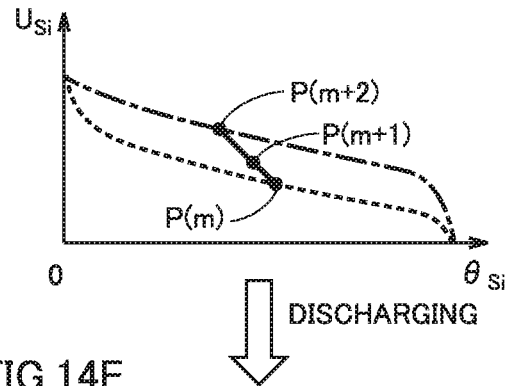
FIG. 14D is a conceptual diagram for explaining the transition of the state of a battery, on a characteristic diagram showing the relationship between the silicon anode surface lithium amount and the silicon anode open circuit potential, in which, when discharging is continued, state P(m+2) in the (m+2)$^{th}$ operation cycle reaches the discharging curve.
Figure 14E:
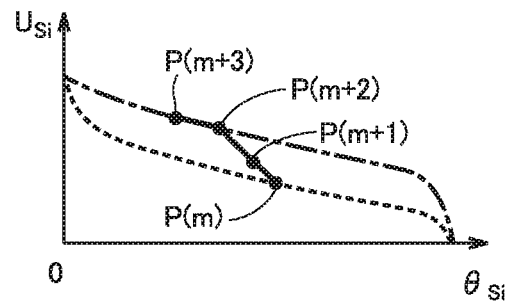
FIG. 14E is a conceptual diagram for explaining the transition of the state of a battery, on a characteristic diagram showing the relationship between the silicon anode surface lithium amount and the silicon anode open circuit potential, in which, when discharging is further continued thereafter, state P(m+3) is maintained on the discharging curve.

On the other hand, when battery 4 is discharged from state P(m) shown in FIG. 14A, state P(m+1) in the (m+1)$^{th}$ operation cycle deviates from the charging curve, and is plotted within the region between the charging curve and the discharging curve (indicated by the dot-and-dash line), as shown in FIG. 14C. When discharging is continued, state P(m+2) in the (m+2)$^{th}$ operation cycle reaches the discharging curve, for example (see FIG. 14D). When the discharging is further continued thereafter, state P(m+3) is maintained on the discharging curve (see FIG. 14E).

Figure 15:
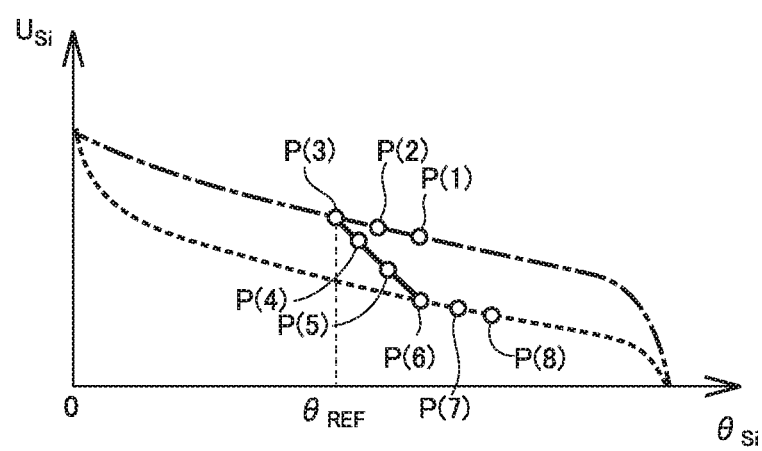
FIG. 15 is a diagram for explaining a technique for calculating the surface stress of silicon active material.

FIG. 15 is a diagram for explaining a technique for calculating surface stress $\sigma_{surf}$ of silicon active material. FIG. 15 shows an example in which charging and discharging are performed from state P(1) to state P(8) in this order.

More specifically, first, battery 4 is discharged from state P(1) on the discharging curve, and the discharging is continued until state P(3). States P(2) and P(3) during this time are maintained on the discharging curve. Then, at state P(3), switching is made from discharging to charging. From the start of charging, states P(4), P(5) transition within the region between the charging curve and the discharging curve. After that, state P(6) is plotted on the charging curve. While the charging is further continued, state P is maintained on the charging curve (see states P(7), P(8)).

At states P(1) to P(3) plotted on the discharging curve, surface stress $\sigma_{surf}$ shows occurrence of yield in the plastic deformation region (see FIG. 4) and is equal to tensile yield stress $\sigma_{ten}$, as expressed by the following equation (31).

$$\sigma_{surf} = \sigma_{ten} \qquad (31)$$

On the other hand, at states P(6) to P(8) on the charging curve, surface stress $\sigma_{surf}$ shows occurrence of yield at compressive yield stress $\sigma_{com}$ (see the following equation (32)).

$$\sigma_{surf} = \sigma_{com} \qquad (32)$$

On the other hand, when state P is plotted neither on the charging curve nor on the discharging curve, that is, when state P is plotted within the region (intermediate region A) between the charging curve and the discharging curve (see states P(4), P(5)), the problem is how to calculate surface stress $\sigma_{surf}$. In the present embodiment, the calculation of surface stress $\sigma_{surf}$ within this region uses an average lithium concentration $c_{Si\_ave}$ in anode particle 2 of elemental silicon and surface stress $\sigma_{surf}$ at the time of switching between charging and discharging. In the following, average lithium concentration $c_{Si\_ave}$ at state P at the time of switching between charging and discharging is referred to as a "reference lithium concentration $c_{REF}$", and surface stress $\sigma_{surf}$ at this state P is referred to as a "reference surface stress (REF".

In the example shown in FIG. 15, state P at the time of switching between charging and discharging is state P(3), when switching is made from discharging to charging. When states P(4), P(5) are calculated, average lithium concentration $c_{Si\_ave}$ at the point of time of state P(3) has already been calculated by the above-described equations (8) to (10). Therefore, average lithium concentration $c_{Si\_ave}$ at state P(3) that has already been calculated is used as reference lithium concentration $c_{REF}$. Reference surface stress $\sigma_{REF}$ at state P(3) is tensile yield stress $\sigma_{ten}$ (see the above-described equation (31)).

At state P within intermediate region A, a linear relationship expressed by equation (33) exists between lithium concentration difference ($c_{Si\_ave} - c_{REF}$) obtained by subtracting reference lithium concentration $c_{REF}$ from average lithium concentration $c_{Si\_ave}$, and surface stress $\sigma_{surf}$.

$$\sigma_{surf} = -\alpha_c(c_{s2\_ave} - c_{REF}) + \sigma_{REF} \qquad (33)$$

This linear relationship indicates that, where state P at the time of switching between charging and discharging is set as a reference; the change amount of surface stress $\sigma_{surf}$ is proportional to the change amount of the lithium content in anode particle 2 of elemental silicon (the amount of lithium intercalation into anode particle 2, or the amount of lithium deintercalation from anode particle 2).

Proportionality constant $\alpha_c$ is a parameter determined depending on the mechanical characteristics of the anode active material (silicon compound) and the peripheral member, and can be obtained by experiment. More specifically, proportionality constant $\alpha_c$ may vary depending on the temperature of the anode active material (≈temperature TB) and the lithium content in the anode active material (in other words, average lithium concentration $c_{Si\_ave}$). Accordingly, proportionality constant $\alpha_c$ is obtained for each of various combinations of temperatures TB and average lithium concentrations $c_{Si\_ave}$, and a map (or relational expression) that defines the correlation between temperature TB, average lithium concentration $c_{Si\_ave}$, and proportionality constant $\alpha_c$ is prepared. A map showing the correlation between only one of temperature TB and average lithium concentration $c_{Si\_ave}$, and proportionality constant $\alpha_c$ may be prepared.

A map showing the correlation between temperature TB of battery 4 and average lithium concentration $c_{s2\_ave}$, and proportionality constant $\alpha_c$ (or proportionality constant $\alpha_\theta$) is prepared and stored in memory 100B of ECU 100 in advance. Thus, by referring to the map, proportionality constant $\alpha_c$ can be calculated from temperature TB (the measured value from temperature sensor 73) and average lithium concentration $c_{s2\_ave}$ (the estimated value at the time of the previous operation). Further, by substituting proportionality constant $\alpha_c$, average lithium concentration $c_{s2\_ave}$, reference lithium concentration $c_{REF}$, and reference surface stress $\sigma_{REF}$ into the above-described equation (33), surface stress $\sigma_{surf}$ within the above-described region can be calculated. The flow of calculating surface stress $\sigma_{surf}$ will be described in detail in FIG. 19.

Since the lithium concentration and the lithium amount are interchangeable as expressed by the above-described equation (2), the above-described equation (33) may be transformed into the following equation (34) using average lithium amount $\theta_{Si\_ave}$ of anode particle 2 of elemental silicon.

$$\sigma_{surf} = -\alpha_\theta(\theta_{2\_ave} - \theta_{REF}) + \sigma_{REF} \qquad (34)$$

<Process Flow>

Figure 16:
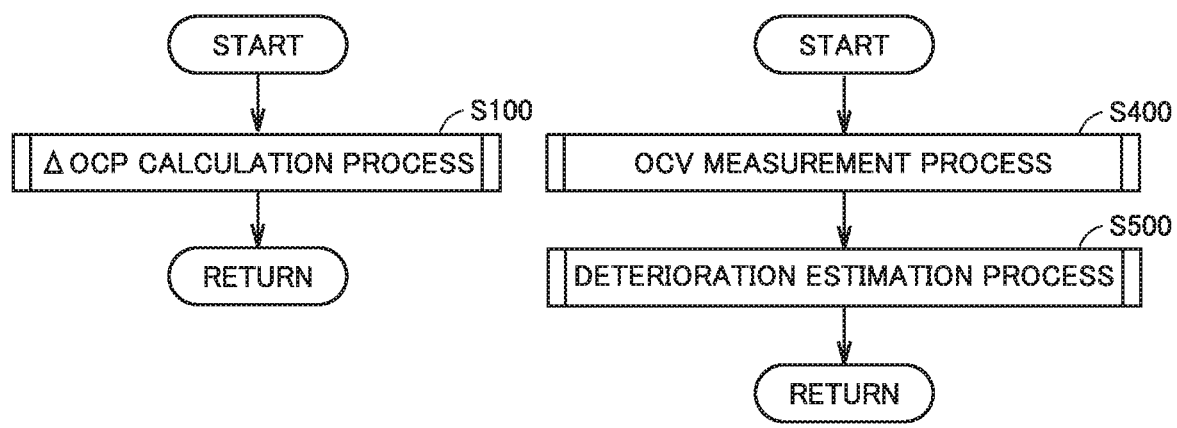
FIG. 16 is a flowchart for explaining the flow of the entire process executed in embodiment 1.

FIG. 16 is a flowchart for explaining the flow of the entire process executed in embodiment 1. This flowchart is invoked from a main routine (not shown) each time a prescribed cycle has elapsed, and is repeatedly executed by ECU 100, for example. The steps (hereinafter abbreviated to "S") included in the flowchart are basically implemented by software processing by ECU 100. The steps, however, may be implemented by dedicated hardware (electric circuit) provided in ECU 100.

As shown in FIG. 16, ECU 100 executes a ΔOCP calculation process for calculating the ΔOCP (S100). ECU 100 also executes an OCV measurement process (S400) and subsequently a deterioration estimation process, in parallel with the ΔOCP calculation process (S500).

<ΔOCP Calculation Process>

Figure 17:
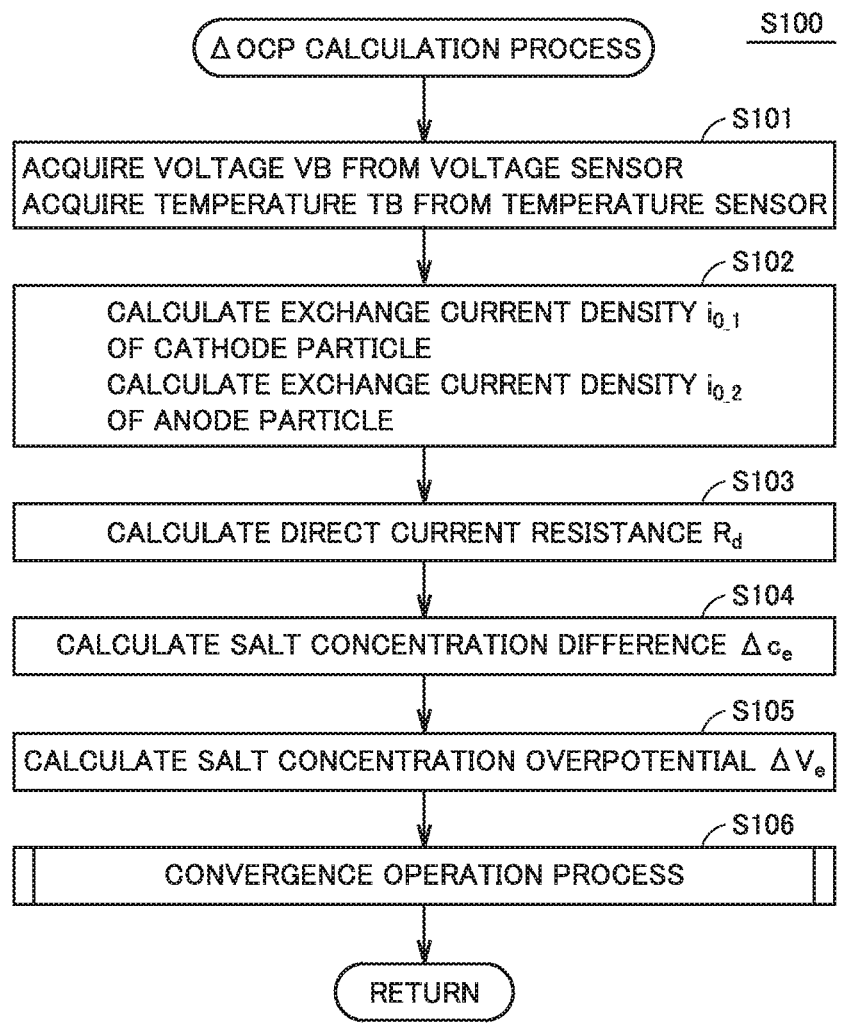
FIG. 17 is a flowchart showing a ΔOCP calculation process in embodiment 1.

FIG. 17 is a flowchart showing a ΔOCP calculation process in embodiment 1. With reference to FIG. 17, first, at S101, ECU 100 acquires voltage VB of battery 4 from voltage sensor 71 and acquires temperature TB of battery 4 from temperature sensor 73. This voltage VB is used as measured voltage $V_{meas}$, and temperature TB is converted into absolute temperature T. Absolute temperature T may be calculated from temperature TB at the present time (at the time of the present operation), or may be calculated from a weighted average of temperature TB within the most recent predetermined period of time (e.g., 30 minutes).

At S102, ECU 100 calculates exchange current density $i_{0\_1}$ of cathode particle 1. As described with reference to FIG. 13, exchange current density $i_{0\_1}$ depends on surface lithium amount $\theta_{1\_surf}$ of cathode particle 1 and absolute temperature T. Thus, ECU 100 calculates exchange current density $i_{0\_1}$ from surface lithium amount $\theta_{1\_surf}$ calculated at the time of the previous operation (see S203 in FIG. 18) and absolute temperature T, by referring to a map (not shown) that defines the correspondence relationship between exchange current density $i_{0\_1}$, surface lithium amount $\theta_{1\_surf}$, and absolute temperature T. Similarly, as to exchange current density $i_{0\_2}$ of anode particle 2, ECU 100 performs calculation by referring to a map (not shown) for anode particle 2.

At S103, ECU 100 calculates direct current resistance $R_d$ of battery 4. Direct current resistance $R_d$ is a resistance component at the time when the lithium ion and electron move between the cathode active material and the anode active material. Direct current resistance $R_d$ has a characteristic that varies depending on absolute temperature T. Accordingly, direct current resistance $R_d$ can be calculated from absolute temperature T by preparing in advance a map (not shown) that defines the correspondence relationship between direct current resistance $R_d$ and absolute temperature T based on the measurement result of direct current resistance $R_d$ for each temperature.

At S104, ECU 100 calculates concentration difference $\Delta c_e$ of lithium ion between the cathode active material and the anode active material in the electrolytic solution (see the above-described equations (24) to (26)). Further, ECU 100 calculates salt concentration overpotential $\Delta V_e$ from concentration difference $\Delta c_e$ of lithium ion in accordance with the above-described equation (27) (S105). Since these processes have been described in detail with reference to FIG. 13, the explanation is not repeated.

At S106, ECU 100 executes a convergence operation process for determining total current $I_T$ flowing through cathode particle 1 and anode particle 2.

Figure 18:
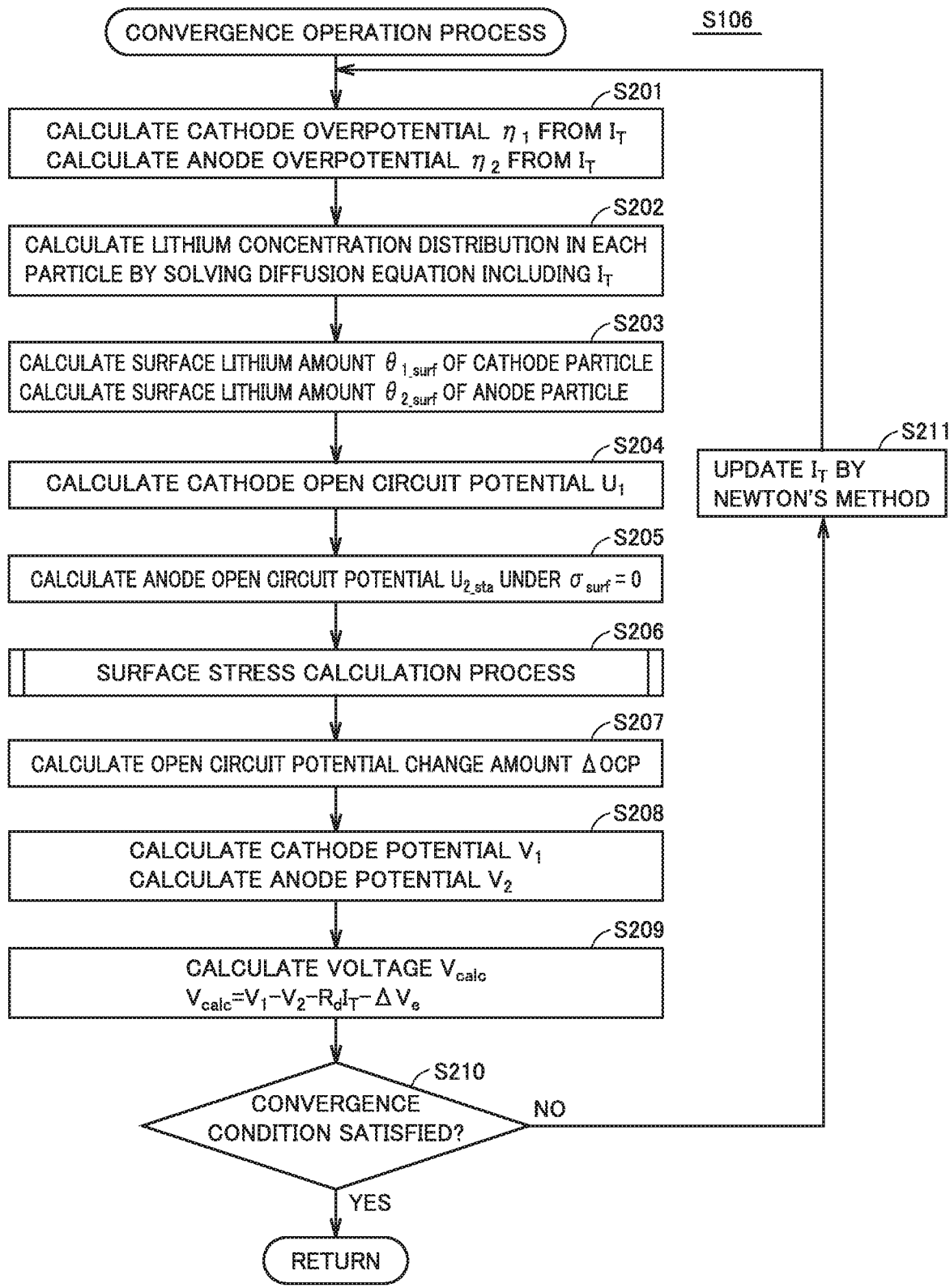
FIG. 18 is a flowchart showing a convergence operation process.

FIG. 18 is a flowchart showing a convergence operation process (the process at S106 in FIG. 17). With reference to FIG. 18, at S201, ECU 100 calculates reaction overpotential $\eta_1$ of cathode particle 1 from exchange current density $i_{0\_1}$ of cathode particle 1 and absolute temperature T, in accordance with the above-described equation (11). Also, ECU 100 calculates reaction overpotential $\eta_2$ of anode particle 2 from exchange current density $i_{0\_2}$ of anode particle 2 and absolute temperature T, in accordance with the above-described equation (12).

At S202, as to cathode particle 1, ECU 100 substitutes lithium diffusion coefficient $D_{s1}$ of cathode particle 1 into the above-described diffusion equation (13). ECU 100 solves this equation (13) under the boundary condition determined depending on total current $I_T$ (see the above-described equation (14)), thereby calculating the lithium concentration distribution inside cathode particle 1. Diffusion coefficient $D_{s1}$ depends on lithium amount $\theta_1$ of cathode particle 1 and absolute temperature T. Accordingly, using a map (not shown) prepared in advance, diffusion coefficient $D_{s1}$ can be calculated from lithium amount $\theta_1$ at the time of the previous operation and absolute temperature T.

Further, ECU 100 solves diffusion equation (19) with substituted effective diffusion coefficient $D_{s2}^{eff}$ (see the above-described equation (18)) under the boundary condition (see the above-described equation (20)), thereby calculating the lithium concentration distribution inside anode particle 2.

At S203, ECU 100 calculates surface lithium amount $\theta_{1\_surf}$ of cathode particle 1 based on the lithium concentration distribution inside cathode particle 1 calculated at S202 (see the above-described equation (22)). Similarly, ECU 100 calculates surface lithium amount $\theta_{2\_surf}$ of anode particle 2.

At S204, ECU 100 refers to a map (not shown) that defines the correspondence relationship between open circuit potential $U_1$ and lithium amount $\theta_1$ of cathode particle 1, thus calculating open circuit potential $U_1$ from surface lithium amount $\theta_{1\_surf}$ calculated at S203 (see equation (22)).

At S205, ECU 100 refers to a map (not shown) that defines the correspondence relationship between open circuit potential $U_2$ and lithium amount $\theta_2$ of anode particle 2 in the ideal state (where surface stress $\sigma_{surf}=0$ is satisfied), thus calculating anode open circuit potential $U_{2\_sta}$ in the ideal state from surface lithium amount $\theta_{2\_surf}$.

At S206, ECU 100 executes a "surface stress calculation process" for calculating surface stress $\sigma_{surf}$.

Figure 19:
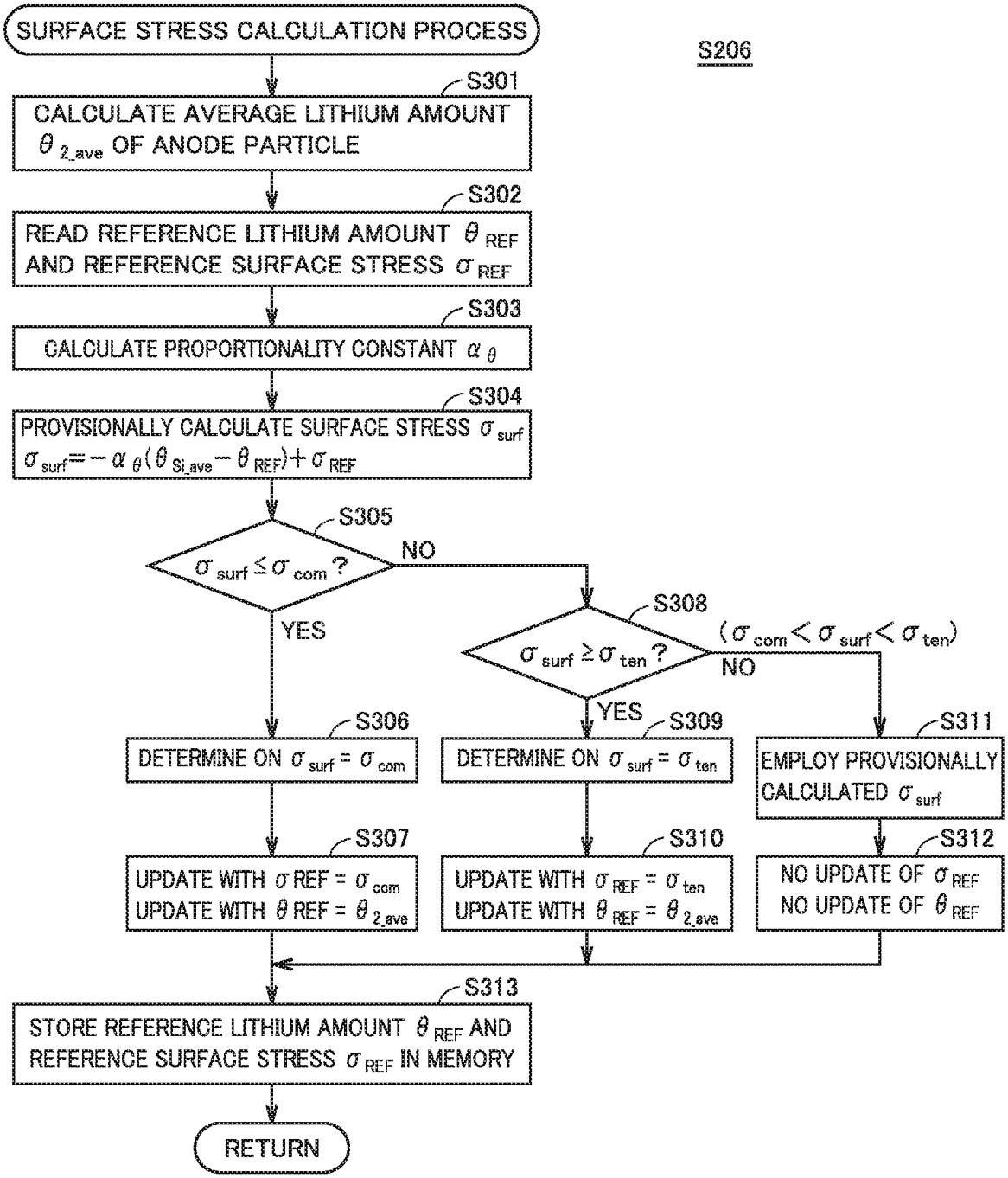
FIG. 19 is a flowchart showing a surface stress calculation process.

FIG. 19 is a flowchart showing a surface stress calculation process (the process at S206 in FIG. 18). With reference to FIG. 19, at S301, ECU 100 calculates average lithium amount $\theta_{Si\_ave}$ of anode particle 2 of elemental silicon. Average lithium amount $\theta_{Si\_ave}$ is calculated by calculating local lithium amounts $\theta_{Sik}$ from lithium concentrations $c_{Sik}$ for all the regions k (k=1 to N), and obtaining a weighted average of the calculated local lithium amounts $\theta_{Sik}$ (see the above-described equation (3) for cathode particle 1).

At S302, ECU 100 reads reference lithium amount $\theta_{REF}$ and reference surface stress $\sigma_{REF}$ stored in memory 100B by the time of the previous operation (see the process at S313 described later).

At S303, ECU 100 calculates proportionality constant $\alpha_\theta$ from temperature TB of battery 4 and the SOC (the SOC at the time of the previous operation), by referring to a map (not shown). Proportionality constant $\alpha_\theta$ may be calculated (predicted by simulation) from a physical property (e.g., Young's modulus) of the anode active material and the peripheral member. However, proportionality constant $\alpha_\theta$ does not necessarily have to be a variable value, but may be a predetermined fixed value.

At S304, ECU 100 calculates surface stress $\sigma_{surf}$ from proportionality constant $\alpha_\theta$ and average lithium amount $\theta_{Si\_ave}$, in accordance with the above-described equation (34). This surface stress $\sigma_{surf}$ is a provisionally calculated value without taking into consideration the yield of the anode active material. Surface stress $\sigma_{surf}$ taking into consideration the yield of the anode active material is determined (finalized) by the subsequent processes.

At S305, ECU 100 compares surface stress $\sigma_{surf}$ provisionally calculated at S304 with compressive yield stress $\sigma_{com}$. When surface stress $\sigma_{surf}$ taking into consideration the sign of surface stress $\sigma_{surf}$ as shown in FIG. 12, is equal to or smaller than compressive yield stress $\sigma_{com}$, that is, when the magnitude of surface stress $\sigma_{surf}$ is equal or larger than the magnitude of compressive yield stress $\sigma_{com}$ (YES at S305), then ECU 100 determines that the anode active material has yielded and that surface stress $\sigma_{surf}$ is equal to compressive yield stress $\sigma_{com}$ ($\sigma_{surf}=\sigma_{com}$) (S306). That is, surface stress $\sigma_{surf}$ provisionally calculated at S304 is not employed but compressive yield stress $\sigma_{com}$ is employed instead. Then, ECU 100 updates reference surface stress $\sigma_{REF}$ by setting compressive yield stress $\sigma_{com}$ as a new reference surface stress $\sigma_{REF}$. Further, ECU 100 updates reference lithium amount $\theta_{REF}$ by setting average lithium amount $\theta_{Si\_ave}$ calculated at S301 as reference lithium amount $\theta_{REF}$ (S307).

On the other hand, when surface stress $\sigma_{surf}$ taking into consideration the sign is larger than compressive yield stress $\sigma_{com}$ (when the magnitude of surface stress $\sigma_{surf}$ is smaller than the magnitude of compressive yield stress $\sigma_{com}$) (NO at S305), ECU 100 advances the process to S308 to compare surface stress $\sigma_{surf}$ with tensile yield stress $\sigma_{ten}$.

When surface stress $\sigma_{surf}$ is equal or larger than tensile yield stress $\sigma_{ten}$ (YES at S308), ECU 100 determines that the anode active material has yielded and that surface stress $\sigma_{surf}$ is equal to tensile yield stress $\sigma_{ten}$ (S309). Then, ECU 100 updates reference surface stress $\sigma_{REF}$ with tensile yield stress $\sigma_{ten}$, and updates reference lithium amount $\theta_{REF}$ with average lithium amount $\theta_{Si\_ave}$ calculated at S301 (S310).

When surface stress $\sigma_{surf}$ is smaller than tensile yield stress $\sigma_{ten}$ at S308 (NO at S308), then surface stress $\sigma_{surf}$ is within intermediate region A between compressive yield stress $\sigma_{com}$ and tensile yield stress $\sigma_{ten}$ ($\sigma_{com} < \sigma_{surf} < \sigma_{ten}$), and the anode active material has not yielded. Accordingly, surface stress $\sigma_{surf}$ provisionally calculated at S304 is employed (S311). In this case, reference surface stress $\theta_{REF}$ is not updated, and reference surface stress $\sigma_{REF}$ which was set at the time of the previous operation (or at the time of operation before that) is maintained. Reference lithium amount $\theta_{REF}$ is not updated, either (S312).

When the process of any of S307, S310, and S312 is executed, reference lithium amount $\theta_{REF}$ and reference surface stress $\sigma_{REF}$ are stored in memory 100B (S313). After that, the process is returned to S207 in the convergence operation process (see FIG. 18).

Referring back to FIG. 18, at S207, ECU 100 calculates open circuit potential change amount ΔOCP from surface stress $\sigma_{surf}$ in accordance with the above-described equation (21), so as to take into consideration the influence of surface stress $\sigma_{surf}$ on open circuit potential $U_2$ of anode particle 2.

At S208, ECU 100 calculates, as cathode potential $V_1$, the sum of reaction overpotential $\eta_1$ and cathode open circuit potential $U_1$ of cathode particle 1 in accordance with the above-described equation (2). Also, ECU 100 calculates anode open circuit potential $U_2$ by adding open circuit potential change amount ΔOCP to ideal open circuit potential $U_{2\_sta}$ of anode particle 2 (see the above-described equation (23)), and further calculates, as anode potential $V_2$, the sum of reaction overpotential 112 and anode open circuit potential $U_2$ of anode particle 2 (see the above-described equation (30)).

At S209, ECU 100 calculates calculated voltage $V_{calc}$ from cathode potential $V_1$, anode potential $V_2$, the amount of voltage drop ($=I_T R_d$) due to direct current resistance $R_d$, and salt concentration overpotential $\Delta V_e$, in accordance with the above-described equation (28).

At S210, ECU 100 determines whether or not the condition under which the iterative operation converges (convergence condition) in the convergence operation process is satisfied. Specifically, the convergence condition is whether or not the absolute value ($=|V_{calc}-V_{meas}|$) of the difference between calculated voltage $V_{calc}$ calculated at S209 and measured voltage $V_{meas}$ acquired from voltage sensor 71 at S101 is less than prescribed value PS ($|V_{calc}-V_{meas}|<PS$). When convergence condition is not satisfied (NO at S210), ECU 100 updates total current $I_T$ in accordance with the algorithm of the Newton's method (S211), and returns the process to S201. Thus, a series of processes of S201 to S209 are executed again. When the convergence condition is satisfied (YES at S210), ECU 100 returns the process to the main routine (not shown).

<OCV Measurement Process>

Figure 20:
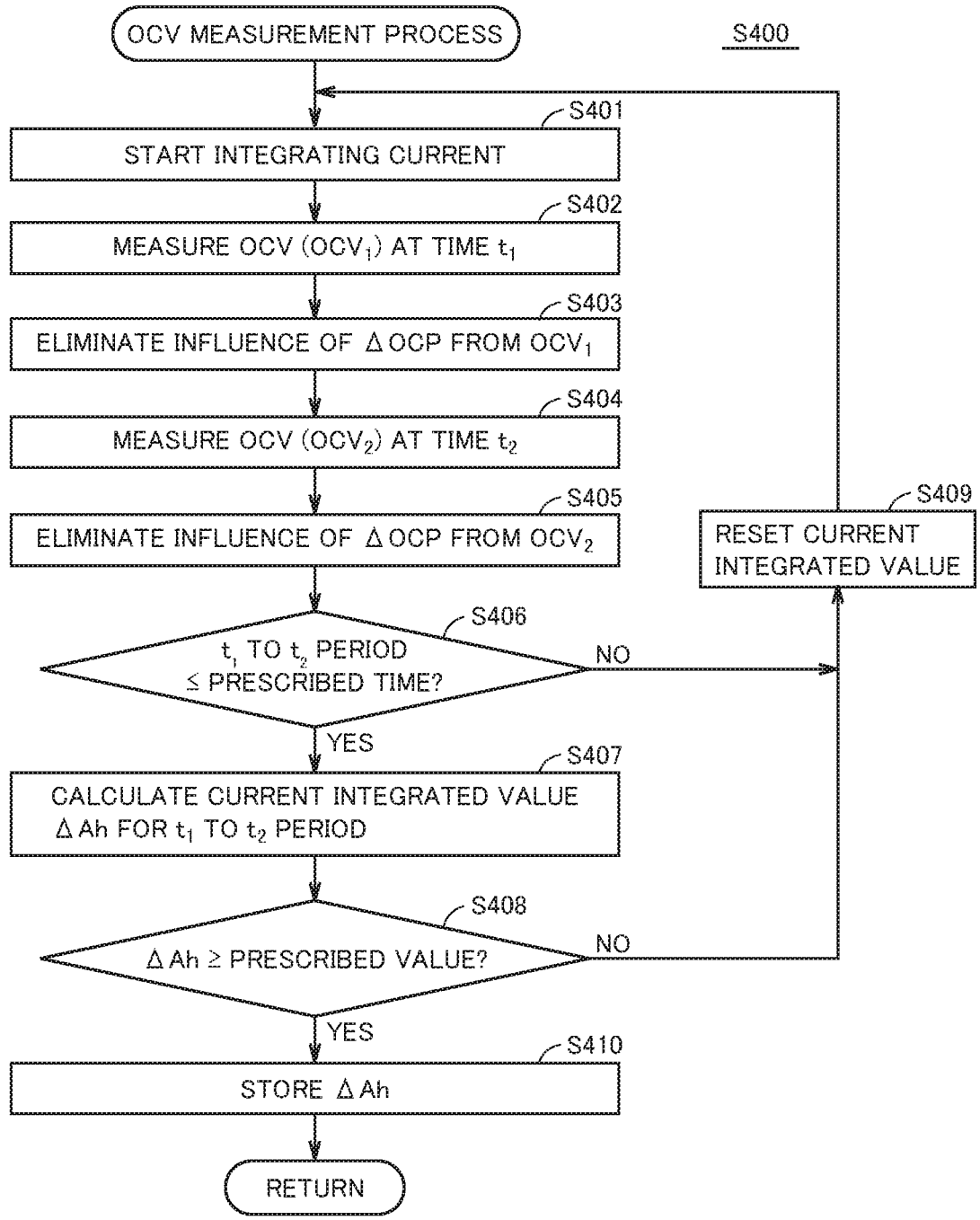
FIG. 20 is a flowchart showing an OCV measurement process.

FIG. 20 is a flowchart showing an OCV measurement process. With reference to FIG. 20, at S401, ECU 100 starts integrating the current flowing through battery 4. ECU 100 may start integrating the current while vehicle 9 is traveling. If vehicle 9 is configured to charge battery 4 with electric power supplied from the outside of vehicle 9 (so-called external charging), vehicle 9 may start integrating the current at the timing of starting the external charging, for example.

At a certain time $t_1$, ECU 100 measures the OCV of battery 4 (S402). More specifically, ECU 100 waits for a prescribed period of time after charging and discharging of battery 4 is stopped. After a lapse of the prescribed period of time, ECU 100 determines that the polarization in battery 4 has disappeared, and acquires the measured value of voltage VB of battery 4 at this time as the OCV of battery 4. The OCV thus acquired is referred to as "$OCV_1$". The $OCV_1$ is stored in memory 100B of ECU 100.

At S403, ECU 100 stores "$\Delta OCP_1$" in memory 100B. The "$\Delta OCP_1$" is open circuit potential change amount ΔOCP at time $t_1$ calculated by the ΔOCP calculation process. Further, at time $t_2$ later than time $t_1$, ECU 100 executes processes (S404 and S405) similar to the processes of S402 and S403.

At S406, ECU 100 determines whether or not the length of the period of time from time $t_1$ to time $t_2$ is equal to or shorter than prescribed time. When the length of the period of time from time $t_1$ to time $t_2$ is longer than the prescribed time (NO at S406), there may be an influence of accumulated error of current sensor 72. Accordingly, ECU 100 resets the integration of current started at S402 (S409), and returns the process to S401. Thus, the integration of current is started again.

On the other hand, when the length of the period of time from time $t_1$ to time $t_2$ is equal to or shorter than the prescribed time (YES at S406), an influence of accumulated error of current sensor 72 during the period of time is conceivably small enough. In this case, ECU 100 calculates a current integrated value ΔAh for the period of time from time $t_1$ to time $t_2$ (S407).

In some embodiments, in order to ensure the accuracy in estimation of the deterioration of battery 4 (described later), current integrated value ΔAh for a period of time between two acquisitions of the OCV is large to some extent. Accordingly, ECU 100 determines whether or not current integrated value ΔAh is equal or more than a prescribed value (S408). The prescribed value is a value that can ensure the accuracy in estimation of the deterioration of battery 4 and may be set in advance by experiment or simulation. When current integrated value ΔAh is less than the prescribed value (NO at S408), it is determined that the accuracy in estimation of the deterioration of battery 4 may not be ensured. Thus, the current integrated value is reset (S409), and the integration of current is started again. When current integrated value ΔAh is equal or more than the prescribed value (YES at S408), ECU 100 stores current integrated value ΔAh, calculated at S407, in memory 100B (S410).

<Deterioration Estimation Process>

Figure 21:
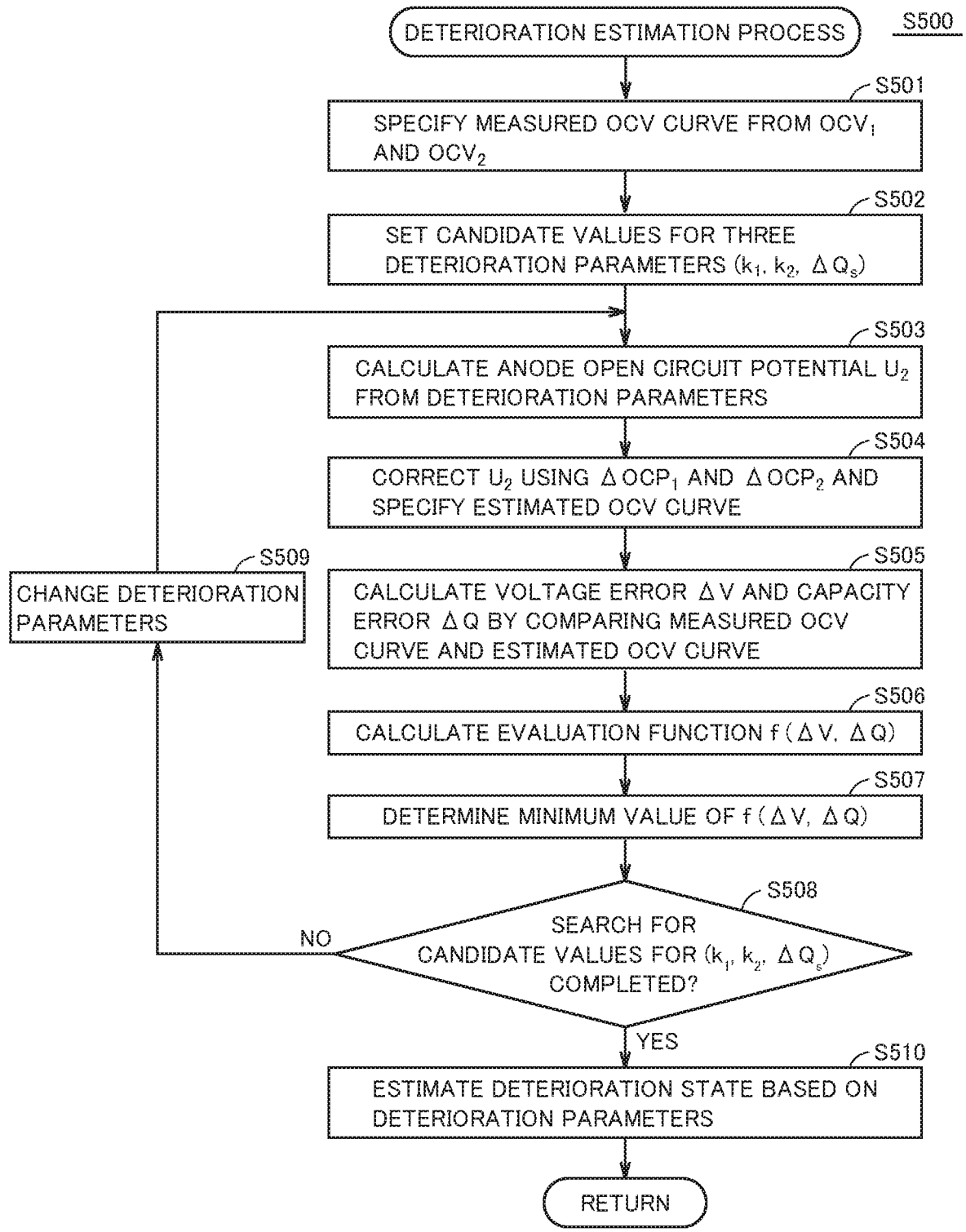
FIG. 21 is a flowchart showing a deterioration estimation process in embodiment 1.

FIG. 21 is a flowchart showing a deterioration estimation process in embodiment 1. With reference to FIG. 21, at S501, ECU 100 specifies an OCV curve from $OCV_1$ measured at S402 and $OCV_2$ measured at S404. Hereinafter, this OCV curve is also referred to as a "measured OCV curve". The typical shape of the OCV curve of battery 4 is known. Accordingly, if $OCV_1$ and $OCV_2$ deviate from the OCV curve having the typical shape, the OCV curve having the typical shape can be corrected in accordance with the degree of the deviation for specifying the measured OCV curve. However, the number of points of OCV measurement is not limited to two, but the measurement of OCV may be performed at more than two points for more accurate specification of the measured OCV curve. The measured OCV curve is equivalent to the "first OCV curve" according to the present disclosure.

At S502, ECU 100 sets candidate values for three deterioration parameters (cathode capacity maintenance ratio $k_1$, anode capacity maintenance ratio $k_2$, and deviation amount $\Delta Q_s$). The candidate values for deviation amount $\Delta Q_s$ can be set at step size of every prescribed value within a prescribed search range. Each of cathode capacity maintenance ratio $k_1$ and anode capacity maintenance ratio $k_2$ changes within a search range of between 0 and 1. Accordingly, 20 candidate values can be set at step size of every 0.05 for each of cathode capacity maintenance ratio $k_1$ and anode capacity maintenance ratio $k_2$, for example.

At S503, ECU 100 calculates anode open circuit potential $U_2$ based on the deterioration parameters set at S501 (for details, see Japanese Patent Laying-Open No. 2011-220917). This anode open circuit potential $U_2$ does not take into consideration the influence of open circuit potential change amount $\Delta OCP$.

At S504, ECU 100 corrects anode open circuit potential $U_2$ calculated at S504 using open circuit potential change amount $\Delta OCP$ ($\Delta OCP_1$ acquired at S403 and $\Delta OCP_2$ acquired at S405). Then, ECU 100 calculates the OCV of battery 4 as the potential difference between cathode open circuit potential $U_1$ and corrected anode open circuit potential $U_2$. Thus, an "estimated OCV curve" is specified. The estimated OCV curve is equivalent to the "second OCV curve" according to the present disclosure.

Figure 22:
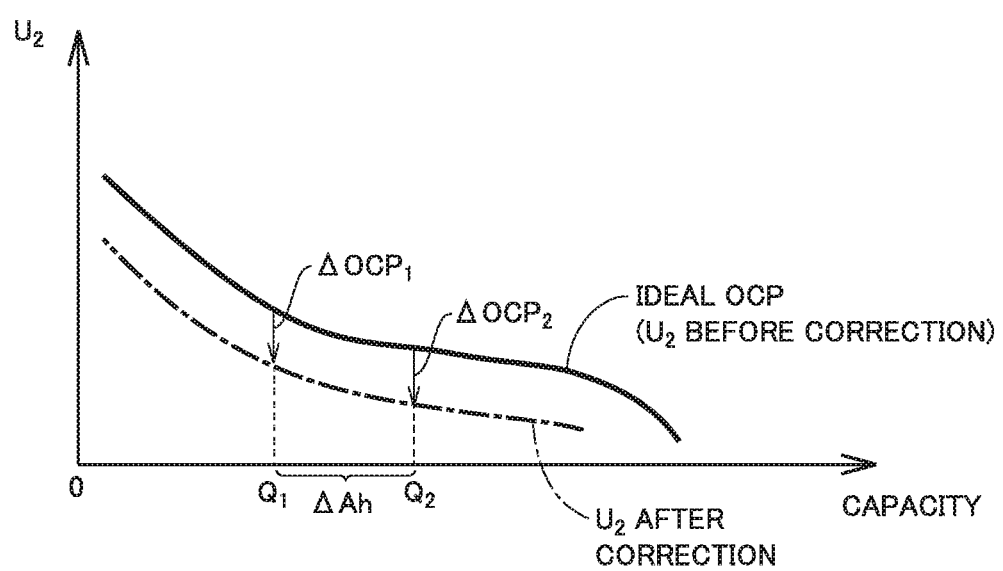
FIG. 22 is a diagram for explaining a technique for correcting the anode open circuit potential using an open circuit potential change amount ΔOCP.

FIG. 22 is a diagram for explaining a technique for correcting anode open circuit potential $U_2$ using open circuit potential change amount $\Delta OCP$. In FIG. 22, the horizontal axis represents the capacity of battery 4 (unit: Ah), and the vertical axis represents anode open circuit potential $U_2$. With reference to FIG. 22, in this example, battery 4 is charged from time $t_1$ to time $t_2$, and the capacity of battery 4 increases from $Q_1$ to $Q_2$.

Anode open circuit potential $U_2$ calculated at S503 does not take into consideration the influence of surface stress $\sigma_{surf}$ generated in the anode active material (anode particle 2). This anode open circuit potential $U_2$ can also be defined as a potential in an ideal state with no surface stress $\sigma_{surf}$. Accordingly, this anode open circuit potential $U_2$ is hereinafter also referred to as an "ideal OCP" (see the solid line). However, actual anode open circuit potential $U_2$ deviates from the ideal OCP due to the influence of surface stress $\sigma_{surf}$. The deviation amount is open circuit potential change amount $\Delta OCP$. Accordingly, in the present embodiment, the ideal OCP is corrected using the $\Delta OCP$ ($\Delta OCP_1$ or $\Delta OCP_2$) acquired at S403 or S405, thus obtaining anode open circuit potential $U_2$ by taking into consideration the influence of surface stress $\sigma_{surf}$. More specifically, open circuit potential change amount $\Delta OCP$ (including the sign) is added to the ideal OCP, and the value obtained by the addition is defined as corrected anode open circuit potential $U_2$ (see the dot-and-dash line).

As described with reference to FIG. 12, at the time of charging of battery 4, surface stress $\sigma_{surf}<0$ is satisfied, and thus open circuit potential change amount $\Delta OCP<0$ is satisfied (see the above-described equation (21)). Therefore, corrected anode open circuit potential $U_2$ of battery 4 is lower than the ideal OCP by (the absolute value of) open circuit potential change amount $\Delta OCP$. On the other hand, at the time of discharging from battery 4, surface stress $\sigma_{surf}>0$ is satisfied, and thus open circuit potential change amount $\Delta OCP>0$ is satisfied. Therefore, corrected anode open circuit potential $U_2$ is higher than the ideal OCP by (the absolute value of) open circuit potential change amount $\Delta OCP$.

The shape of ideal OCP curve is obtained in advance by experiment or simulation. Accordingly, anode open circuit potential $U_2$ can be corrected by deforming the ideal OCP in accordance with the $\Delta OCP$ representing the degree of deviation from the ideal OCP (for example, by making minor amendment to a coefficient included in the function representing the shape of ideal OCP, while translating the function in accordance with the $\Delta OCP$). The example shown herein uses $\Delta OCP$s at two points ($OCP_1$, $OCP_2$) for optimization. However, in some embodiments, in order to identify the deterioration parameters more accurately, a larger number of $\Delta OCP$s are used to correct anode open circuit potential $U_2$.

At S505, ECU 100 calculates voltage error $\Delta V$ and capacity error $\Delta Q$ by comparing the measured OCV curve and the estimated OCV curve. Voltage error $\Delta V$ may be a voltage error between the two OCV curves for a particular capacity, or may be an average value of voltage errors between these two OCV curves.

On the other hand, capacity error $\Delta Q$ is calculated as follows: using the estimated OCV curve specified at S504, capacity $Q_{esti}$ is calculated from the capacity change amount at the time when the OCV of battery 4 changes from $OCV_1$ to $OCV_2$; capacity $Q_{meas}$ is calculated from current integrated value $\Delta Ah$ calculated at S407; and capacity error $\Delta Q$ ($=|Q_{esti}-Q_{meas}|$) is calculated by calculating the difference between capacity $Q_{esti}$ and capacity $Q_{meas}$.

At S506, ECU 100 calculates an evaluation function f ($\Delta V$, $\Delta Q$) for voltage error $\Delta V$ and capacity error $\Delta Q$. As evaluation function f ($\Delta V$, $\Delta Q$), a weighted sum of voltage error $\Delta V$ and capacity error $\Delta Q$ may be used, for example. By way of example, evaluation function f ($\Delta V$, $\Delta Q$) is expressed by f ($\Delta V$, $\Delta Q$)=$p \times \Delta V + q \times \Delta Q$, using weighting coefficients p, q.

At S507, ECU 100 executes a minimum value determination process to determine whether or not evaluation function f ($\Delta V$, $\Delta Q$) calculated from the deterioration parameters presently set is smaller than evaluation function f ($\Delta V$, $\Delta Q$) calculated from the deterioration parameters set at the previous calculation. Specifically, when the present evaluation function f ($\Delta V$, $\Delta Q$) is smaller than the previous evaluation function f ($\Delta V$, $\Delta Q$), ECU 100 stores the present evaluation function f ($\Delta V$, $\Delta Q$) in memory 100B. When the present evaluation function f ($\Delta V$, $\Delta Q$) is larger than the previous evaluation function f ($\Delta V$, $\Delta Q$), the previous evaluation function f ($\Delta V$, $\Delta Q$) is maintained.

At S508, ECU 100 determines whether or not the three deterioration parameters have been changed in the full search range. When the deterioration parameters have not been changed in the full search range (NO at S508), the deterioration parameters are changed (S509), and the process is returned to S503. By doing so, ECU 100 repeatedly executes the processes of S503 to S507 until the three deterioration parameters are changed in the full search range. As a result, deterioration parameters are searched for so that the measured OCV curve substantially matches the estimated OCV curve. When ECU 100 completes the full search (YES at S508), ECU 100 advances the process to S510.

At S510, ECU 100 stores, in memory 100B, the OCV curve that provides the minimum evaluation function f (ΔV, ΔQ), and the three deterioration parameters that define the OCV curve. Then, ECU 100 estimates the deterioration state of battery 4 based on the deterioration parameters. Specifically, ECU 100 may estimate the full charge capacity of battery 4, or may estimate the SOC-OCV curve of battery 4 after deterioration. ECU 100 may also estimate whether the deterioration of battery 4 is due to lithium deposit or due to wear (deterioration over time) (for details, see Japanese Patent Laying-Open No. 2011-220917).

As described above, in embodiment 1, surface stress $\sigma_{surf}$ generated in anode particle 2 is calculated, and open circuit potential change amount ΔOCP, which is an amount of deviation of anode open circuit potential $U_2$ due to surface stress $\sigma_{surf}$, is calculated (see the above-described equation (21)). Using open circuit potential change amount ΔOCP, anode open circuit potential $U_2$ calculated from the deterioration parameters is corrected. Further, deterioration parameters are searched for so that the actually measured OCV curve (measured OCV curve) matches most closely with the OCV curve (estimated OCV curve) obtained from corrected anode open circuit potential $U_2$. The deterioration parameters obtained from the search take into consideration the influence of surface stress $\sigma_{surf}$, and thus, based on such deterioration parameters, the deterioration state of battery 4 can be accurately estimated.

Embodiment 2

Embodiment 1 describes an example in which the anode active material is a silicon material. Embodiment 2 describes an example employing an anode including a plurality of anode active materials (a so-called composite anode). Specifically, in embodiment 2, the anode of a lithium-ion secondary battery uses a carbon material, such as nanocarbon or carbon nanotube, and a silicon material. The configuration of the secondary battery system according to embodiment 2 is the same as that shown in FIG. 1, and thus the explanation is not repeated.

FIG. 23 is a diagram schematically showing the influence of hysteresis on the decrease in single-electrode potential and on the composition correspondence deviation in a composite anode. With reference to FIG. 23, in a composite anode, particularly in a low SOC region, anode open circuit potential $U_2$ is influenced by the decrease in single-electrode capacity and the composition correspondence deviation, and is also influenced by the hysteresis in charging and discharging.

FIG. 24 is a diagram schematically showing the relationship between the capacity and the potential of each constituent (carbon material and silicon material) of a composite anode. The total capacity of the composite anode is the sum of the capacity of silicon material and the capacity of carbon material. By way of example, FIG. 24 shows a case in which the capacity of silicon material is smaller than the capacity of carbon material. FIG. 24 does not show the behavior of the hysteresis in the silicon material for the sake of brevity.

A region where hysteresis arises associated with charging and discharging of battery 4, and the magnitude of hysteresis (the difference between the anode open circuit potential at the time of charging and the anode open circuit potential at the time of discharging) vary depending on the ratio between the capacity of silicon material and the capacity of carbon material (graphite in this example). In some embodiments, in order to accurately estimate the deterioration state of the composite anode, the deterioration of the capacity of silicon material and the deterioration of the capacity of carbon material are estimated separately.

Accordingly, embodiment 2 employs a "three-particle model" in which the carbon material and the silicon material are distinguished, and employs four deterioration parameters, instead of the three deterioration parameters described in embodiment 1. Specifically, the four deterioration parameters are a cathode capacity maintenance ratio $k_1$, a silicon capacity maintenance ratio $k_{2si}$, a graphite capacity maintenance ratio $k_{2gra}$, and a deviation amount $\Delta Q_s$. Silicon capacity maintenance ratio $k_{2si}$ refers to the ratio of the capacity of silicon material in the deteriorated state of battery 4 to the capacity of silicon material in the initial state of battery 4. Graphite capacity maintenance ratio $k_{2gra}$ refers to the ratio of the capacity of carbon material in the deteriorated state of battery 4 to the capacity of carbon material in the initial state of battery 4 (the details of which will be described later). Cathode capacity maintenance ratio $k_1$, silicon capacity maintenance ratio $k_{2si}$, graphite capacity maintenance ratio $k_{2gra}$, and deviation amount $\Delta Q_s$ are equivalent to the "first to fourth deterioration parameters" according to the present disclosure.

<Three-Particle Model>

Figure 25:
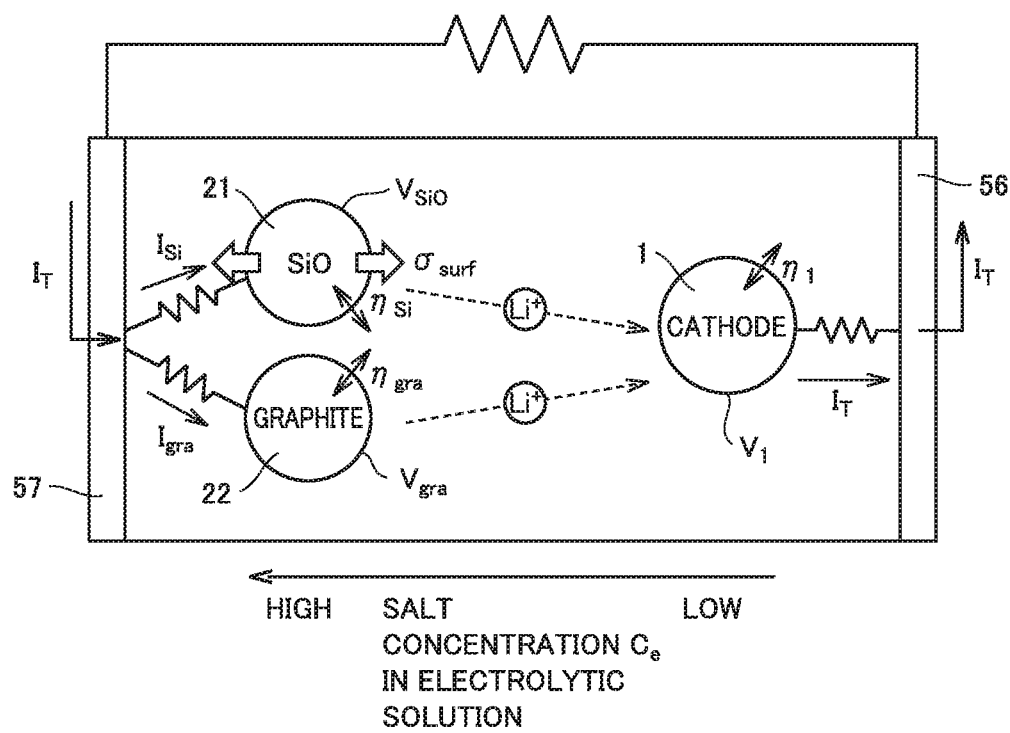
FIG. 25 is a diagram for explaining a three-particle model.

FIG. 25 is a diagram for explaining a three-particle model. With reference to FIG. 25, in the three-particle model in embodiment 2, the cathode of battery 4 is represented by an active material (one particle). This particle is referred to as "cathode particle 1", as in embodiment 1.

On the other hand, the anode is represented by two types of active materials (two particles). One of the particles (first active material model) is made of a silicon material in the anode active material, and the other of the particles (second active material model) is made of a, carbon material (graphite in this example) in the anode active material. For simplicity's sake, the former particle is referred to as a "silicon particle 21", and the latter particle is referred to as a "graphite particle 22". The potential of silicon particle 21 is referred to as a "silicon potential $V_{Si}$", and the potential of graphite particle 22 is referred to as a "graphite potential $V_{gra}$".

At the time of discharging from battery 4, lithium ion (denoted by Li$^+$) is emitted at the interface between silicon particle 21 and the electrolytic solution, and at the interface between graphite particle 22 and the electrolytic solution. The current flowing through silicon particle 21 caused by the emission of lithium ion is referred to as a "silicon current $I_{Si}$", and the current flowing through graphite particle 22 caused by the emission of lithium ion is referred to as a "graphite current $I_{gra}$". The total current flowing through battery 4 is denoted by $I_T$. As understood from FIG. 25, in the three-particle model in the present embodiment, total current $I_T$ is distributed between silicon current $I_{Si}$ and graphite current $I_{gra}$.

At the time of charging of battery 4, the direction of current is opposite to the direction shown in FIG. 25 (not shown), but the distribution of total current $I_T$ between silicon current $I_{Si}$ and graphite current $I_{gr}$ is the same as that shown in FIG. 25.

<Functional Block>

Figure 26:
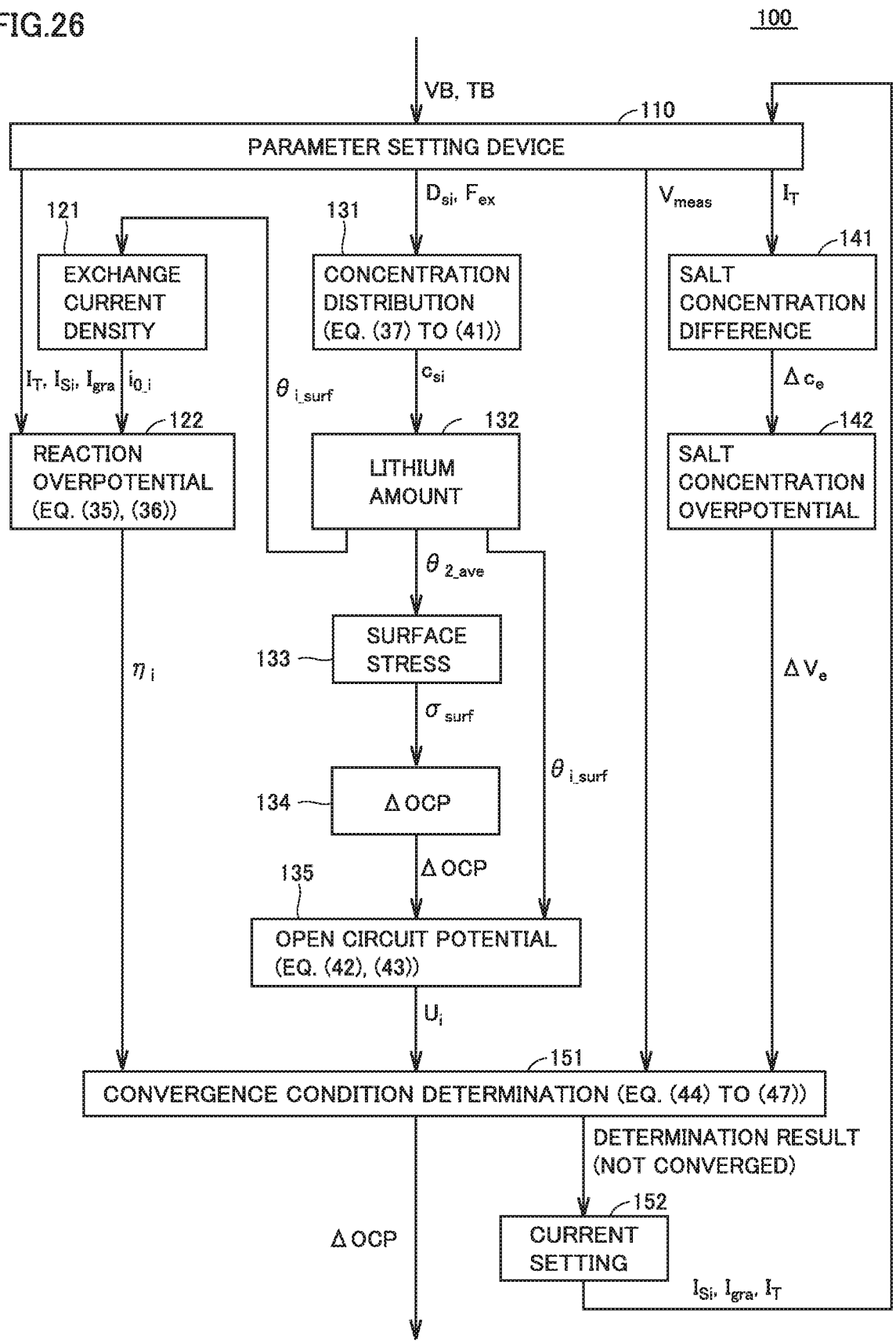
FIG. 26 is, a functional block diagram of an ECU related to a ΔOCP calculation process in embodiment 2.

FIG. 26 is a functional block diagram of ECU 100 related to a ΔOCP calculation process in embodiment 2. With reference to FIG. 26, the functional blocks of ECU 100 in embodiment 2 are similar to the corresponding functional blocks in embodiment 1. The following describes the differences from embodiment 1.

Reaction overpotential calculating device 122 calculates a reaction overpotential (silicon overpotential) $\eta_{Si}$ of silicon particle 21 and a reaction overpotential (graphite overpotential) $\eta_{gra}$ of graphite particle 22, in accordance with the following equations (35) and (36), respectively, derived from the Butler-Volmer equation.

$$\eta_{Si} = \frac{2RT}{\beta_{Si}F}\sinh^{-1}\left(\frac{\beta_{Si}I_{Si}}{2L_2 a_{s\_Si} i_{0\_Si}(\theta_{Si}, T)}\right) \quad (35)$$

$$\eta_{gra} = \frac{2RT}{\beta_{gra}F}\sinh^{-1}\left(\frac{\beta_{gra}I_{gra}}{2L_2 a_{s\_gra} i_{0\_gra}(\theta_{gra}, T)}\right) \quad (36)$$

As to graphite particle 22, similar to cathode particle 1, concentration distribution calculating device 131 calculates the lithium concentration distribution inside graphite particle 22 by solving, equation (37) in a time-evolution manner under the boundary condition expressed by the following equation (38).

$$\frac{\partial c_{s\_gra}(r_{gra})}{\partial t} = \frac{1}{r_{gra}^2}\frac{\partial}{\partial r_{gra}}\left(r_{gra}^2 D_{s\_gra}(\theta_{gra})\frac{\partial c_{s\_gra}(r_{gra})}{\partial r_{gra}}\right) \quad (37)$$

$$-D_{s\_gra}\left.\frac{\partial c_{s\_gra}(r_{gra})}{\partial r_{gra}}\right|_{r_{gra}=R_{gra}} = \frac{-I_{gra}}{L_2 a_{s\_gra} F} \quad (38)$$

Concentration distribution calculating device 131 also calculates the lithium concentration distribution inside silicon particle 21 by solving the diffusion equation expressed by equation (40) using effective diffusion coefficient $D_{s\_Si}^{eff}$ defined by the following equation (39), under the boundary condition (see equation (41)).

$$D_{s\_Si}^{eff} = D_{s\_Si}\left(1 + \frac{2\Omega^2 EC_{s\_Si}(r)}{9RT(1-v)}\right) \quad (39)$$

$$\frac{\partial c_{s\_Si}(r)}{\partial t} = \nabla \cdot D_{s\_Si}^{eff}\nabla c_{s\_Si}(r) \quad (40)$$

$$-D_{s\_Si}\left.\left(\nabla c_{s\_Si}(r) - \frac{\Omega c_{s\_Si}(r)}{RT}\nabla \sigma_h(r)\right)\right|_{r=surf} = \frac{-I_{Si}}{L_2 a_{s\_Si} F} \quad (41)$$

Open circuit potential calculating device 135 calculates open circuit potential $U_{gra}$ from surface lithium amount $\theta_{gra\_surf}$ of graphite particle 22, by referring to a prescribed map (not shown) (see the following equation (42)). When calculating open circuit potential $U_{Si}$ of silicon particle 21, open circuit potential calculating device 135 takes into consideration the influence of surface stress $\sigma_{surf}$. Specifically, open circuit potential calculating device 135 calculates open circuit potential $U_{Si}$ by adding open circuit potential change amount ΔOCP to open circuit potential $U_{Si\_sta}$ of silicon particle 21 in the state in which surface stress $\sigma_{surf}$ is not generated (see the following equation (43)). Open circuit potential $U_{Si\_sta}$ is equivalent to the "reference potential" according to the present disclosure.

$$U_{gra} = U_{gra}(\theta_{gra\_surf}) \quad (42)$$

$$U_{Si} = U_{Si\_sta}(\theta_{Si\_surf}) + \Delta OCP \quad (43)$$

Convergence condition determining device 151 receives reaction overpotentials $\eta_1$, $\eta_{Si}$, $\eta_{gra}$ from reaction overpotential calculating device 122, receives open circuit potentials $U_1$, $U_{Si}$, $U_{gra}$ from open circuit potential calculating device 135, receives measured voltage $V_{meas}$ (the measured value of the voltage of battery 4) from parameter setting device 110, and receives salt concentration overpotential $\Delta V_e$ from salt concentration overpotential calculating device 142. Convergence condition determining device 151 calculates the voltage of battery 4 (calculated voltage $V_{calc}$) from cathode potential $V_1$, anode potential $V_2$, the amount of voltage drop ($=I_T R_d$) due to direct current resistance $R_d$, and salt concentration overpotential $\Delta V_e$, in accordance with the following relational expression (44) satisfied between the voltage and the current.

$$V_1 - V_2 - I_T R_d - \Delta V_e = V_{calc} \quad (44)$$

In equation (44), anode potential $V_2$ is calculated as being equal to silicon potential $V_{Si}$ expressed by equation (45) and graphite potential $V_{gra}$ expressed by equation (46) ($V_2 = V_{Si} = V_{gra}$).

$$U_{Si} + \eta_{Si} = V_{Si} \quad (45)$$

$$U_{gra} + \eta_{gra} = V_{gra} \quad (46)$$

Convergence condition determining device 151 determines whether or not the convergence, condition for the iteration method is satisfied, by comparing calculated voltage $V_{calc}$ and measured voltage $V_{meas}$, and by comparing silicon potential $V_{Si}$ and graphite potential $V_{gra}$. Specifically, convergence condition determining device 151 determines whether or not calculated voltage $V_{calc}$ and measured voltage $V_{meas}$ are substantially equal to each other (i.e., whether or not the error between these voltages is less than a first prescribed value PS1), and whether or not silicon potential $V_{Si}$ and graphite potential $V_{gra}$ are substantially equal to each other (i.e., whether or not the error between these voltages is less than a second prescribed value PS2). When the error ($=|V_{calc}-V_{meas}|$) between calculated voltage $V_{calc}$ and measured voltage $V_{meas}$ is equal or more than first prescribed value PS1, or when the error ($=|V_{Si}-V_{gra}|$) between silicon potential $V_{Si}$ and graphite potential $V_{gra}$ is equal or more than second prescribed value PS2, convergence condition determining device 151 outputs, to current setting device 152, the determination result indicating that the convergence condition for the iteration method is not satisfied.

When current setting device 152 receives the determination result indicating that the convergence condition is not satisfied from convergence condition determining device 151, current setting device 152 updates the currents ($I_T$, $I_{Si}$, $I_{gra}$) flowing through the three particles to values to be used at the time of the next operation. More specifically, current setting device 152 uses the algorithm of the Newton's method (which may be a bisection method, a secant method, or the like) to set silicon current $I_{Si}$ and total current $I_T$ to be used at the time of the next operation, based on silicon current $I_{Si}$ and total current $I_T$ used at the time of the previous operation and the present operation. The remaining graphite current $I_{gra}$ is calculated from silicon current $I_{Si}$ and total current $I_T$, using the relationship between the currents expressed by the following equation (47). The calculated currents are outputted to parameter setting device 110, so that the current values after the update are to be used at the time of the next operation.

$$I_{Si}+I_{gra}=I_T \qquad (47)$$

Convergence condition determining device 151 and current setting device 152 iteratively perform the operation process until the error between calculated voltage $V_{calc}$ and measured voltage $V_{meas}$ becomes less than first prescribed value PS1, and until the error between silicon potential $V_{Si}$ and graphite potential $V_{gra}$ becomes less than second prescribed value PS2. When each of the above-described two errors becomes less than a corresponding prescribed value (PS1, PS2), convergence condition determining device 151 determines that the iterative operation process has converged. The processes to be executed by the remaining functional blocks are the same as the corresponding processes in embodiment 1, and thus the detailed explanation is not repeated.

<Process Flow>

Among the process flows to be executed by ECU 100 in embodiment 2, process flows different from those of embodiment 1 are described. Specifically, a convergence operation process and a deterioration estimation process are described. The process flows of the ΔOCP calculation process (see FIG. 17), the surface stress calculation process (see FIG. 19), and the OCV measurement process (see FIG. 20) are the same as the corresponding process flows in embodiment 1.

Figure 27:
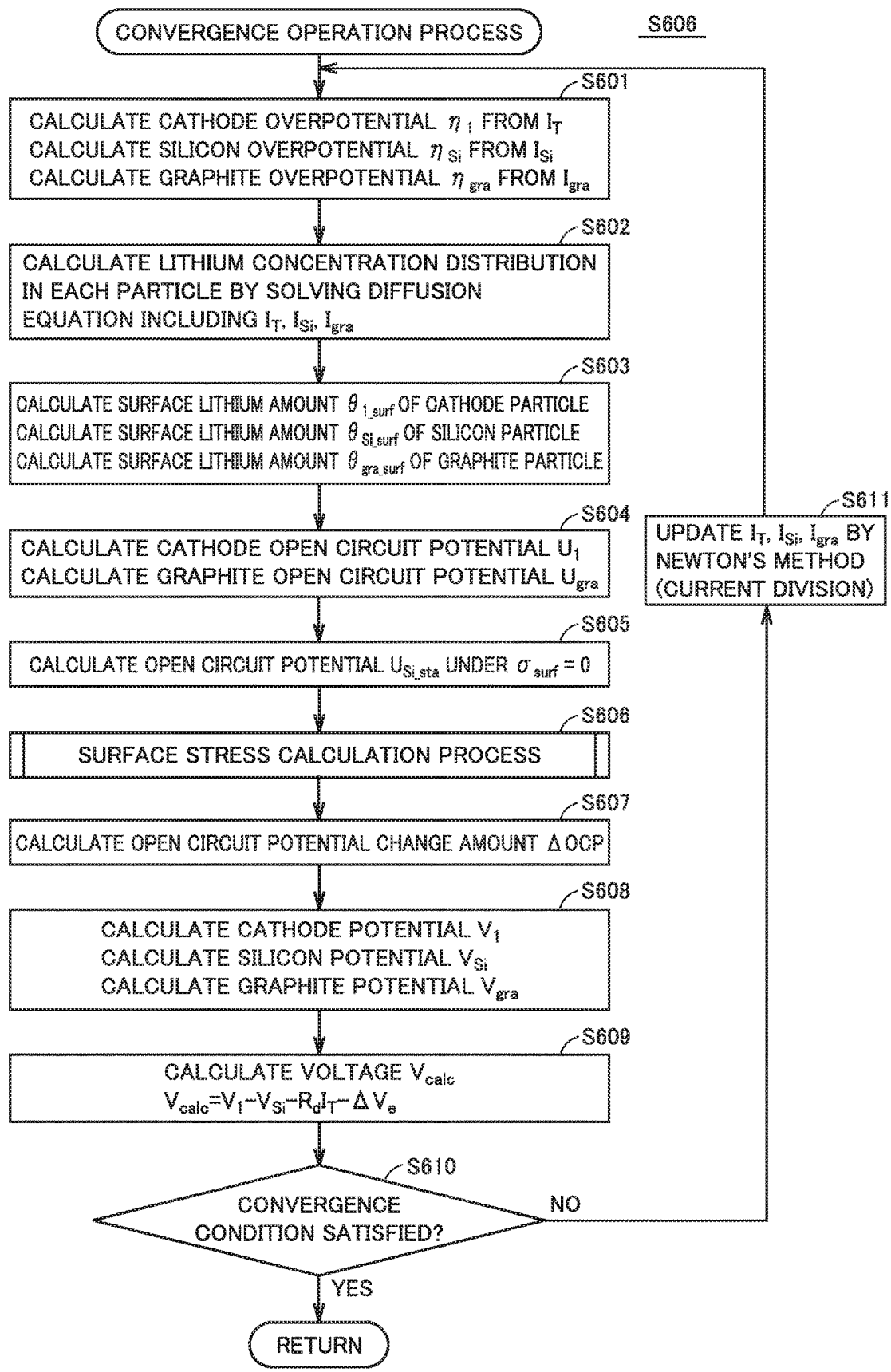
FIG. 27 is a flowchart showing a convergence operation process in embodiment 2.

FIG. 27 is a flowchart showing a convergence operation process in embodiment 2. With reference to FIG. 27, at S601, ECU 100 calculates reaction overpotential $\eta_1$ of cathode particle 1 from exchange current density $i_{0\_1}$ of cathode particle 1 and absolute temperature T, as in embodiment 1. ECU 100 calculates reaction overpotential $\eta_{Si}$ of silicon particle 21 from exchange current density $i_{0\_Si}$ of silicon particle 21 and absolute temperature T in accordance with the above-described equation (35), and calculates reaction overpotential $\eta_{gra}$ of graphite particle 22 from exchange current density $i_{0\_gra}$ of graphite particle 22 and absolute temperature T in accordance with the above-described equation (36).

At S602, as to cathode particle 1, ECU 100 substitutes lithium diffusion coefficient $D_{s1}$ of cathode particle 1 into the diffusion equation (the above-described equation (13)), and solves the equation (13) under the boundary condition (see the above-described equation (14)), thereby calculating the lithium concentration distribution inside cathode particle 1, as in embodiment 1. As to graphite particle 22, ECU 100 solves diffusion equation (37) under the boundary condition (see the above-described equation (38)), thereby calculating the lithium concentration distribution inside graphite particle 22. Further, ECU 100 solves diffusion equation (40) with substituted effective diffusion coefficient $D_{s\_Si}^{eff}$ (see equation (39)) under the boundary condition (see equation (41)), thereby calculating the lithium concentration distribution inside silicon particle 21.

At S603, ECU 100 calculates surface lithium amount $\theta_{1\_surf}$ of cathode particle 1 based on the lithium concentration distribution inside cathode particle 1 calculated at S602 (see the above-described equation (2)). Similarly, ECU 100 calculates surface lithium amount $\theta_{Si\_surf}$ of silicon particle 21, and calculates surface lithium amount $\theta_{gra\_surf}$ of graphite particle 22.

At S604, ECU 100 refers to a map (not shown) that defines the correspondence relationship between open circuit potential $U_1$ and surface lithium amount $\theta_{1\_surf}$ of cathode particle 1, thus calculating open circuit potential $U_1$ from surface lithium amount $\theta_{1\_surf}$ calculated at S603 (see equation (22)). Similarly, ECU 100 refers to a map (not shown) that defines the correspondence relationship between open circuit potential $U_{gra}$ and surface lithium amount $\theta_{gra\_surf}$ of graphite particle 22, thus calculating open circuit potential $U_{gra}$ from surface lithium amount $\theta_{gra\_surf}$ (see equation (42)).

At S605, ECU 100 refers to a map (not shown) that defines the correspondence relationship between open circuit potential $U_{Si\_surf}$ and surface lithium amount $\theta_{Si\_surf}$ of silicon particle 21 in the ideal state (where surface stress $\sigma_{surf}=0$ is satisfied), thus calculating open circuit potential $U_{Si\_sta}$ from surface lithium amount $\theta_{Si\_surf}$. The subsequent surface stress calculation process (S606) is the same as that in embodiment 1 (see FIG. 19).

At S607, in order to take into consideration the influence of surface stress $\sigma_{surf}$ on open circuit potential $U_{Si}$ of silicon particle 21, ECU 100 calculates open circuit potential change amount ΔOCP from surface stress $\sigma_{surf}$ in accordance with the above-described equation (43).

At S608, ECU 100 calculates, as cathode potential $V_1$, the sum of reaction overpotential $\eta_1$ and cathode open circuit potential $U_1$ of cathode particle 1 in accordance with the above-described equation (29). Also, ECU 100 calculates silicon open circuit potential $U_{Si}$ by adding open circuit potential change amount ΔOCP to ideal open circuit potential $U_{Si\_sta}$ of silicon particle 21 (see the above-described equation (43)), and further calculates, as silicon potential $V_{Si}$, the sum of reaction overpotential $\eta_{Si}$ and silicon open circuit potential $U_{Si}$ of silicon particle 21 (see the above-described equation (45)). Further, ECU 100 calculates, as graphite potential $V_{gra}$, the sum of reaction overpotential $\eta_{gra}$ and graphite open circuit potential $U_{gra}$ of graphite particle 22 (see the above-described equation (46)).

At S609, ECU 100 calculates calculated voltage $V_{calc}$ from cathode potential $V_1$, anode potential $V_2$ (silicon potential $V_{Si}$ or graphite potential $V_{gra}$), the amount of voltage drop ($=I_T R_d$) due to direct current resistance $R_d$, and salt concentration overpotential $\Delta V_e$, in accordance with the above-described equation (44).

At S610, ECU 100 determines whether or not the condition under which the iterative operation converges (convergence condition) in the convergence operation process is satisfied. Specifically, the convergence condition includes first and second conditions. The first condition is whether or not the absolute value ($=|V_{calc}-V_{meas}|$) of the difference between calculated voltage $V_{calc}$ calculated at S609 and measured voltage $V_{meas}$ acquired from voltage sensor 71 at S101 (see FIG. 17) is less than first prescribed value PS1 ($|V_{calc}-V_{meas}|<$PS1). The second condition is whether or not the absolute value ($=|V_{Si}-V_{gra}|$) of the difference between silicon potential $V_{Si}$ and graphite potential $V_{gra}$ calculated at S608 is less than second prescribed value PS2 ($|V_{Si}-V_{gra}|<$PS2).

When both the first and second conditions are satisfied, ECU 100 determines that the convergence condition is satisfied; whereas when at least one of the first and second conditions is not satisfied, ECU 100 determines that the convergence condition is not satisfied. When the convergence condition is not satisfied (NO at S610), ECU 100 updates currents $I_T$, $I_{Si}$, $I_{gra}$ in accordance with the algorithm of the Newton's method (S611), and returns the process to S601. On the other hand, when the convergence condition is satisfied (YES at S610), ECU 100 returns the process to the main routine (not shown).

Figure 28:
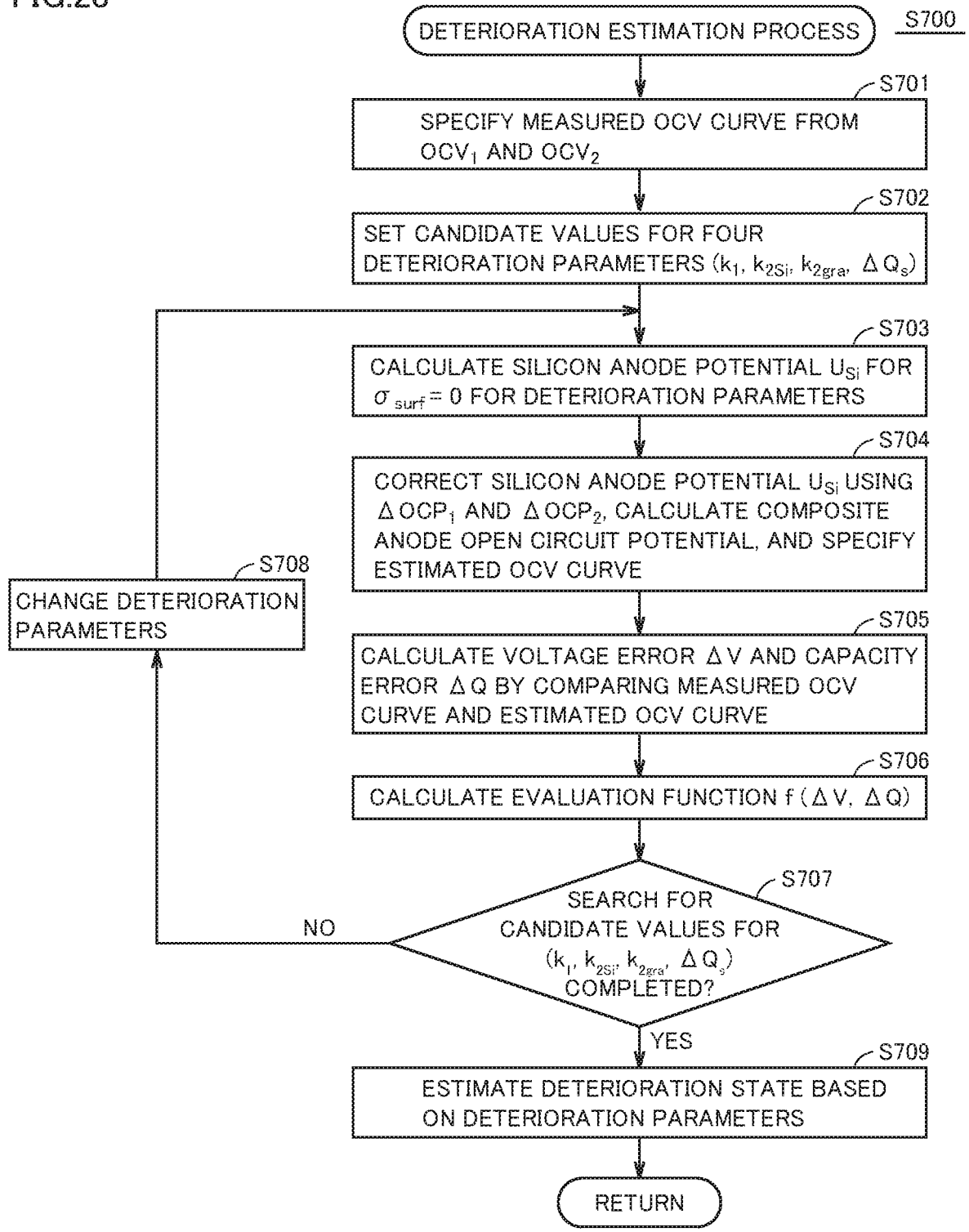
FIG. 28 is a flowchart showing a deterioration estimation process in embodiment 2.

FIG. 28 is a flowchart showing a deterioration estimation process in embodiment 2. With reference to FIG. 28, at S701, ECU 100 specifies a measured OCV curve from at least two actually measured OCVs (in this example, $OCV_1$ and $OCV_2$).

At S702, ECU 100 sets candidate values for the four deterioration parameters (cathode capacity maintenance ratio $k_1$, silicon capacity maintenance ratio $k_{2si}$, graphite capacity maintenance ratio $k_{2gra}$, and deviation amount $\Delta Q_s$).

As is described below, when the four deterioration parameters are specified, the OCV of battery 4 can be calculated as the potential difference between cathode open circuit potential $U_1$ and anode open circuit potential $U_2$.

Since silicon particle 21 and graphite particle 22 are equipotential ($V_{Si}=V_{gra}$), equation (48) is satisfied.

$$U_{Si}(\theta_{Si})+\eta_{Si}=U_{gra}(\theta_{gra})+\eta_{gra} \quad (48)$$

For simplicity's sake, embodiment 2 is on the assumption that silicon overpotential $\eta_{Si}$ and graphite overpotential $\eta_{gra}$ are equal to each other (see the following equation (49)).

$$\eta_{Si}=\eta_{gra} \quad (49)$$

In that case, the reaction overpotentials ($\eta_{Si}$, $\eta_{gra}$) cancel each other, and thus the above-described equation (48) is simplified into the following equation (50).

$$U_{Si}(\theta_{Si})=U_{gra}(\theta_{gra}) \quad (50)$$

Surface lithium amount $\theta_{2\_surf}$ of anode particle 2 (combined silicon particle 21 and graphite particle 22) is expressed by the following equation (51) using surface lithium amount $\theta_{Si\_surf}$ and limit lithium concentration $c_{Si,\,max}$ of silicon particle 21, and using surface lithium amount $\theta_{gra\_surf}$ and limit lithium concentration $c_{gra,\,max}$ of graphite particle 22.

$$\theta_{2\_surf} = \frac{\theta_{Si\_surf} c_{Si,max} + \theta_{gra\_surf} c_{gra,max}}{c_{Si,max} + c_{gra,max}} \quad (51)$$

Using the relationships expressed by the above-described equations (50) and (51), and based on the curve representative of open circuit potential $U_{Si}$ and the curve representative of open circuit potential $U_{gra}$ described above, a curve that shows anode open circuit potential $U_2$ can be defined on a graph whose horizontal axis represents surface lithium amount $\theta_{2\_surf}$ of anode particle 2 (S703).

At S704, ECU 100 corrects silicon anode potential $U_{Si}$ using open circuit potential change amount $\Delta OCP$ ($\Delta OCP_1$, $\Delta OCP_2$). Then, ECU 100 calculates the composite anode open circuit potential and specifies an estimated OCV curve.

At S705, ECU 100 calculates voltage error $\Delta V$ and capacity error $\Delta Q$ by comparing the measured OCV curve and the estimated OCV curve, as in embodiment 1. A specific example of a technique for calculating voltage error $\Delta V$ and capacity error $\Delta Q$ is the same as that in embodiment 1.

At S706, ECU 100 calculates an evaluation function f ($\Delta V$, $\Delta Q$) for voltage error $\Delta V$ and capacity error $\Delta Q$.

At S707, ECU 100 determines whether or not the four deterioration parameters have been changed in the full search range. When the deterioration parameters have not been changed in the full search range (NO at S707), ECU 100 changes the deterioration parameters (S708), returns the process to S703, and repeatedly executes the processes of S703 to S706 until the four deterioration parameters are changed in the full search range. When ECU 100 completes the full search (YES at S707), ECU 100 advances the process to S709. At S709, ECU 100 stores, in memory 100B, the OCV curve that provides the minimum evaluation function f ($\Delta V$, $\Delta Q$), and the four deterioration parameters that define the OCV curve. Then, ECU 100 estimates the deterioration state of battery 4 based on the deterioration parameters.

As described above, in embodiment 2, dividing anode particle 2 into silicon particle 21 and graphite particle 22 allows accurate calculation of surface stress $\sigma_{surf}$ caused mainly by expansion and contraction of silicon particle 21, and thus allows accurate calculation of open circuit potential change amount $\Delta OCP$. Further, as in embodiment 1, anode open circuit potential $U_2$ calculated from the four deterioration parameters is corrected using open circuit potential change amount $\Delta OCP$ (estimated OCV curve). Further, deterioration parameters are searched for so that the estimated OCV curve matches most closely with the actually measured OCV curve. As in embodiment 1, the deterioration parameters obtained from the search take into consideration the influence of surface stress $\sigma_{surf}$, and thus, based on such deterioration parameters, the deterioration state of battery 4 can be accurately estimated. Still further, in embodiment 2, anode capacity maintenance ratio $k_2$ is divided into silicon capacity maintenance ratio $k_{2si}$ and graphite capacity maintenance ratio $k_{2gra}$. This allows separate calculation of the contribution of decrease in capacity of silicon material and the contribution of decrease in capacity of carbon material, relative to the decrease in anode capacity. Thus, the accuracy in estimation of the deterioration of battery 4 can be further enhanced.

Variation of Embodiment 2

Using four deterioration parameters may increase the operation load on ECU 100 in executing the search operation process, though enhancing the accuracy in estimation of the deterioration state of battery 4, as compared with three deterioration parameters. Accordingly, in order to reduce the operation load on ECU 100, any of the following three techniques may be used to simplify the search operation process.

Firstly, the deterioration parameters to be searched for can be reduced from four ($k_1$, $k_{2si}$, $k_{2gra}$, $\Delta Q_s$) to three ($k_1$, $k_{2si}$, $k_{2gra}$) by calculating deviation amount $\Delta Q_s$ using electrochemical reaction equations (Tafel equations), such as equations (14) and (15) in Japanese Patent Laying-Open No. 2017-190979.

Secondly, the correlation between silicon capacity maintenance ratio $k_{2si}$ and other parameters (e.g., surface stress $\sigma_{surf}$, temperature TB, and total current $I_T$) may be examined in advance to create a map or function. This enables silicon capacity maintenance ratio $k_{2si}$ to be calculated from another parameter, and can thus reduce the deterioration parameters to be searched for from four to three ($k_1$, $k_{2gra}$, $\Delta Q_s$).

Thirdly, the deterioration in capacity of carbon material is generally much less than the deterioration in capacity of silicon material. Accordingly, graphite capacity maintenance ratio $k_{2gra}=1$ may be fixed assuming that no deterioration will occur in capacity of carbon material. This can also reduce the deterioration parameters to be searched for from four to three ($k_1$, $k_{2si}$, $\Delta Q_s$).

Embodiments 1, 2 describe a case in which a silicon material is used for an anode active material, as one example of an active material having a large volume change amount associated with charging and discharging. However, an active material having a large volume change amount associated with charging and discharging is not limited to this. For example, among potential anode active materials for a lithium-ion secondary battery, a material having a "large volume change amount" may be a material whose volume change amount associated with charging and discharging is larger than that of graphite (about 10%). Examples of such materials include a Tin compound (e.g., Sn or SnO), a germanium (Ge) compound, and a lead (Pb) compound.

The lithium-ion secondary battery is not limited to a liquid battery, but may be a polymer or all-solid battery. The type of secondary battery is not limited to a lithium-ion secondary battery, but may be another type of secondary battery (e.g., nickel-hydride battery). Depending on the type of secondary battery, an active material having a large volume change amount associated with charging and discharging is not limited to an anode active material, but may be a cathode active material.

Although embodiments of the present disclosure have been described, it should be understood that the embodiments disclosed herein are by way of example in every respect, not by way of limitation. The scope of the present disclosure is defined by the terms of the claims, and is intended to include any modification within the meaning and scope equivalent to the terms of the claims.

What is claimed is:

1. A secondary battery system comprising:
a secondary battery including
a cathode including a cathode active material, and
an anode including an anode active material; and
a controller configured to:
obtain a first OCV curve by measurement, the first OCV curve representing an OCV change relative to a capacity change of the secondary battery, and
specify a second OCV curve using first to third deterioration parameters, the second OCV curve representing an OCV change relative to a capacity change of the secondary battery,
the first deterioration parameter being a cathode capacity maintenance ratio indicating a ratio of a cathode capacity in a deterioration state, relative to the cathode capacity in an initial state,
the second deterioration parameter being an anode capacity maintenance ratio indicating a ratio of an anode capacity in the deterioration state, relative to the anode capacity in the initial state,
the third deterioration parameter being a composition correspondence deviation amount indicating an amount by which a correspondence relationship between a composition of the cathode and a composition of the anode deviates from a correspondence relationship in the initial state, the composition of the cathode being expressed by a local charge carrier amount on a surface of the cathode active material, the composition of the anode being expressed by a local charge carrier amount on a surface of the anode active material,
the controller configured to:
calculate, based on a prescribed active material model, a surface stress of an object active material from a charge carrier amount inside the object active material, the object active material being one of the cathode active material and the anode active material,
calculate, based on the calculated surface stress, an open circuit potential change amount in an electrode relative to a reference potential, the electrode including the object active material, the reference potential being an open circuit potential of the object active material, with the surface stress being a reference stress,
correct the second OCV curve using the open circuit potential change amount,
calculate the first to third deterioration parameters so that the first OCV curve matches the corrected second OCV curve, and
estimate the deterioration state of the secondary battery based on at least one of the calculated first to third deterioration parameters.

2. The secondary battery system according to claim 1, wherein the reference potential is an open circuit potential of the object active material in a state in which the surface stress is not generated.

3. The secondary battery system according to claim 1, wherein the controller is configured to:
calculate an estimated value of the surface stress from a difference amount using a linear relationship satisfied between the difference amount and the surface stress, the difference amount being obtained by subtracting a reference charge carrier amount from the charge carrier amount inside the object active material,
when a magnitude of the estimated value is larger than a magnitude of a yield stress of the object active material, employ the yield stress as the surface stress, and
when the magnitude of the estimated value is smaller than the magnitude of the yield stress, employ the estimated value as the surface stress.

4. The secondary battery system according to claim 1, wherein
the secondary battery is a lithium-ion secondary battery, and
the object active material is an active material made of a silicon compound.

5. The secondary battery system according to according to claim 1, wherein
the object active material includes first and second active materials,
with charging and discharging of the secondary battery, the first active material is larger in volume change amount than the second active material, and
the controller is configured to:
calculate a surface stress of the first active material from a charge carrier amount inside the first active material, under a condition that the first active material and the second active material are equipotential, and
calculate, based on the calculated surface stress, the open circuit potential change amount in the electrode including the object active material.

6. A secondary battery system comprising:
a secondary battery including
a cathode including a cathode active material, and
an anode including an anode active material; and
a controller configured to:
obtain a first OCV curve by measurement, the first OCV curve representing an OCV change relative to a capacity change of the secondary battery, and
specifies specify a second OCV curve using first to fourth deterioration parameters, the second OCV curve representing an OCV change relative to a capacity change of the secondary battery,
the cathode active material including first and second active materials, with charging and discharging of the secondary battery, the first active material being larger in volume change amount than the second active material, the first deterioration parameter being a first cathode capacity maintenance ratio indicating a ratio of a cathode capacity corresponding to the first active material in a deterioration state, relative to the cathode capacity corresponding to the first active material in an initial state, the second deterioration parameter being a second cathode capacity maintenance ratio indicating a ratio of a cathode capacity corresponding to the second active material in the deterioration state, relative to the cathode capacity corresponding to the second active material in the initial state, the third deterioration parameter being an anode capacity maintenance ratio indicating a ratio of an anode capacity in the deterioration state, relative to the anode capacity in the initial state, the fourth deterioration parameter being a composition correspondence deviation amount indicating an amount by which a correspondence relationship between a composition of the cathode and a composition of the anode deviates from a correspondence relationship in the initial state, the composition of the cathode being expressed by a local charge carrier amount on a surface of the cathode active material, the composition of the anode being expressed by a local charge carrier amount on a surface of the anode active material, the controller configured to:
  calculate a surface stress of the first active material from a charge carrier amount inside the first active material, under a condition that the first active material and the second active material are equipotential,
  calculate, based on the calculated surface stress, an open circuit potential change amount in the cathode relative to a reference potential, the reference potential being an open circuit potential of the first active material, with the surface stress being a reference stress,
  correct the second OCV curve using the open circuit potential change amount,
  calculate the first to fourth deterioration parameters so that the first OCV curve matches the corrected second OCV curve, and
  estimate the deterioration state of the secondary battery based on at least one of the calculated first to fourth deterioration parameters.

7. A secondary battery system comprising:
a secondary battery including
  a cathode including a cathode active material, and
  an anode including an anode active material; and
a controller configured to:
  obtain a first OCV curve by measurement, the first OCV curve representing an OCV change relative to a capacity change of the secondary battery, and
  specify a second OCV curve using first to fourth deterioration parameters, the second OCV curve representing an OCV change relative to a capacity change of the secondary battery,
the anode active material including first and second active materials,
with charging and discharging of the secondary battery, the first active material being larger in volume change amount than the second active material, the first deterioration parameter being a cathode capacity maintenance ratio indicating a ratio of a cathode capacity in a deterioration state, relative to the cathode capacity in an initial state, the second deterioration parameter being a first anode capacity maintenance ratio indicating a ratio of an anode capacity corresponding to the first active material in the deterioration state, relative to the anode capacity corresponding to the first active material in the initial state, the third deterioration parameter being a second anode capacity maintenance ratio indicating a ratio of an anode capacity corresponding to the second active material in the deterioration state, relative to the anode capacity corresponding to the second active material in the initial state, the fourth deterioration parameter being a composition correspondence deviation amount indicating an amount by which a correspondence relationship between a composition of the cathode and a composition of the anode deviates from a correspondence relationship in the initial state, the composition of the cathode being expressed by a local charge carrier amount on a surface of the cathode active material, the composition of the anode being expressed by a local charge carrier amount on a surface of the anode active material, the controller configured to:
  calculate a surface stress of the first active material from a charge carrier amount inside the first active material, under a condition that the first active material and the second active material are equipotential,
  calculate, based on the calculated surface stress, an open circuit potential change amount in the anode relative to a reference potential, the reference potential being an open circuit potential of the first active material, with the surface stress being a reference stress,
  correct the second OCV curve using the open circuit potential change amount,
  calculate the first to fourth deterioration parameters so that the first OCV curve matches the corrected second OCV curve, and
  estimate the deterioration state of the secondary battery based on at least one of the calculated first to fourth deterioration parameters.

8. A method for estimating a deterioration state of a secondary battery including a cathode including a cathode active material, and an anode including an anode active material, the method comprising:
  obtaining a first OCV curve by measurement, the first OCV curve representing an OCV change relative to a capacity change of the secondary battery; and
  specifying a second OCV curve using first to third deterioration parameters, the second OCV curve representing an OCV change relative to a capacity change of the secondary battery, the first deterioration parameter being a cathode capacity maintenance ratio indicating a ratio of a cathode capacity in the deterioration state, relative to the cathode capacity in an initial state, the second deterioration parameter being an anode capacity maintenance ratio indicating a ratio of an anode capacity in the deterioration state, relative to the anode capacity in the initial state, the third deterioration parameter being a composition correspondence deviation amount indicating an amount by which a correspondence relationship between a composition of the cathode and a composition of the anode deviates from a correspondence relationship in the initial state, the composition of the cathode being expressed by a local charge carrier amount on a surface of the cathode active material, the composition of the anode being expressed by a local charge carrier amount on a surface of the anode active material, the method further comprising:

calculating a surface stress of an object active material from a charge carrier amount inside the object active material, the object active material being one of the cathode active material and the anode active material;

calculating, based on the calculated surface stress, an open circuit potential change amount in an electrode relative to a reference potential, the electrode including the object active material, the reference potential being an open circuit potential of the object active material, with the surface stress being a reference stress;

correcting the second OCV curve using the open circuit potential change amount;

calculating the first to third deterioration parameters so that the first OCV curve matches the corrected second OCV curve; and estimating the deterioration state of the secondary battery based on at least one of the calculated first to third deterioration parameters.

* * * * *